United States Patent
Hirato

(10) Patent No.: US 9,921,570 B2
(45) Date of Patent: Mar. 20, 2018

(54) SCHEDULE MAKING DEVICE, SUBSTRATE PROCESSING APPARATUS, SCHEDULE MAKING PROGRAM, SCHEDULE MAKING METHOD, AND SUBSTRATE PROCESSING METHOD

(71) Applicant: SCREEN Holdings Co., Ltd., Kyoto (JP)

(72) Inventor: Yuji Hirato, Kyoto (JP)

(73) Assignee: SCREEN Holdings Co., Ltd., Kyoto (JP)

( * ) Notice: Subject to any disclaimer, the term of this patent is extended or adjusted under 35 U.S.C. 154(b) by 251 days.

(21) Appl. No.: 14/429,872

(22) PCT Filed: Jul. 25, 2013

(86) PCT No.: PCT/JP2013/070129
§ 371 (c)(1),
(2) Date: Mar. 20, 2015

(87) PCT Pub. No.: WO2014/045709
PCT Pub. Date: Mar. 27, 2014

(65) Prior Publication Data
US 2015/0268660 A1    Sep. 24, 2015

(30) Foreign Application Priority Data

Sep. 21, 2012  (JP) .................................. 2012-208333
Mar. 14, 2013  (JP) .................................. 2013-051510

(51) Int. Cl.
*G06F 19/00* (2011.01)
*G05B 19/402* (2006.01)
(Continued)

(52) U.S. Cl.
CPC ..... *G05B 19/402* (2013.01); *G05B 19/41865* (2013.01); *H01L 21/67745* (2013.01);
(Continued)

(58) Field of Classification Search
CPC ............. H01L 21/67276; H01L 21/677; H01L 21/67712; H01L 21/67155;
(Continued)

(56) References Cited

U.S. PATENT DOCUMENTS 6,529,789 B1 * 3/2003 Campbell ........ G05B 19/41865
700/115
6,622,111 B1 * 9/2003 Conboy ............ H01L 21/67276
355/53
(Continued)

FOREIGN PATENT DOCUMENTS

CN    10 2169848    8/2011
JP    10-144764    5/1998
(Continued)

OTHER PUBLICATIONS

International Search Report dated Oct. 22, 2013 in corresponding PCT International Application No. PCT/JP2013/070129.
(Continued)

*Primary Examiner* — Darrin Dunn
(74) *Attorney, Agent, or Firm* — Ostrolenk Faber LLP

(57) ABSTRACT

To provide a technique capable of making a schedule with good time efficiency in schedule making for the transport of substrates. A schedule making device makes a judgment as to whether a batch carrying-out procedure can complete the transport earlier than a sequential carrying-out procedure or not, and selectively employs these procedures in accordance with a result of the judgment. The sequential carrying-out procedure is a procedure in which substrates are transported to a predetermined transport destination in chronological order of the times at which the transport process can start, and the batch carrying-out procedure is a procedure in which a substrate the transport process of which can start is not transported until a time at which the transport process of a succeeding substrate can start, and the substrates are trans-
(Continued)

ported together to a transport destination at the time when the transport process of the succeeding substrate can start.

20 Claims, 31 Drawing Sheets

(51) Int. Cl.
*H01L 21/677* (2006.01)
*G05B 19/418* (2006.01)

(52) U.S. Cl.
CPC .. *H01L 21/67754* (2013.01); *H01L 21/67766* (2013.01); *H01L 21/67781* (2013.01); *G05B 2219/32252* (2013.01); *G05B 2219/40156* (2013.01); *G05B 2219/45031* (2013.01); *G05B 2219/49203* (2013.01); *Y02P 90/20* (2015.11)

(58) Field of Classification Search
CPC .... G05B 2219/45031; G05B 19/41865; G05B 19/41815; G05B 19/41875; G05B 2219/31024; Y02P 90/20; Y02P 90/28; Y10S 414/135; Y10S 414/14
See application file for complete search history.

(56) References Cited

U.S. PATENT DOCUMENTS

| | | | | |
|---|---|---|---|---|
| 6,795,745 B1* | 9/2004 | Ueno | ............... | H01L 21/67167 438/5 |
| 7,356,378 B1* | 4/2008 | Huang | ............ | G05B 19/41895 700/112 |
| 7,497,912 B2* | 3/2009 | Koyama | ........... | H01L 21/67178 118/668 |
| 7,934,880 B2* | 5/2011 | Hara | ................... | G03F 7/70525 118/66 |
| 8,504,194 B2* | 8/2013 | Mitsuyoshi | ....... | H01L 21/67742 414/222.03 |
| 8,868,233 B2* | 10/2014 | Shibata | ............ | G05B 19/41865 700/213 |
| 9,050,635 B2* | 6/2015 | Mitsuyoshi | ....... | H01L 21/67051 |
| 9,214,331 B2* | 12/2015 | Miya | ................. | H01L 21/02052 |
| 9,324,602 B2* | 4/2016 | Shinohara | ......... | H01L 21/67781 |
| 2002/0055799 A1* | 5/2002 | Lin | ........................ | G06Q 10/06 700/97 |
| 2002/0173868 A1 | 11/2002 | Mukata et al. | | |
| 2003/0120371 A1* | 6/2003 | Joma | ................ | G05B 19/41865 700/100 |
| 2005/0061248 A1* | 3/2005 | Koyama | ........... | H01L 21/67178 118/719 |
| 2006/0243204 A1* | 11/2006 | Katsuoka | ............ | C23C 18/1628 118/423 |
| 2006/0276046 A1* | 12/2006 | Hayashida | ........ | H01L 21/67276 438/737 |
| 2008/0014058 A1 | 1/2008 | Hongkham et al. | | |
| 2008/0133041 A1* | 6/2008 | Schmidt | .......... | G05B 19/41865 700/101 |
| 2008/0199283 A1* | 8/2008 | Mitsuyoshi | ....... | H01L 21/67201 414/222.01 |
| 2008/0199284 A1* | 8/2008 | Mitsuyoshi | ....... | H01L 21/67051 414/223.02 |
| 2009/0292388 A1* | 11/2009 | Iimori | .............. | G05B 19/41865 700/112 |
| 2010/0061718 A1* | 3/2010 | Hara | ................... | G03F 7/70525 396/611 |
| 2010/0159142 A1* | 6/2010 | Yasuda | ............... | G03F 7/70991 427/352 |
| 2011/0144792 A1* | 6/2011 | Nakata | .............. | H01L 21/67184 700/112 |
| 2011/0172800 A1* | 7/2011 | Koizumi | ........... | H01L 21/67253 700/100 |
| 2011/0206486 A1 | 8/2011 | Matsuyama et al. | | |
| 2011/0208344 A1* | 8/2011 | Matsuyama | ...... | H01L 21/67173 700/112 |
| 2012/0136471 A1* | 5/2012 | Krupyshev | ........... | H01L 21/682 700/112 |
| 2013/0032179 A1 | 2/2013 | Kaneko | ........................ | 134/133 |
| 2013/0193994 A1* | 8/2013 | Balog | ................ | G01R 31/2894 324/750.01 |
| 2013/0274915 A1* | 10/2013 | Maeda | .............. | H01L 21/67092 700/228 |
| 2014/0121827 A1* | 5/2014 | Kawasaki | ............ | G05B 19/409 700/228 |
| 2014/0161570 A1* | 6/2014 | Hofmeister | ....... | H01L 21/67161 414/217 |
| 2014/0161571 A1* | 6/2014 | Hiraide | ............. | H01L 21/67276 414/217.1 |
| 2015/0139760 A1* | 5/2015 | Okada | ............... | H01L 21/67276 414/222.13 |
| 2016/0128203 A1* | 5/2016 | Lim | ................. | G05B 19/41875 29/593 |

FOREIGN PATENT DOCUMENTS

| | | |
|---|---|---|
| JP | 2002-341923 | 11/2002 |
| JP | 2010-045214 | 2/2010 |
| TW | 2012 03422 | 1/2011 |
| WO | WO 2008/008727 | 1/2008 |

OTHER PUBLICATIONS

Taiwanese Office Action dated Feb. 13, 2015 in connection with Taiwanese.
Application No. 102133695 with English translation of relevant parts.
International Preliminary Report on Patentability (IPRP) issued by the IPEA/EP Patent.
Office dated Apr. 2, 2015 in connection with corresponding application PCT/JP2013/070129.

* cited by examiner

F I G. 2
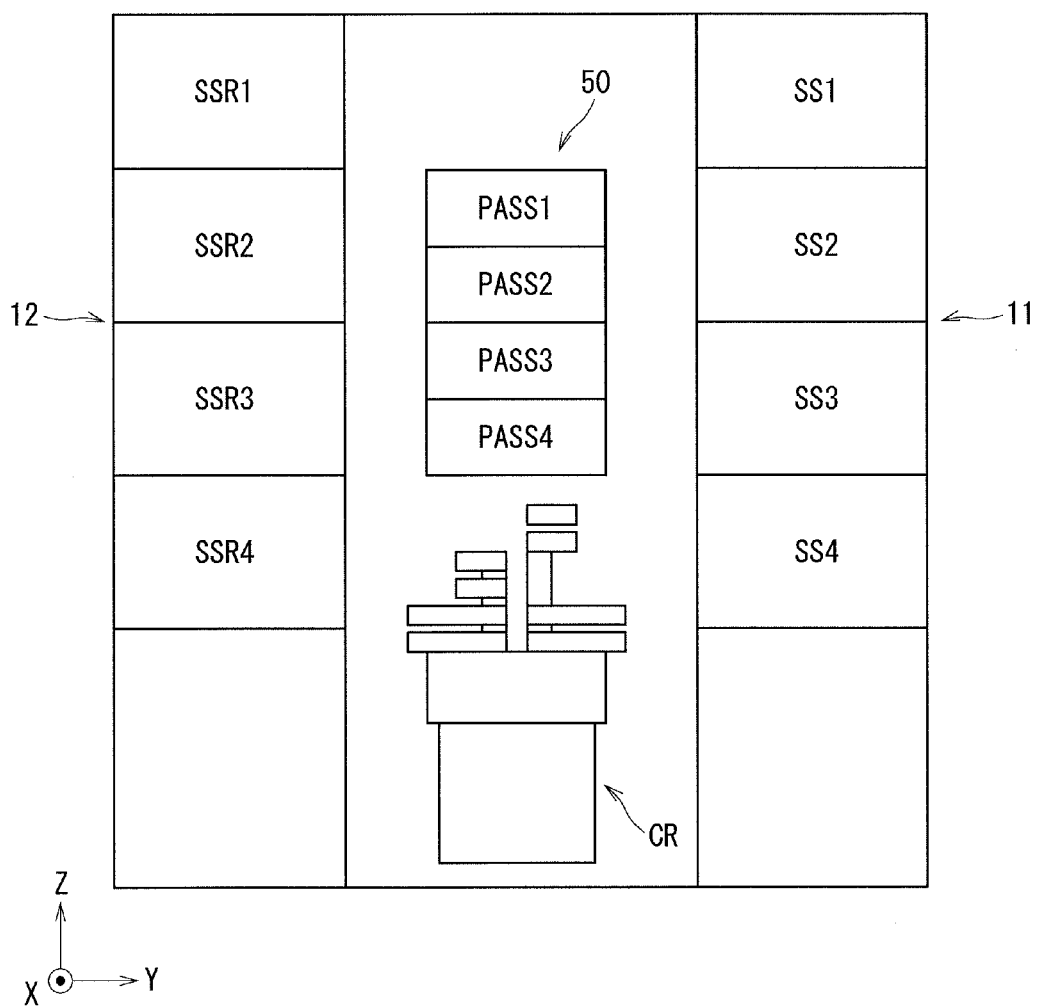

F I G. 3
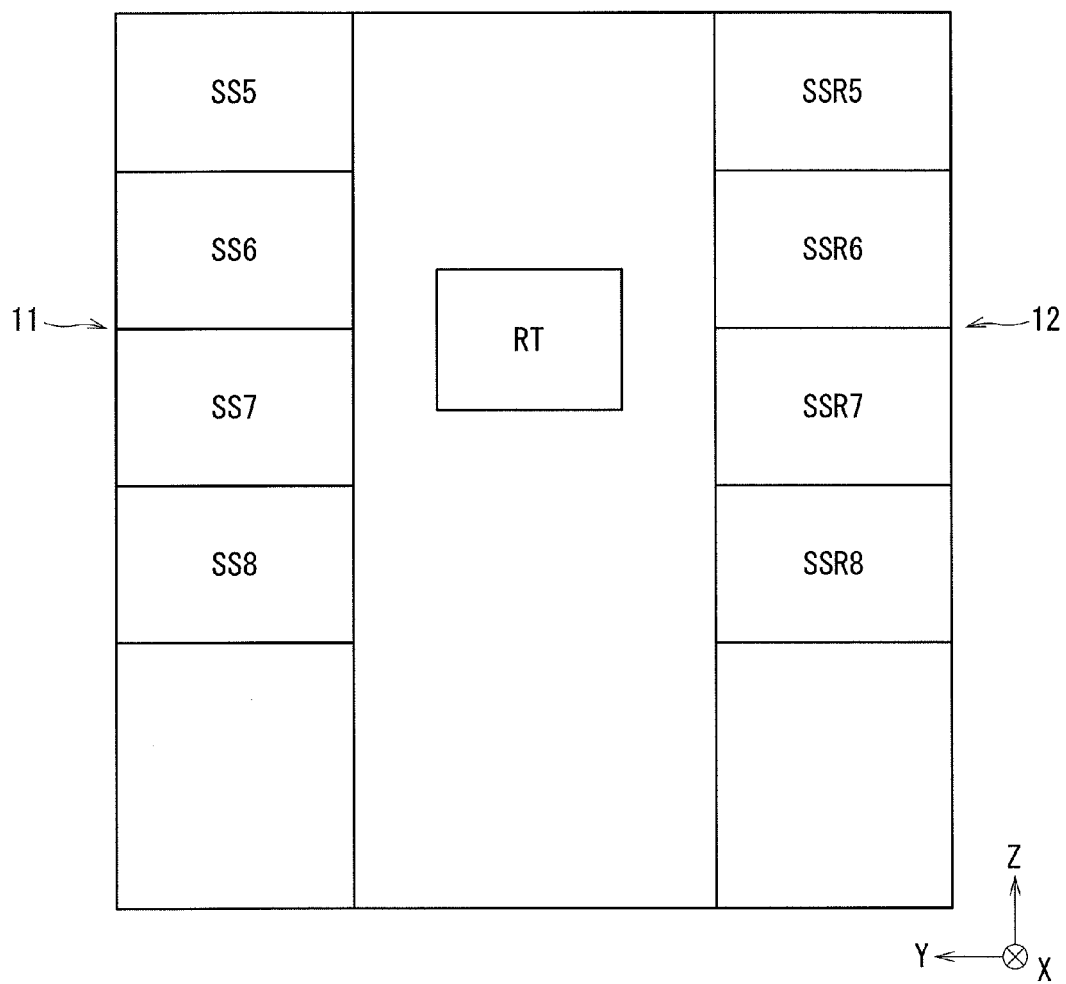

F I G. 5
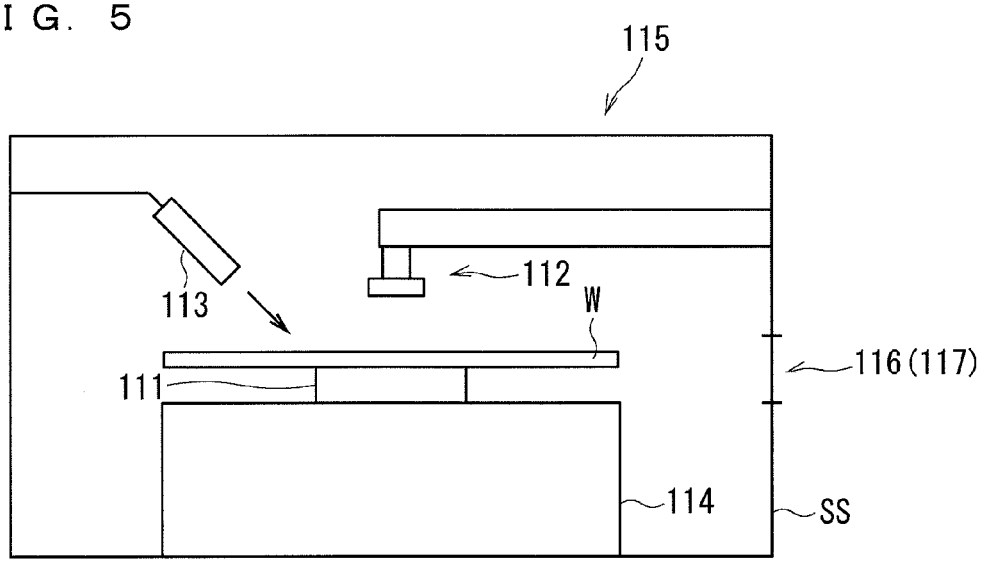

F I G. 9
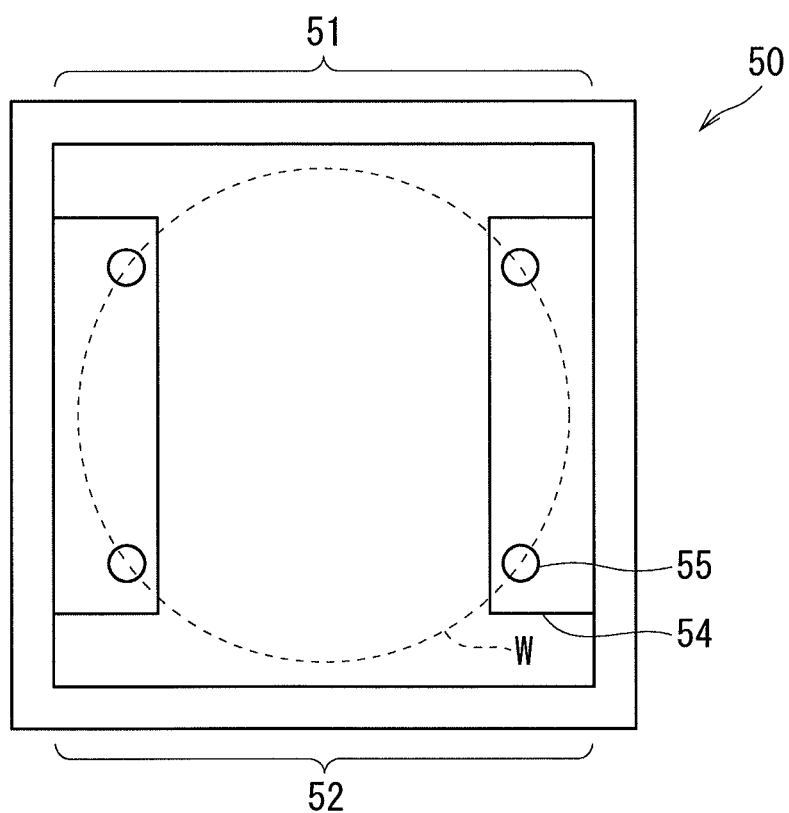

F I G. 1 1
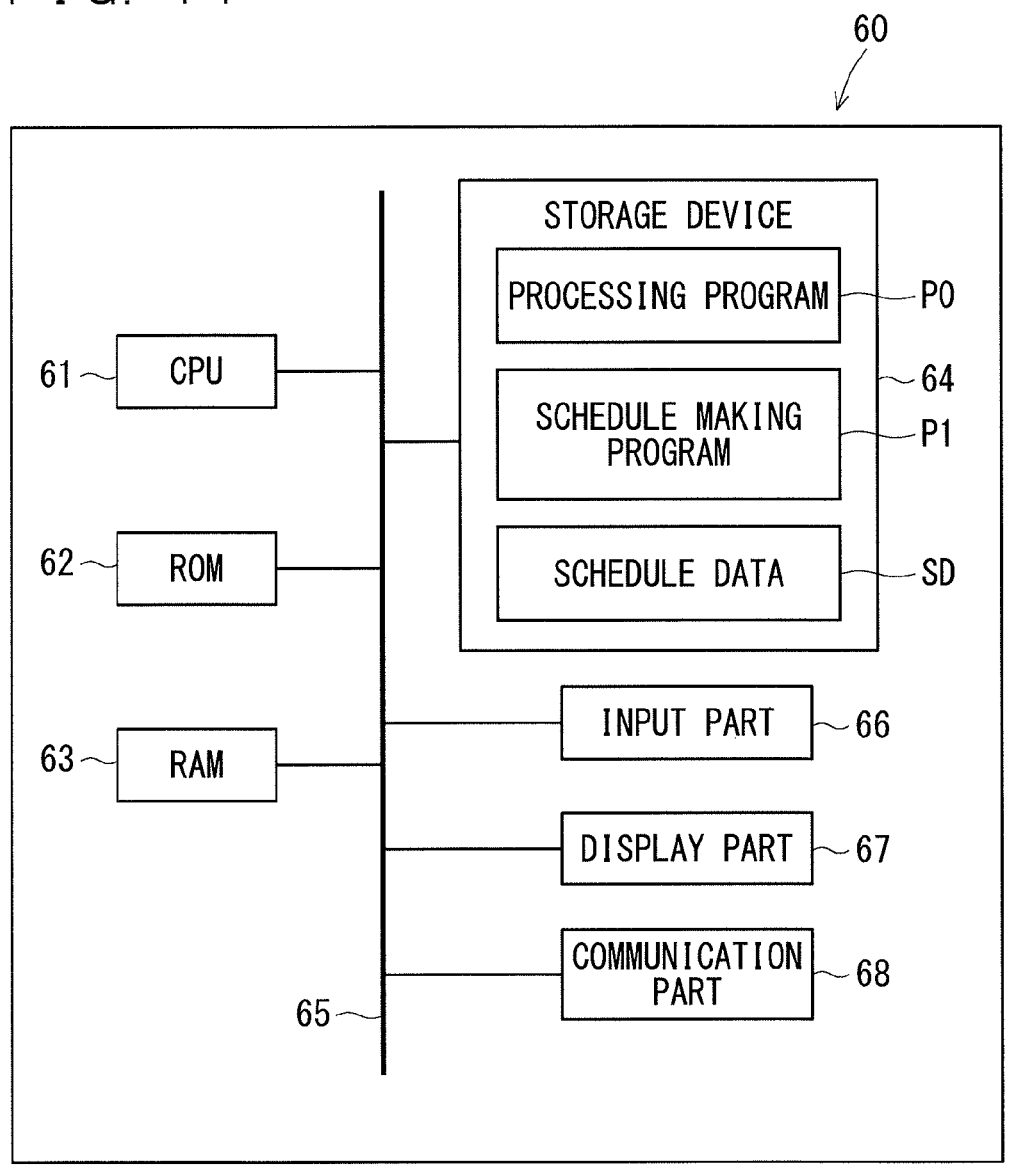

FIG. 12A
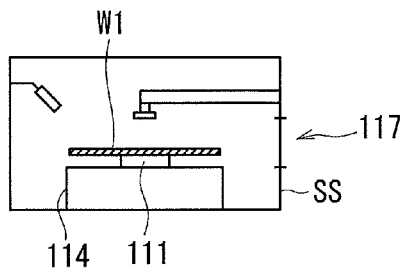 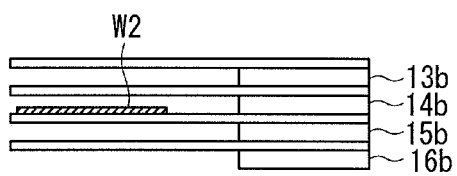
FIG. 12B
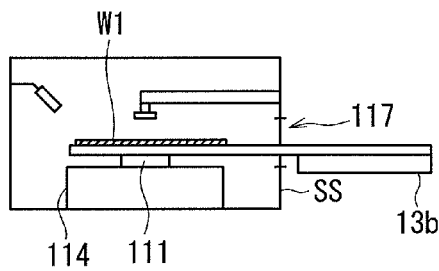 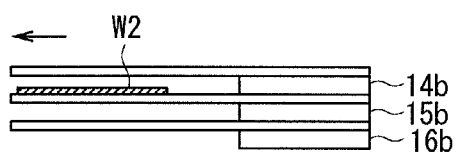
FIG. 12C
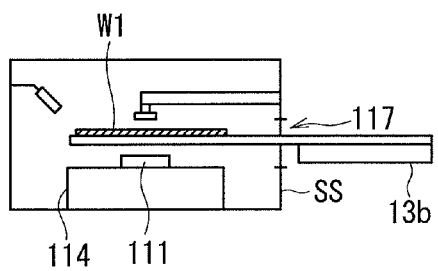 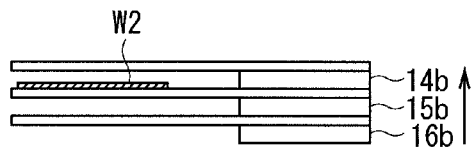
FIG. 12D
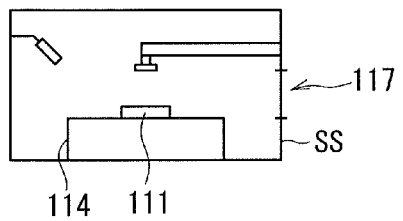 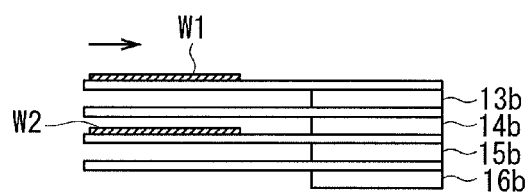

FIG. 13A
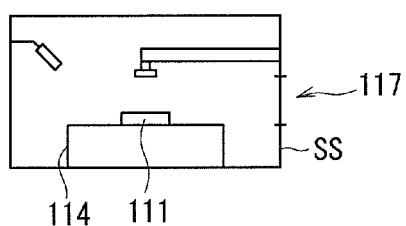 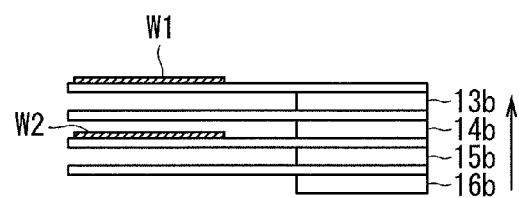
FIG. 13B
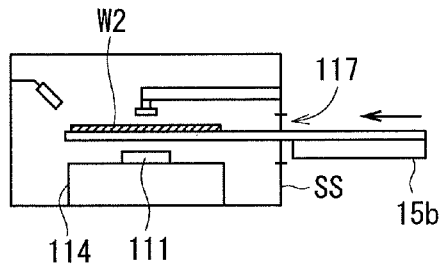 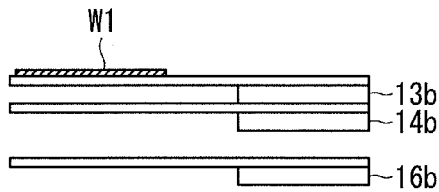
FIG. 13C
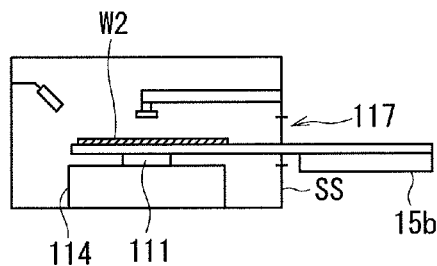 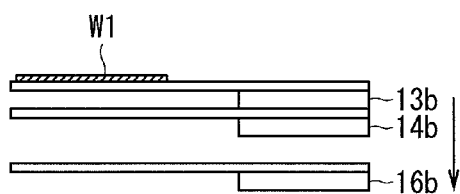
FIG. 13D
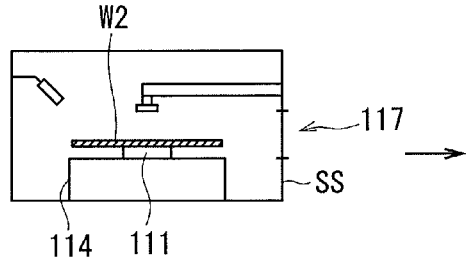 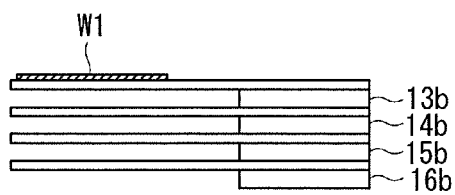

F I G. 1 4 A
PASS1
PASS2
PASS3
PASS4
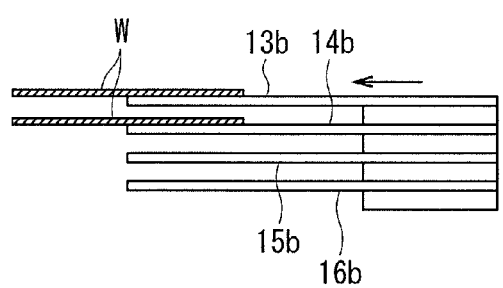
F I G. 1 4 B
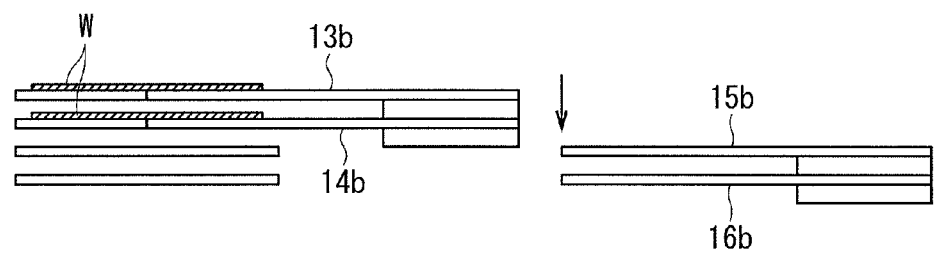
F I G. 1 4 C
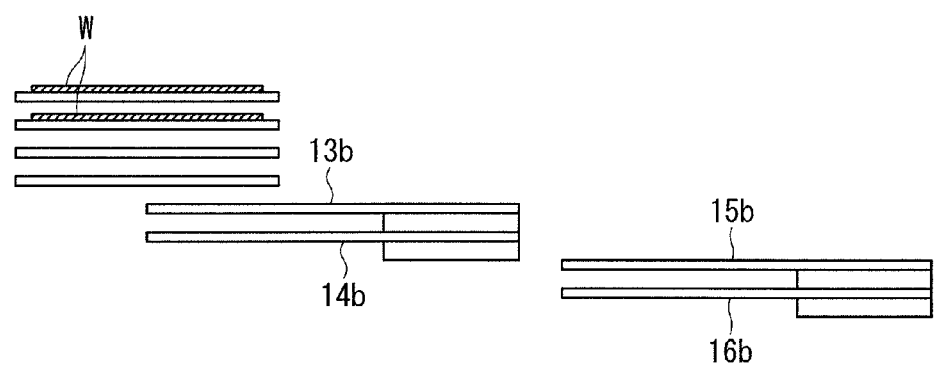

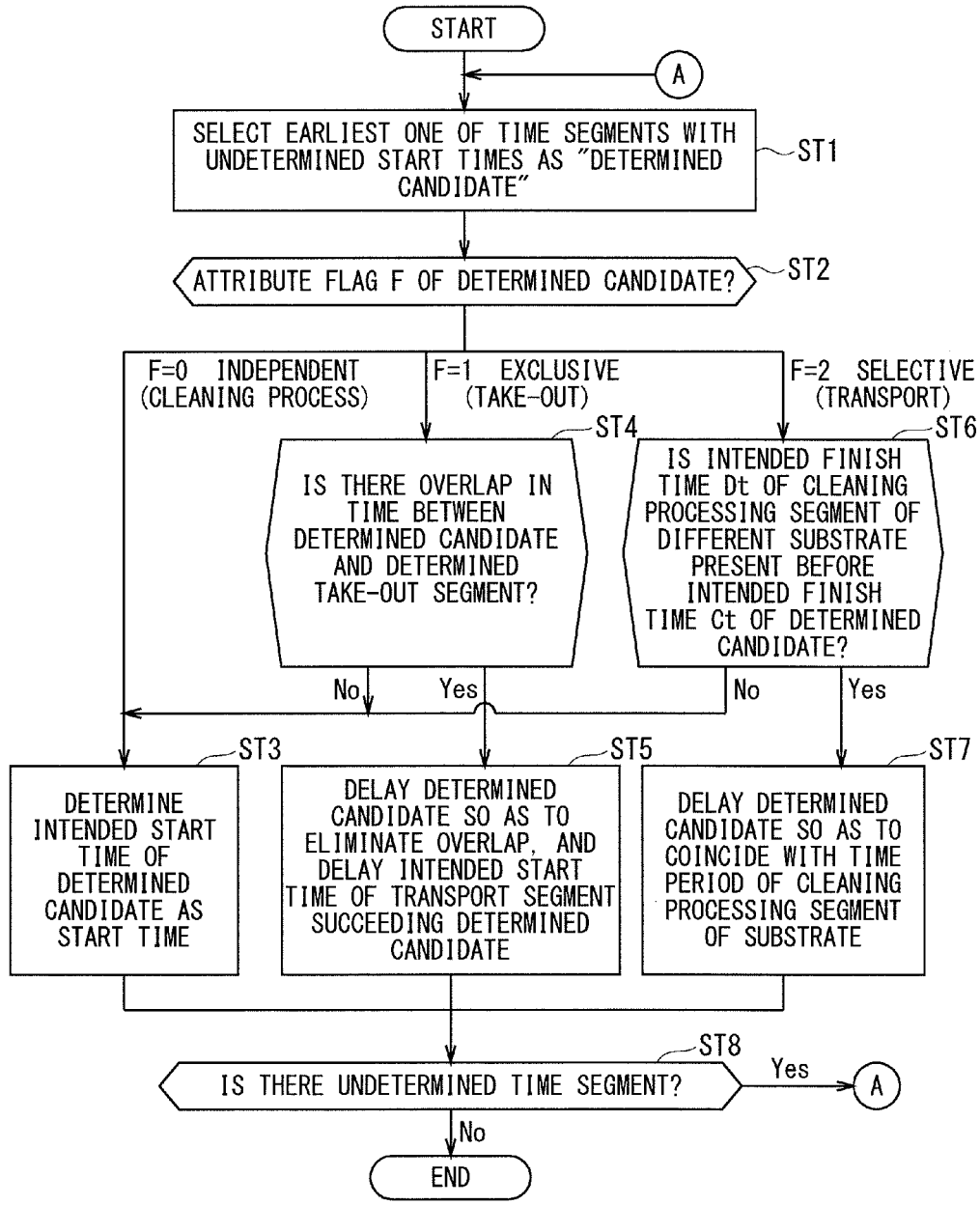

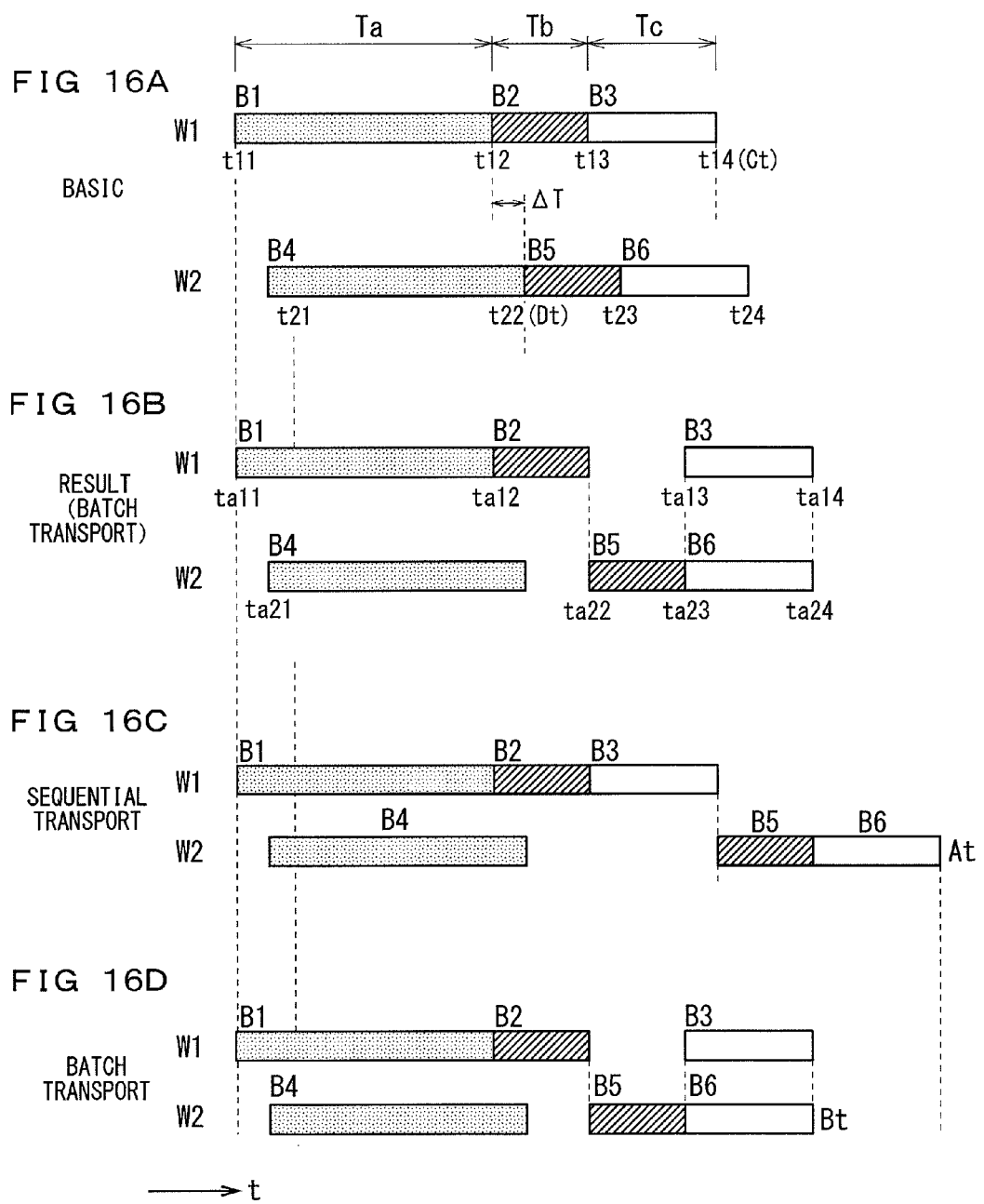

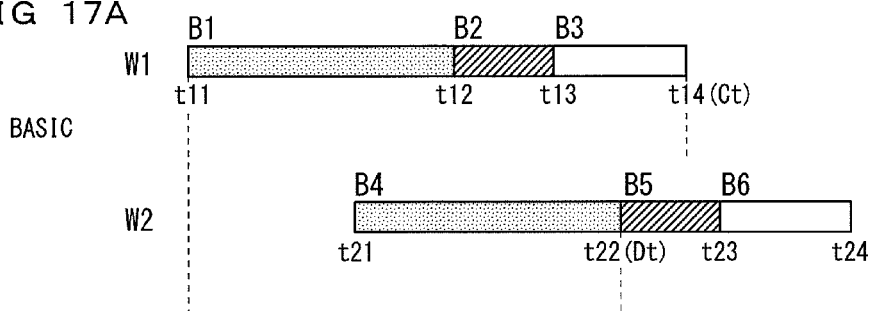
FIG. 17A BASIC
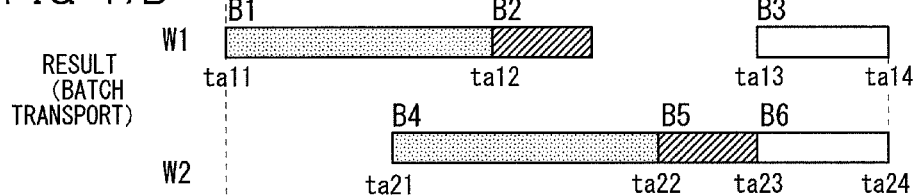
FIG. 17B RESULT (BATCH TRANSPORT)
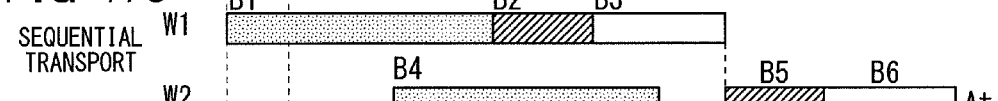
FIG. 17C SEQUENTIAL TRANSPORT
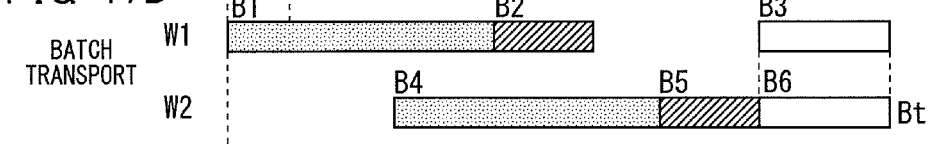
FIG. 17D BATCH TRANSPORT
→ t FIG. 18A BASIC
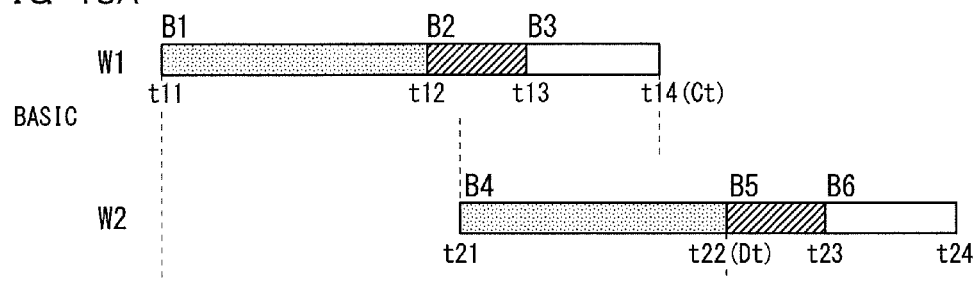
FIG. 18B RESULT (SEQUENTIAL TRANSPORT)
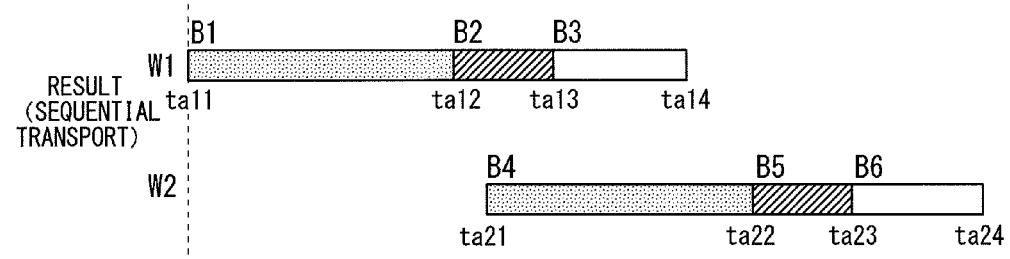
FIG. 18C SEQUENTIAL TRANSPORT
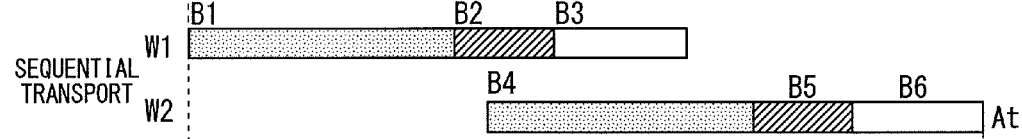
FIG. 18D BATCH TRANSPORT
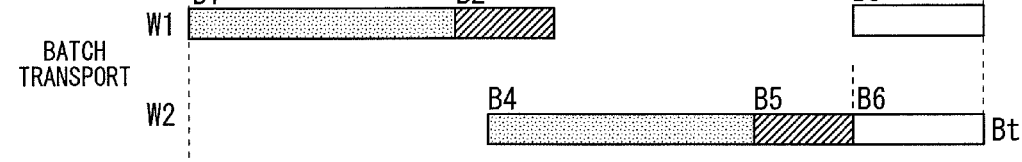

F I G. 2 0

| R1 | SEGMENT INCLUDING CARRYING-OUT PROCESS FROM CARRIER C AND TRANSPORT PROCESS TO PASS BY MEANS OF INDEXER ROBOT IR |
|---|---|
| R2 | SEGMENT INCLUDING CARRYING-IN PROCESS FROM INDEXER ROBOT IR TO PASS |
| R3 | SEGMENT INCLUDING CARRYING-OUT PROCESS FROM PASS AND TRANSPORT PROCESS TO CLEANING PROCESSING UNIT SS BY MEANS OF CENTER ROBOT CR |
| R4 | SEGMENT INCLUDING CARRYING-IN PROCESS FROM CENTER ROBOT CR TO CLEANING PROCESSING UNIT SS |

| B1, B4 | CLEANING PROCESSING SEGMENTS |
|---|---|
| B2, B5 | TAKE-OUT SEGMENTS |
| B3, B6 | TRANSPORT SEGMENTS |

| RA | OUTWARD TRAVEL: SUBSEGMENT INCLUDING TRANSPORT PROCESS TO PASS BY MEANS OF CENTER ROBOT CR |
|---|---|
| RB | SUBSTRATE TRANSFER: SUBSEGMENT INCLUDING CARRYING-IN PROCESS FROM CENTER ROBOT CR TO PASS |
| RC | RETURN TRAVEL: SUBSEGMENT FOR RETURN OF CENTER ROBOT CR TO CLEANING PROCESSING UNIT SS |

| R5 | SEGMENT INCLUDING CARRYING-OUT PROCESS FROM PASS AND TRANSPORT PROCESS TO CARRIER C BY MEANS OF INDEXER ROBOT IR |
|---|---|
| R6 | SEGMENT INCLUDING CARRYING-IN PROCESS TO CARRIER C BY MEANS OF INDEXER ROBOT IR |

| T1, T2, T3 | WAITING TIME BETWEEN SEGMENTS |
|---|---|

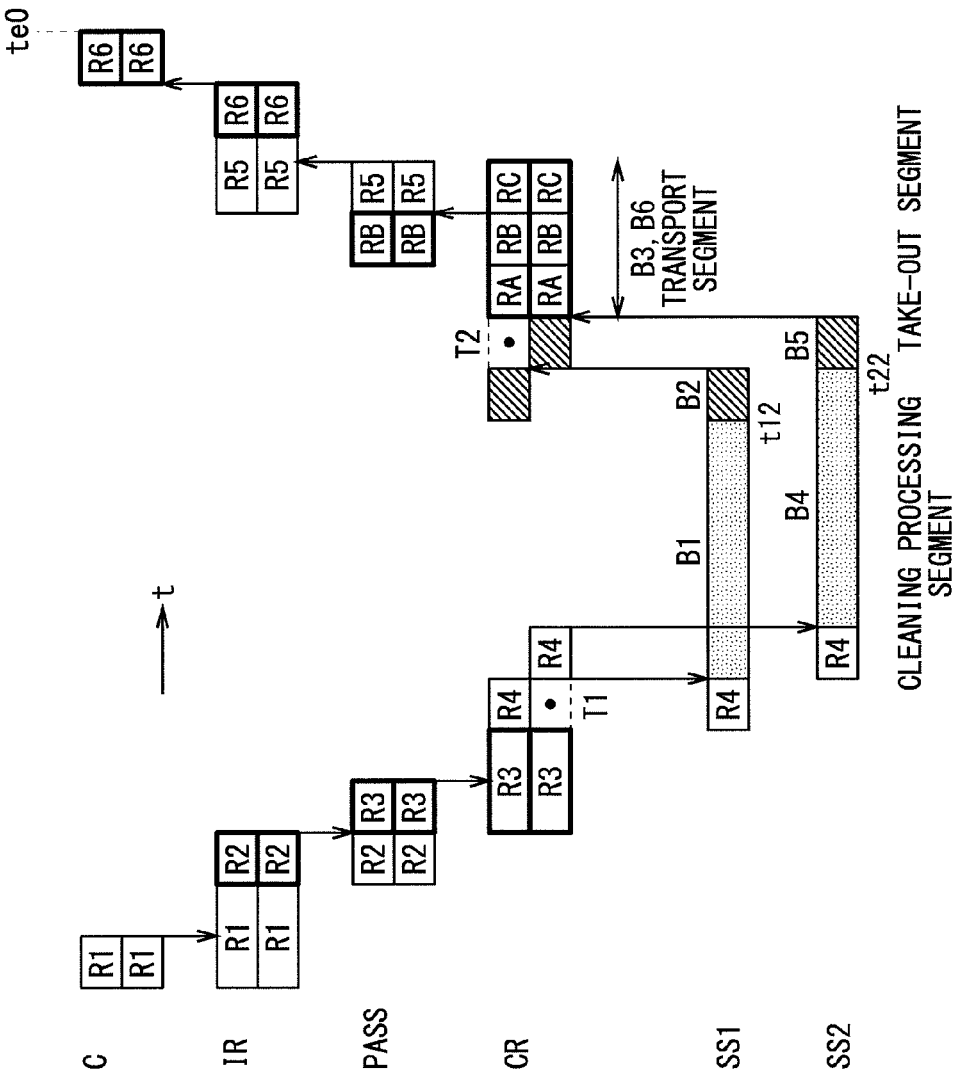

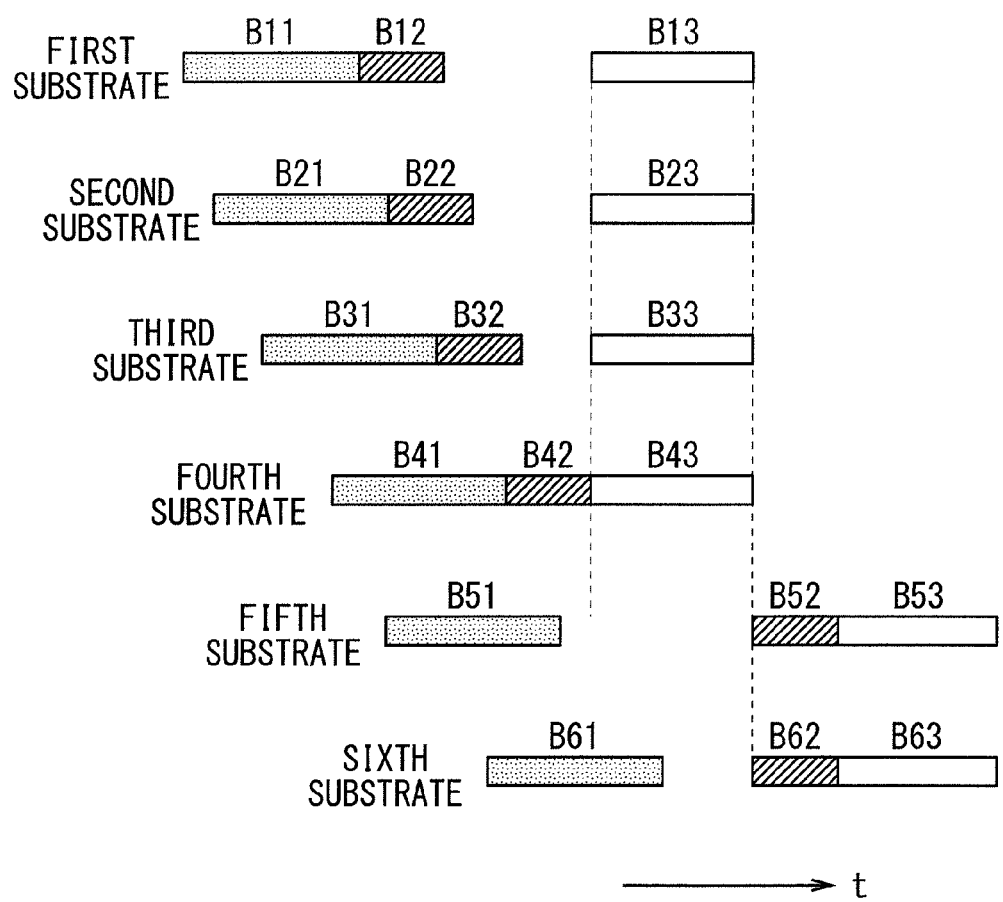
F I G. 2 7

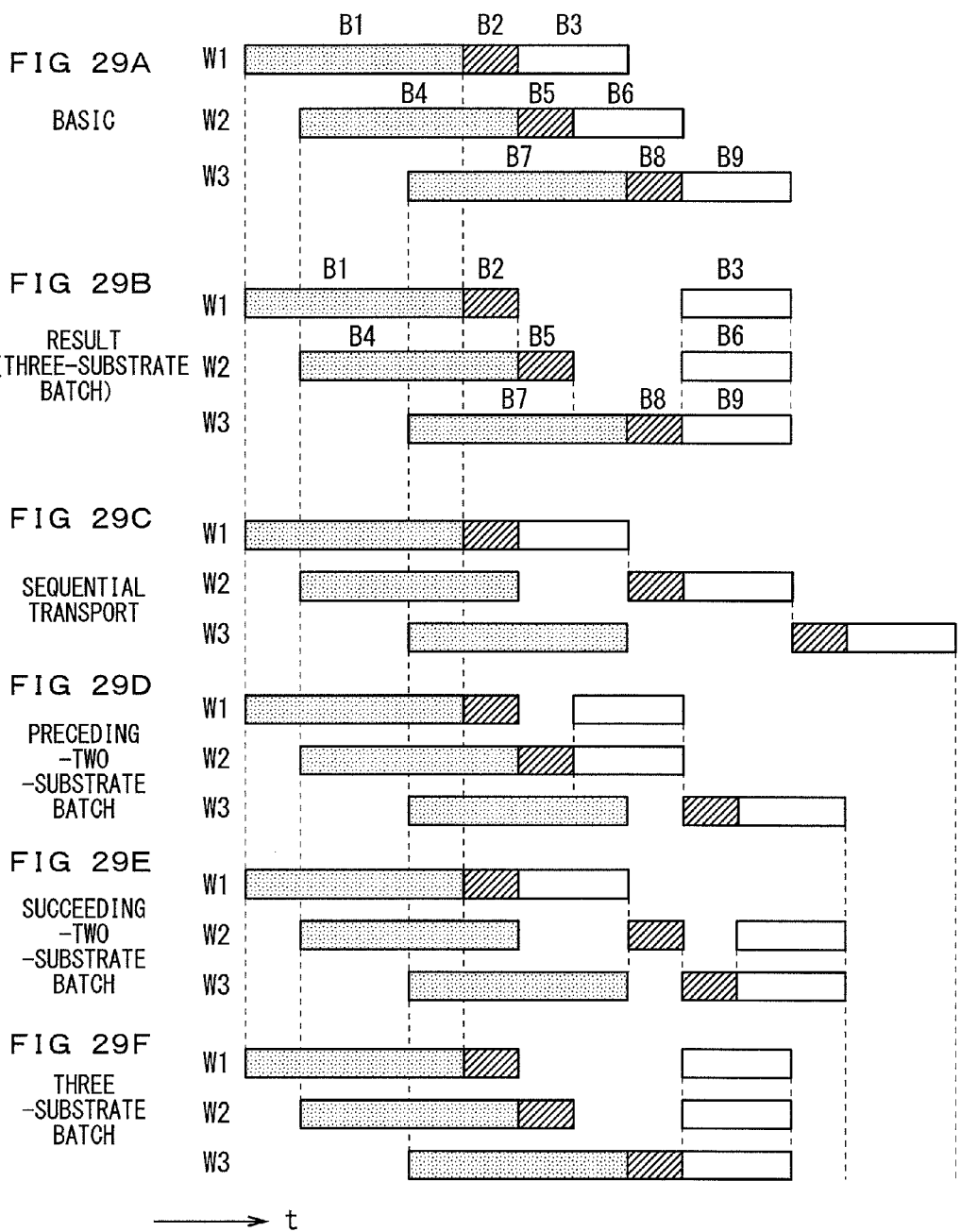

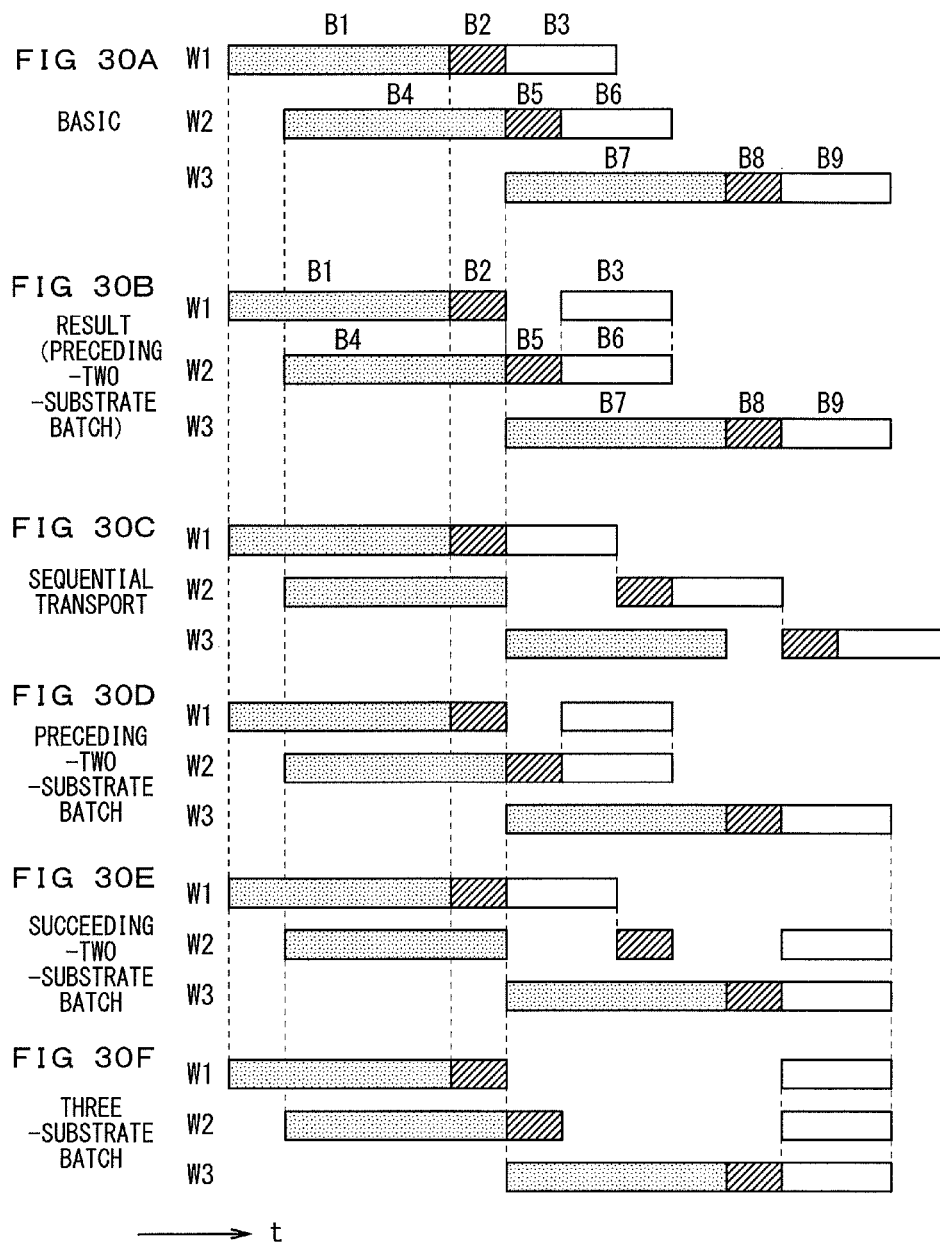

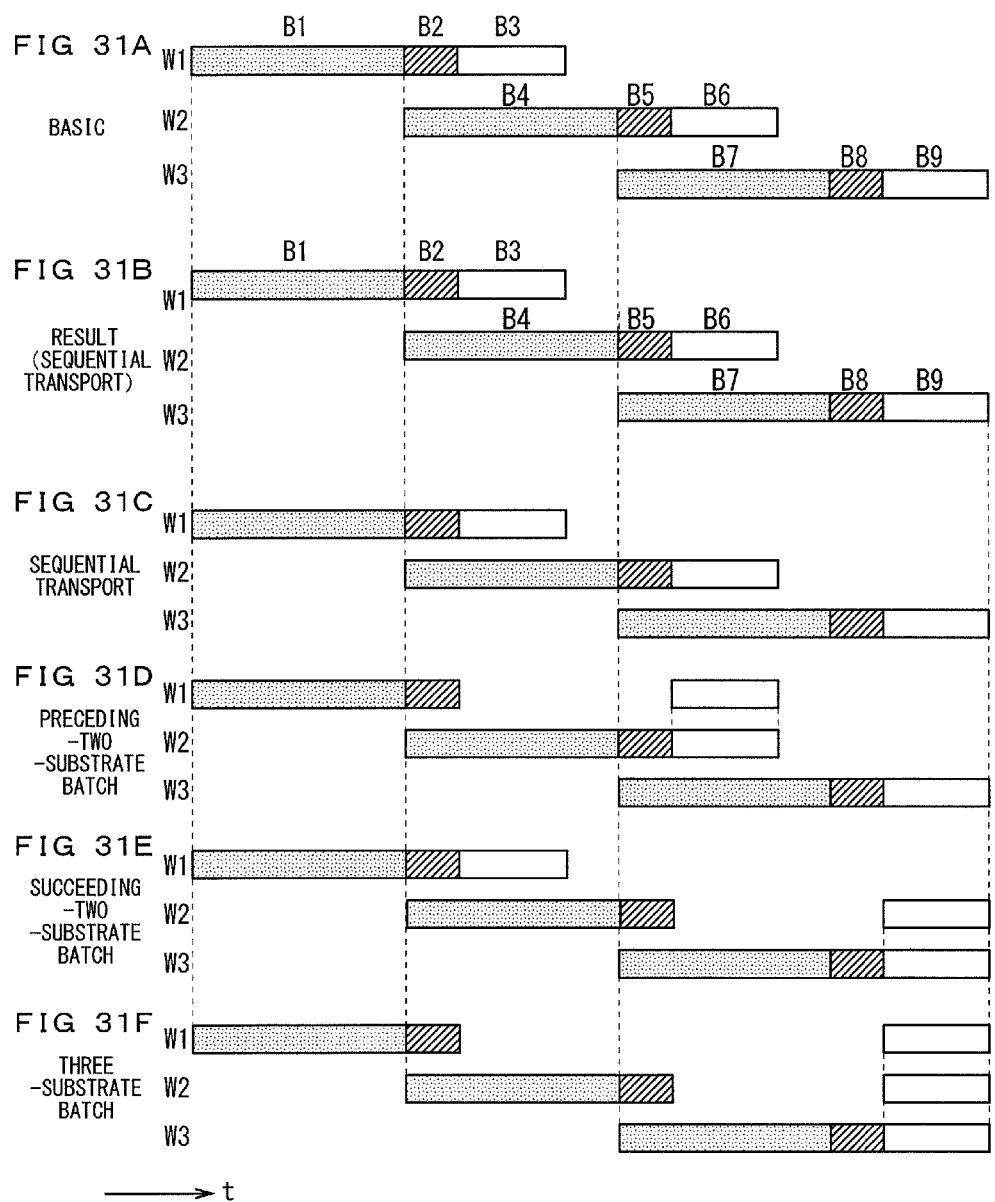

SCHEDULE MAKING DEVICE, SUBSTRATE PROCESSING APPARATUS, SCHEDULE MAKING PROGRAM, SCHEDULE MAKING METHOD, AND SUBSTRATE PROCESSING METHOD

CROSS-REFERENCE TO RELATED APPLICATIONS

The present application is a 35 U.S.C. §§ 371 national phase conversion of PCT/JP2013/070129, filed Jul. 25, 2013, which claims priority to Japanese Patent Application Nos. JP2012-208333 and JP2013-051510, filed Sep. 21, 2012 and Mar. 14, 2013, respectively, the contents of which are incorporated herein by reference. The PCT International Application was published in the Japanese language.

TECHNICAL FIELD

The present invention relates to a schedule making device which plans a procedure for substrate processing, a schedule making program, a substrate processing apparatus including the schedule making device, a schedule making method, and a substrate processing method.

BACKGROUND ART

There are a variety of substrate processing apparatuses which process substrates. For example, a substrate processing apparatus in Patent Literature 1 is configured such that an indexer block in which unprocessed substrates and processed substrates are stacked and a processing block in which a process such as cleaning is performed on substrates are connected via substrate inverting units and substrate rest parts. A transport robot specific to each block is disposed in each of the indexer block and the processing block.

A transport robot specific for the indexer block (main robot) which includes two arms independently driven back and forth is disclosed in Patent Literature 1. A substrate holding hand is provided at the distal end of each of the two arms, and is configured to be able to hold two substrates. Thus, a total of four substrates can be transported.

CITATION LIST

Patent Literature

Patent Literature 1: Japanese Patent Application Laid-Open No. 2010-45214

SUMMARY OF INVENTION

Technical Problem

Unfortunately, this literature discloses nothing about when the main robot should access which processing unit for a series of processes of substrates. For the series of processes of substrates, it is hence impossible to suitably set a transport schedule for each substrate according to the circumstances.

The present invention has been made to solve the aforementioned problem. It is therefore an object of the present invention to provide a technique capable of improving the throughput of a substrate processing apparatus by suitably setting a transport schedule for each substrate according to the circumstances for a series of processes of the substrates.

Solution to Problem

To solve the aforementioned problem, a schedule making device according to a first aspect is a schedule making device for creating a control schedule for a substrate processing apparatus including a schedule of a transport process for transporting a plurality of substrates processed in parallel at individual times in a plurality of processing units to a predetermined transport destination by means of a predetermined transport means. The schedule making device comprises: (a) a comparing means for making a comparison between a first judging time value and a second judging time value, said first judging time value corresponding to a time at which a sequential carrying-out procedure is completed as a carrying-out sequence for performing said transport process sequentially on a preceding substrate and a succeeding substrate, said second judging time value corresponding to a time at which a batch carrying-out procedure is completed as a carrying-out sequence for causing said preceding substrate to wait until the completion of the process of said succeeding substrate in a second processing unit and for performing said transport process on said preceding substrate and said succeeding substrate in one batch after the completion of the process of said succeeding substrate, said preceding substrate being a substrate the process of which is completed earlier in any one of said plurality of processing units, said succeeding substrate being a substrate the process of which is completed later than said preceding substrate in a different one of said plurality of processing units than said any one processing unit, the processing unit which performs the process of said preceding substrate being referred to as a "first processing unit", the processing unit which performs the process of said succeeding substrate being referred to as the "second processing unit"; and (b) a selective schedule creating means for creating schedule data for said substrate processing apparatus, said selective schedule creating means employing said sequential carrying-out procedure when said first judging time value is earlier than said second judging time value, said selective schedule creating means employing said batch carrying-out procedure when said second judging time value is earlier than said first judging time value.

According to a second aspect, in the schedule making device of the first aspect, said comparing means employs a time value representing a time later than the time at which the process of said preceding substrate in processing part is completed by an amount of time including to-and-fro required time in place of said first judging time value as said first judging time value; and said comparing means employs a time value representing the time at which the process of said succeeding substrate in said processing part is completed in place of said second judging time value as said second judging time value.

According to a third aspect, in the schedule making device of the second aspect, an intermediate process which requires predetermined intermediate process time is present between the completion of the process of a substrate in said plurality of processing units and the holding of the substrate by said transport means; said intermediate process is an exclusive process which cannot simultaneously be performed on two or more substrates but which can be performed on two or more substrates only sequentially one by one; said comparing means specifies said first judging time value, based on a time later than an intended first process completion time by an amount of time including said intermediate process time and said to-and-fro required time, said intended first process completion time being an intended time at which the process of said preceding substrate in said first processing unit is intended to be completed; and said comparing means specifies said second judging time value, based on an intended second process completion time, said intended second process completion time being an intended time at which the process of said succeeding substrate in said second processing unit is intended to be completed.

According to a fourth aspect, in the schedule making device of the third aspect, said transport means includes a plurality of substrate holding means; said plurality of substrate holding means are capable of taking out substrates one at a time from said plurality of processing units; and said intermediate process is a process in which each of said substrate holding means takes out a substrate from a corresponding one of said processing units.

According to a fifth aspect, in the schedule making device of the first aspect, the duration of each unit step for each substrate in said schedule is previously defined as a time segment; said selective schedule creating means includes a determined candidate specifying means for selecting each segment in chronological order of intended start times from a basic schedule serving as a sequence made by contiguously arranging time segments corresponding to a series of steps performed on said preceding substrate and said succeeding substrate to specify the selected segment as a determined candidate segment, and a determining means for determining an arrangement time period of said determined candidate segment, based on predetermined arrangement conditions between the time segments of said preceding substrate and said succeeding substrate; and said determining means determines the arrangement time period of said determined candidate segment, based on a result of the comparison between said first judging time value and said second judging time value.

According to a sixth aspect, in the schedule making device of the first aspect, said transport means is capable of simultaneously holding and transporting substrates the maximum number of which equals a maximum holding count Nmax having a value of not less than three; and while sequentially selecting pairs of said preceding and succeeding substrates from a plurality of substrates to be transported, said selective schedule creating means makes a comparison between said first judging time value and said second judging time value for said selected preceding and succeeding substrates to select any of the following: a) a sequential transport procedure as a sequence for sequentially transporting substrates, b) a partial batch transport procedure for transporting part of the substrates the number of which equals the maximum holding count Nmax in one batch, and c) a whole batch transport procedure as a sequence for transporting the substrates the number of which equals the maximum holding count Nmax in one batch, thereby creating the schedule data for said substrate processing apparatus.

According to a seventh aspect, in the schedule making device of the first aspect, the process performed by each of said plurality of processing units is a process in which a substrate is in a dry state and in a non-high temperature state when the substrate the process of which is completed is transferred from each processing unit to said transport means.

According to an eighth aspect, in the schedule making device of the first aspect, said selective schedule creating means employs said sequential carrying-out procedure to create the schedule data for said substrate processing apparatus when said first judging time value and said second judging time value are the same.

According to a ninth aspect, in the schedule making device of the first aspect, said selective schedule creating means employs said batch carrying-out procedure to create the schedule data for said substrate processing apparatus when said first judging time value and said second judging time value are the same.

According to a tenth aspect, in the schedule making device of the first aspect, said predetermined transport destination includes four substrate rest parts spaced a predetermined distance apart from each other in a vertical direction; said transport means includes four substrate holding means spaced a predetermined distance apart from each other in a vertical direction in corresponding relation to said four substrate rest parts; and said four substrate holding means are individually drivable in a horizontal direction to thereby allow substrates to be individually transferred between the four substrate holding means and said four substrate rest parts corresponding thereto.

According to an eleventh aspect, in the schedule making device of the tenth aspect, two of said four substrate holding means of said transport means which are at an upper position are used for the transport of processed substrates subjected to said process, and two of said four substrate holding means which are at a lower position are used for the transport of unprocessed substrates prior to said process.

According to a twelfth aspect, in the schedule making device of the eleventh aspect, when said transport means places two of said processed substrates on any two of said four substrate rest parts, said two processed substrates are placed on two of said four substrate rest parts which are at an upper position by means of said two substrate holding means which are at the upper position.

According to a thirteenth aspect, in the schedule making device of the eleventh aspect, when said transport means places two of said unprocessed substrates on any two of said four substrate rest parts, said two unprocessed substrates are placed on two of said four substrate rest parts which are at a lower position by means of said two substrate holding means which are at the lower position.

A schedule making device according to a fourteenth aspect is a device for creating a control schedule for a substrate processing apparatus including a schedule of a carrying-out process for carrying out a plurality of substrate sets processed in parallel at individual times in a plurality of processing units included in a predetermined processing part to a predetermined carrying-out destination by means of a predetermined transport means, each of said substrate sets being a group of at least two substrates. The schedule making device comprises: (a) a comparing means for making a comparison between a first judging time value and a second judging time value, said first judging time value corresponding to a time at which a sequential carrying-out procedure is completed as a carrying-out sequence for performing said carrying-out process sequentially on a preceding substrate set and a succeeding substrate set, said second judging time value corresponding to at time at which a batch carrying-out procedure is completed as a carrying-out sequence for causing said preceding substrate set to wait until the completion of the process of said succeeding substrate set in said processing part and for performing said carrying-out process on said preceding substrate set and said succeeding substrate set in one batch after the completion of the process of said succeeding substrate set, said preceding substrate set being a substrate set the process of which is completed earlier in said processing part, said succeeding substrate set being a substrate set the process of which is completed later than said preceding substrate set in said processing part; and (b) a selective schedule creating means for creating schedule data for said substrate processing apparatus, while employing said sequential carrying-out procedure when said first judging time value is earlier than said second judging time value and employing said batch carrying-out procedure when said second judging time value is earlier than said first judging time value.

A substrate processing apparatus according to a fifteenth aspect is a substrate processing apparatus comprising a schedule making device as recited in any one of the first to fourteenth aspects, wherein schedule control is performed based on said schedule data made by said schedule making device.

According to a sixteenth aspect, in the substrate processing apparatus of the fifteenth aspect, said schedule making device creates partial schedule data for the substrate processing apparatus for upcoming time periods sequentially in parallel with the progress of a series of substrate processes in the substrate processing apparatus, to provide the partial schedule data sequentially to a schedule controller of said substrate processing apparatus.

A schedule making program according to a seventeenth aspect is a schedule making program installed on a computer and executed to thereby cause said computer to function as a schedule making device as recited in any one of the first to fourteenth aspects.

A schedule making method according to an eighteenth aspect is a schedule making method for creating a control schedule of a substrate process including a schedule of a transport process for transporting a plurality of substrates processed in parallel at individual times in a plurality of processing units to a predetermined transport destination by means of a predetermined transport means. The schedule making method comprises: a first specifying step for specifying a first judging time value corresponding to a time at which a sequential carrying-out procedure is completed as a carrying-out sequence for performing said transport process sequentially on a preceding substrate and a succeeding substrate; a second specifying step for specifying a second judging time value corresponding to a time at which a batch carrying-out procedure is completed as a carrying-out sequence for causing said preceding substrate to wait until the completion of the process of said succeeding substrate in a second processing unit and for performing said transport process on said preceding substrate and said succeeding substrate in one batch after the completion of the process of said succeeding substrate, said preceding substrate being a substrate the process of which is completed earlier in any one of said plurality of processing units, said succeeding substrate being a substrate the process of which is completed later than said preceding substrate in a different one of said plurality of processing units than said any one processing unit, the processing unit which performs the process of said preceding substrate being referred to as a "first processing unit", the processing unit which performs the process of said succeeding substrate being referred to as the "second processing unit"; a comparing step for making a comparison between said first judging time value and said second judging time value; and a selective schedule creating step for creating schedule data for said substrate process, said selective schedule creating step employing said sequential carrying-out procedure when said first judging time value is earlier than said second judging time value, said selective schedule creating step employing said batch carrying-out procedure when said second judging time value is earlier than said first judging time value.

A schedule making method according to a nineteenth aspect is a method for creating a control schedule of a substrate process including a schedule of a carrying-out process for carrying out a plurality of substrate sets processed in parallel at individual times in a plurality of processing units included in a predetermined processing part to a predetermined carrying-out destination by means of a predetermined transport means, each of said substrate sets being a group of at least two substrates. The schedule making method comprises: a first specifying step for specifying a first judging time value corresponding to a time at which a sequential carrying-out procedure is completed as a carrying-out sequence for performing said carrying-out process sequentially on a preceding substrate set and a succeeding substrate set; a second specifying step for specifying a second judging time value corresponding to a time at which a batch carrying-out procedure is completed as a carrying-out sequence for causing said preceding substrate set to wait until the completion of the process of said succeeding substrate set in said processing part and for performing said carrying-out process on said preceding substrate set and said succeeding substrate set in one batch after the completion of the process of said succeeding substrate set, said preceding substrate set being a substrate set the process of which is completed earlier in said processing part, said succeeding substrate set being a substrate set the process of which is completed later than said preceding substrate set in said processing part; a comparing step for making a comparison between said first judging time value and said second judging time value; and a selective schedule creating step for creating schedule data for said substrate process, said selective schedule creating step employing said sequential carrying-out procedure when said first judging time value is earlier than said second judging time value, said selective schedule creating step employing said batch carrying-out procedure when said second judging time value is earlier than said first judging time value.

A substrate processing method according to a twentieth aspect is a substrate processing method further comprising a substrate processing step for executing said substrate process, based on said schedule data made by said schedule making method, in the schedule making method as recited in the eighteenth aspect.

Advantageous Effects of Invention

According to the first to twentieth aspect of the present invention, the batch transport procedure is employed when it is judged that the batch transport procedure completes the carrying-out of a plurality of substrates earlier than the sequential transport procedure. This improves the throughput of the substrate processing apparatus.

In the fifth aspect, in particular, each segment is selected in chronological order of intended start times, so that the arrangement time period is determined. In this process, whether to employ the sequential transport procedure or the batch transport procedure is judged. This achieves the data processing for making the schedule data systematically.

In the sixth aspect, the systematic judgment for the selective employment of the sequential transport procedure and the batch transport procedure is achieved when the transport means capable of simultaneously holding not less than three substrates is used.

In the seventh aspect, if waiting time during which the transport means waits while holding a substrate occurs because of the employment of the batch transport procedure, the occurrence of the waiting time has a small effect on the processing quality of the substrate.

BRIEF DESCRIPTION OF DRAWINGS

FIG. 2 is a side view of a processing compartment 3 according to the first embodiment.

FIG. 3 is a side view of the processing compartment 3 according to the first embodiment.

FIG. 5 is a schematic view showing the configuration of a cleaning processing unit according to the first embodiment.

FIG. 9 is a top view of the relay part 50 according to the first embodiment.

FIG. 11 is a block diagram showing the configuration of a controller 60 according to the first embodiment.

FIGS. 12A to 12D are conceptual views illustrating a substrate transfer operation in the center robot CR and the cleaning processing unit according to the first embodiment.

FIGS. 13A to 13D are conceptual views illustrating the substrate transfer operation in the center robot CR and the cleaning processing unit according to the first embodiment.

FIGS. 14A to 14C are conceptual views illustrating a substrate transfer operation in the center robot CR and the relay part 50 according to the first embodiment.

FIG. 15 is a flow diagram showing plan logic in the making of a schedule according to the first embodiment.

FIGS. 16A to 16D are diagrams showing examples of the schedule made based on the plan logic according to the first embodiment.

FIGS. 17A to 17D are diagrams showing examples of the schedule made based on the plan logic according to the first embodiment.

FIGS. 18A to 18D are diagrams showing examples of the schedule made based on the plan logic according to the first embodiment.

FIG. 20 is a table showing the meanings of the reference characters of segments used in FIGS. 21 to 23 in list form.

FIG. 22 is a diagram showing an example of the schedule using a batch transport procedure.

FIG. 27 is a diagram illustrating a schedule created in the second embodiment when the take-out segment is not exclusive.

FIGS. 29A to 29F are diagrams showing an example of an instance in which a three-substrate batch transport procedure is employed.

FIGS. 30A to 30F are diagrams showing an example of an instance in which a preceding-two-substrate batch transport procedure is employed.

FIGS. 31A to 31F are diagrams showing an example of an instance in which a sequential transport procedure is employed.

DESCRIPTION OF EMBODIMENTS

Embodiment according to the present invention will now be described in detail with reference to the accompanying drawings.

First Embodiment

<1. Schematic Configuration of Substrate processing apparatus 1>

Figure 1:
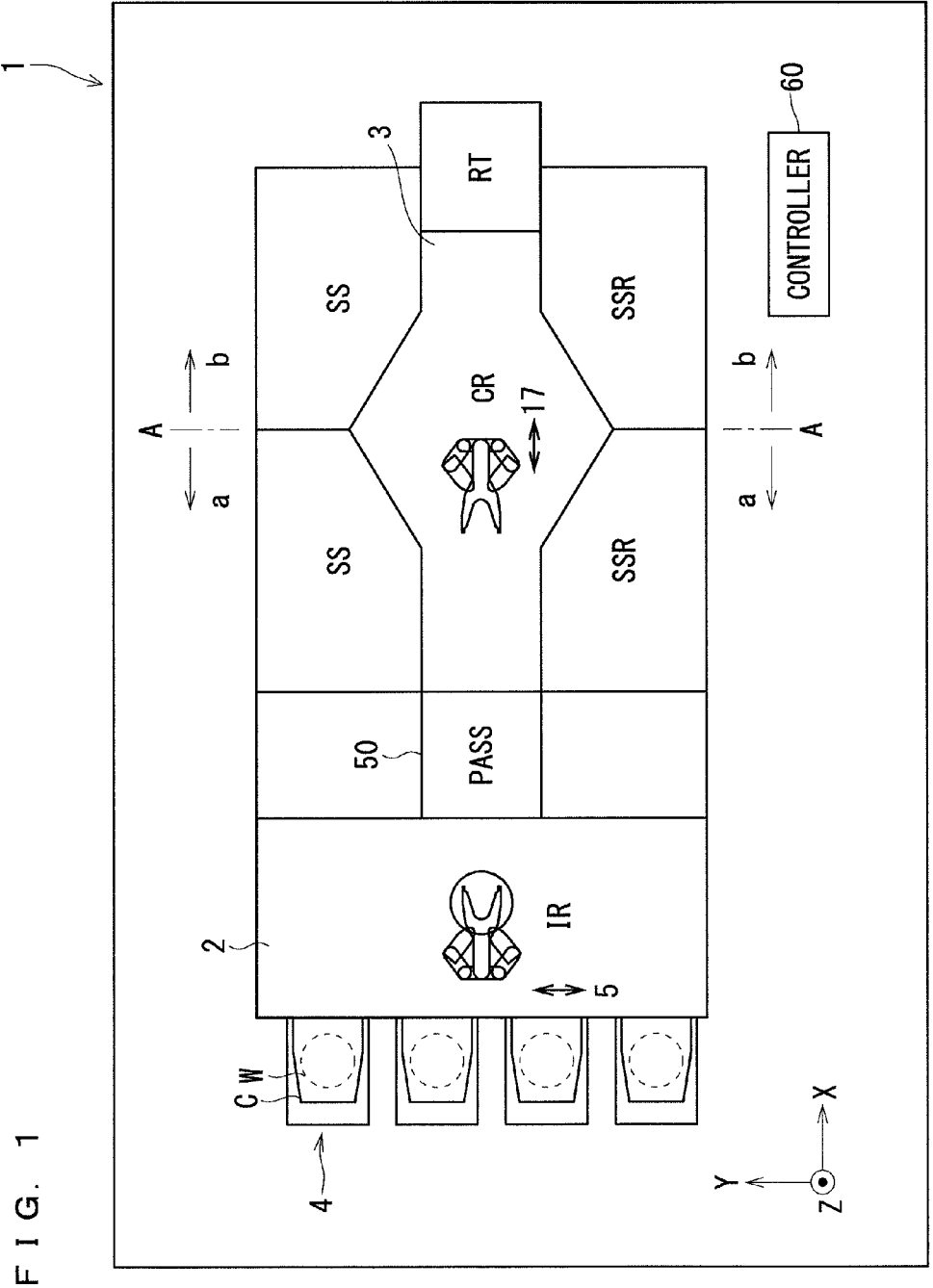
FIG. 1 is a schematic view showing the overall configuration of a substrate processing apparatus 1 according to a first embodiment.

FIG. 1 is a plan view showing the layout of a substrate processing apparatus 1 according to a first embodiment of the present invention. FIG. 2 is a side view of the substrate processing apparatus 1 as seen in the direction of an arrow a from the section taken along the line A-A of FIG. 1. FIG. 3 is a side view of the substrate processing apparatus 1 as seen in the direction of an arrow b from the section taken along the line A-A of FIG. 1. In the figures appended to the present description, X and Y directions are two-dimensional coordinate axes defining a horizontal plane, and a Z direction defines a vertical direction perpendicular to the X-Y plane.

This substrate processing apparatus 1 is a single-wafer type substrate cleaning apparatus which processes substrates W such as semiconductor wafers one by one. As shown in FIG. 1, the substrate processing apparatus 1 includes an indexer compartment 2, and a processing compartment 3 coupled to the indexer compartment 2. A relay part 50 (PASS) for the transfer of substrates W between an indexer robot IR and a center robot CR is located in a boundary portion between the indexer compartment 2 and the processing compartment 3. The substrate processing apparatus 1 further includes a controller 60 for controlling the operation of each device in the substrate processing apparatus 1. The processing compartment 3 is a compartment for performing substrate processing such as a scrub cleaning process to be described later. The substrate processing apparatus 1 as a whole serves as a single-wafer type substrate cleaning apparatus.

In the substrate processing apparatus 1 of the first embodiment, a computer program for making schedules of the processing and transport of substrates is previously stored in digital data format in the controller 60. A computer of the controller 60 executes this computer program, whereby a schedule making device is implemented as one function of the controller 60. The details on these will be described later.

<1.1 Indexer Compartment>

The indexer compartment 2 is a compartment for transferring a substrate W (unprocessed substrate W) received from the outside of the substrate processing apparatus 1 to the processing compartment 3 and for carrying out a substrate W (processed substrate W) received from the processing compartment 3 to the outside of the substrate processing apparatus 1.

The indexer compartment 2 includes carrier holding parts 4 capable of holding carriers C each capable of storing a plurality of substrates W therein, the indexer robot IR serving as a substrate transport means, and an indexer robot moving mechanism 5 (referred to hereinafter as an "IR moving mechanism 5") for horizontally moving the indexer robot IR.

Each of the carriers C is capable of horizontally holding a plurality of substrates W arranged in vertically constantly spaced relation, and holds each of the substrates W with a front surface (one of the two main surfaces where electronic devices are formed) thereof positioned to face upward. The carriers C are held by the carrier holding parts 4 while being arranged in a predetermined arrangement direction (in the first embodiment, the Y direction). The IR moving mechanism 5 is capable of horizontally moving the indexer robot IR in the Y direction.

A carrier C with unprocessed substrate W stored therein is carried in from the outside of the substrate processing apparatus 1 and placed on each of the carrier holding parts 4 by an OHT (Overhead Hoist Transfer), an AGV (Automated Guided Vehicle) and the like. Processed substrates W subjected to the substrate processing such as the scrub cleaning process in the processing compartment 3 are transferred from the center robot CR via the relay part 50 to the indexer robot IR, and are stored again in a carrier C placed on one of the carrier holding parts 4. The carrier C with the processed substrates W stored therein is carried out to the outside of the substrate processing apparatus 1 by the OHT and the like. In other words, the carrier holding parts 4 function as a substrate stacking part in which the unprocessed substrates W and the processed substrates W are stacked.

The configuration of the IR moving mechanism 5 in the present embodiment will be described. The indexer robot IR is provided with a movable base fixed thereto. This movable base is in threaded engagement with a ball screw extending in parallel with the arrangement of the carriers C in the Y direction, and is provided slidably relative to a guide rail. Thus, as a rotary motor rotates the ball screw, the entire indexer robot IR fixed to the movable base moves horizontally in a direction of the Y axis (all not shown).

In this manner, the indexer robot IR is freely movable in the Y direction. Thus, the indexer robot IR is capable of moving to a position at which substrates can be carried into and out of each of the carriers C or the relay part 50 (the carrying-in and carrying-out of substrates are referred to hereinafter as "access" in some cases).

Figure 4:
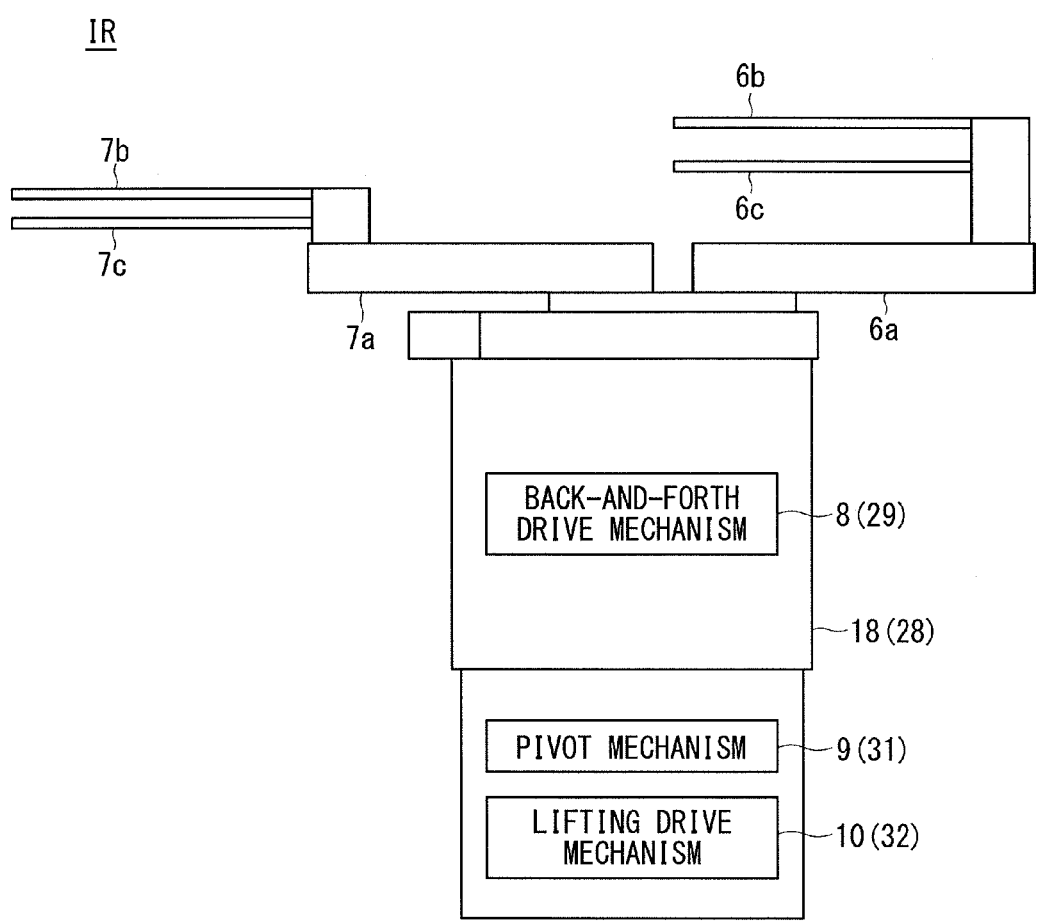
FIG. 4 is a schematic view showing the configuration of an indexer robot IR according to the first embodiment.

FIG. 4 is a diagrammatic side view of the indexer robot IR. Reference numerals within parentheses among the reference numerals and characters designating the components of FIG. 4 are those of components in the center robot CR in a case where a robot mechanism having substantially the same degree of freedom as the indexer robot IR is used also as the center robot CR. Thus, the reference numerals outside parentheses are referenced for this description of the configuration of the indexer robot IR.

The indexer robot IR has a base portion 18. One end of an arm 6a and one end of an arm 7a are mounted to the base portion 18. Hands 6b and 6c and hands 7b and 7c which are different in vertical position to prevent interference with each other are disposed at the other ends of the arm 6a and the arm 7a, respectively (although the hands 6b and 6c and the hands 7b and 7c are in vertically overlying relation in FIG. 1).

Thus, the hands 6b and 6c are held via the arm 6a by the base portion 18. Also, the hands 7b and 7c are held via the arm 7a by the base portion 18.

Each of the hands 6b, 6c, 7b and 7c has a distal end having a pair of finger portions. That is, the distal end of each of the hands 6b, 6c, 7b and 7c is in a forked form having the two finger portions as seen in plan view, and is capable of supporting the lower surface of a substrate W from below to thereby horizontally hold the single substrate W. In the present embodiment, the hands 7b and 7c (two substrate holding means at a lower position) are used for the transport of unprocessed substrates prior to the cleaning process, and the hands 6b and 6c (two substrate holding means at an upper position) are used for the transport of processed substrates after the cleaning process. The pair of finger portions of each hand has an outside dimension smaller than the spacing between a pair of support members 54 disposed in opposed relation in the relay part 50 (FIG. 9). This allows each of the hands 6b, 6c, 7b and 7c to carry a substrate W into and out of the relay part 50 without interfering with the support members 54 in substrate carrying-in and carrying-out operations to be described later.

The outside dimension of the pair of finger portions of each of the hands 6b, 6c, 7b and 7c is smaller than the diameter of the substrate W. This allows the stable holding of the substrate W.

While having the four hands 6b, 6c, 7b and 7c, this indexer robot IR is a robot mechanism capable of simultaneously transporting a maximum of two unprocessed substrates, and capable of simultaneously transporting a maximum of two processed substrates.

The arm 6a and the arm 7a are articulated stretchable arms. The indexer robot IR is capable of extending and retracting the arm 6a and the arm 7a individually by means of a back-and-forth drive mechanism 8. This allows the hands 6b and 6c and the hands 7b and 7c which correspond respectively to the arm 6a and the arm 7a to move horizontally back and forth separately.

The base portion 18 contains a pivot mechanism 9 for rotating the base portion 18 about a vertical axis, and a lifting drive mechanism 10 for moving the base portion 18 vertically upwardly and downwardly.

The indexer robot IR having the aforementioned configuration is freely movable in the Y direction by the IR moving mechanism 5. Also, the indexer robot IR is capable of adjusting the angle of each hand in a horizontal plane and the height of each hand in a vertical direction by means of the pivot mechanism 9 and the lifting drive mechanism 10.

Thus, the indexer robot IR is capable of bringing the hands 6b and 6c and the hands 7b and 7c into opposed relation to the carriers C and the relay part 50. With the hands 6b and 6c and the hands 7b and 7c in opposed relation to the carriers C, the indexer robot IR is capable of extending the arm 6a or the arm 7a to cause the hands 6b and 6c and the hands 7b and 7c which correspond respectively to the arm 6a and the arm 7a to access the carriers C.

<1.2 Processing Compartment>

The processing compartment 3 is a compartment for performing a cleaning process on unprocessed substrates W transported from the indexer compartment 2 to transport processed substrates W subjected to the cleaning process again to the indexer compartment 2.

The processing compartment 3 includes a front surface cleaning processing part 11 for performing the cleaning process on the front surfaces of substrates one by one, a back surface cleaning processing part 12 for performing the cleaning process on the back surfaces of substrates one by one, an inverting unit RT for inverting or flipping a substrate upside down, the center robot CR serving as a substrate transport means, and a center robot moving mechanism 17 (referred to hereinafter as a "CR moving mechanism 17")

for moving the center robot CR horizontally. The configuration of each device in the processing compartment 3 will be described below.

As shown in FIGS. 1 to 3, the front surface cleaning processing part 11 includes two groups of front surface cleaning processing units SS1 to SS4 and SS5 to SS8, each group being comprised of four front surface cleaning processing units stacked in a vertical direction. The back surface cleaning processing part 12 includes two groups of back surface cleaning processing units SSR1 to SSR4 and SSR5 to SSR8, each group being comprised of four back surface cleaning processing units stacked in a vertical direction.

As shown in FIG. 1, the front surface cleaning processing part 11 and the back surface cleaning processing part 12 are spaced a predetermined distance apart from each other in the Y direction. The center robot CR is located between the front surface cleaning processing part 11 and the back surface cleaning processing part 12.

FIG. 5 shows that the scrub cleaning process is performed on the front surface of a substrate W in each of the cleaning processing units SS1 to SS8 of the front surface cleaning processing part 11. Each of the cleaning processing units SS1 to SS8 includes a spin chuck 111 for holding a substrate W with its front surface facing upward in a horizontal attitude to rotate the substrate W about an axis extending in a vertical direction, a cleaning brush 112 in contact with or in proximity to the front surface of the substrate W held on the spin chuck 111 for performing scrub cleaning on the front surface of the substrate W, a nozzle 113 for applying a cleaning liquid (e.g., pure water) onto the front surface of the substrate W, a spin rotation support part 114 for rotatably driving the spin chuck 111, and a unit case 115 for housing a cup (not shown) surrounding the substrate W held on the spin chuck 111 and these members therein. The unit case 115 includes a gate 117 having a slidably openable and closable slit 116 for carrying a substrate W into and out of the unit case 115 therethrough.

The back surface cleaning processing part 12 performs the scrub cleaning process on the back surface of each substrate W. Like the front surface cleaning processing units SS1 to SS8, each of the back surface cleaning processing units SSR1 to SSR8 includes a spin chuck, a cleaning brush, a nozzle, a spinrotation support part, a cup and a unit case for housing these members. Also, the unit case includes a gate having a slidably openable and closable slit for carrying a substrate W into and out of the unit case therethrough (all not shown).

The spin chuck 111 in each of the front surface cleaning processing units SS1 to SS8 may be of a vacuum suction type to hold the back surface of the substrate W, but the spin chuck in each of the back surface cleaning processing units SSR1 to SSR8 is preferably of the type which mechanically grip the edge portion of the substrate to hold the front surface of the substrate W.

For the cleaning of the front surface of the substrate W with the cleaning brush 112, a brush moving mechanism not shown moves the cleaning brush 112 to over the substrate W held by the spin chuck 111 with its front surface facing upward. Then, while the spin chuck 111 rotates the substrate W, a processing liquid (e.g., pure water (deionized water)) is applied from the nozzle 113 onto the front surface of the substrate W, and the cleaning brush 112 is brought into contact with the upper surface of the substrate W. Further, with the cleaning brush 112 in contact with the upper surface of the substrate W, the cleaning brush 112 is moved along the upper surface of the substrate W. This causes the cleaning brush 112 to scan the upper surface of the substrate W, thereby performing the scrub cleaning on the entire front surface of the substrate W. In this manner, the process is performed on the front surface of the substrate W. The cleaning of the back surface of the substrate is performed in a similar manner.

The inverting unit RT is a processing unit for performing an inverting process on a substrate W carried thereinto by the center robot CR. After the inverting unit RT inverts the substrate W, the center robot CR carries the substrate out of the inverting unit RT.

In the substrate processing apparatus 1 according to the first embodiment, the cleaning process is performed on the upper surface of a substrate (independently of whether the upper surface is the front or back of the substrate; the vertically upper side at that time is an upper surface, and the vertically lower side is a lower surface) in each of the cleaning processing units SS1 to SS8 and SSR1 to SSR8 of the front surface cleaning processing part 11 and the back surface cleaning processing part 12. It is hence necessary to perform the inverting process on the substrate W aside from the cleaning process when the cleaning process is performed on both of the surfaces of the substrate. The inverting unit RT is used at this time.

In the present embodiment, the cleaning processing units SS1 to SS8 and SSR1 to SSR8 in the cleaning processing parts 11 and 12 are illustrated as devices for performing the scrub cleaning on the substrate W. However, the substrate processing performed by the cleaning processing units SS1 to SS8 and SSR1 to SSR8 in the cleaning processing parts 11 and 12 is not limited to the scrub cleaning. For example, each of the cleaning processing units SS1 to SS8 and SSR1 to SSR8 may be a cleaning processing unit which cleans substrates W one by one using a fluid such as a processing liquid (cleaning liquid, rinsing liquid and the like) or gas applied from a nozzle and the like opposed to the front surface or back surface of the substrate without performing the brush cleaning.

Figure 6:
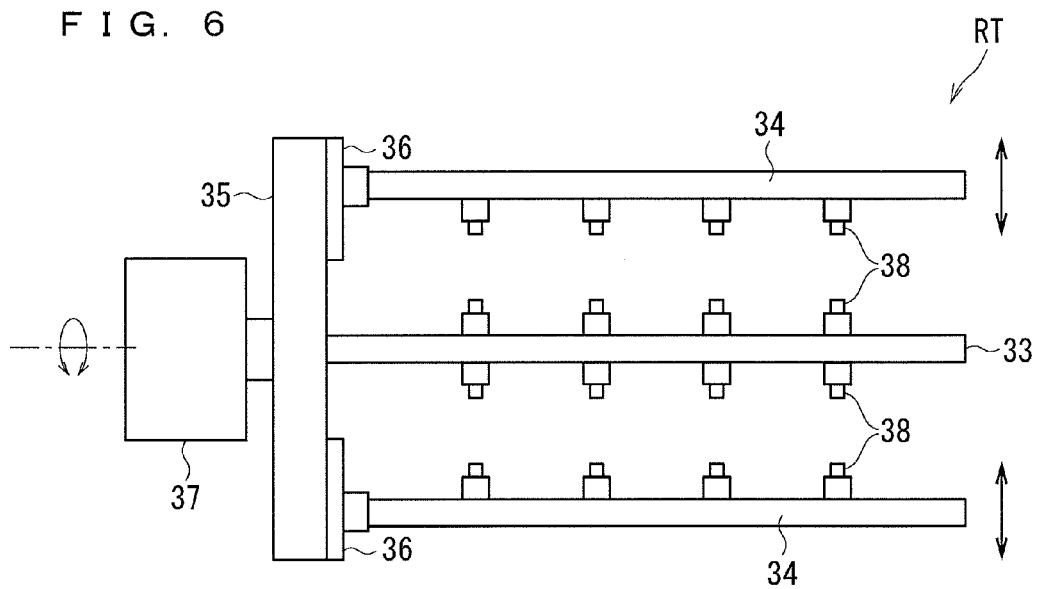
FIG. 6 is a schematic view showing the configuration of an inverting processing unit RT according to the first embodiment.

FIG. 6 is a diagrammatic side view of the inverting unit RT.

As shown in FIG. 6, the inverting unit RT includes a horizontally located fixed plate 33, and a pair of movable plates 34 horizontally located over and under the fixed plate 33, with the fixed plate 33 therebetween. The fixed plate 33 and the pair of movable plates 34 are rectangular in shape, and are positioned in overlying relation as seen in plan view. The fixed plate 33 is fixed in a horizontal attitude to a support plate 35. Each of the movable plates 34 is mounted in a horizontal attitude to the support plate 35 via a vertically extending guide 36.

The movable plates 34 are movable in a vertical direction with respect to the support plate 35. Each of the movable plates 34 is moved in a vertical direction by an actuator not shown such as an air cylinder. A rotary actuator 37 is mounted to the support plate 35. The fixed plate 33 and the pair of movable plates 34 are integrally rotated about a horizontal rotation axis together with the support plate 35 by the rotary actuator 37. The rotary actuator 37 rotates the support plate 35 through 180 degrees about the horizontal rotation axis to thereby invert or flip the fixed plate 33 and the pair of movable plates 34 upside down.

A plurality of support pins 38 are mounted to opposed surfaces of the fixed plate 33 and the pair of movable plates 34 (e.g., the lower surface of the upper movable plate 34 and the upper surface of the fixed plate 33). The support pins 38 on each surface are disposed in appropriately spaced relation on a circumference corresponding to the outer peripheral shape of a substrate W. The support pins 38 have a constant height (length from a proximal end to a distal end) which is greater than the thickness (dimension in a vertical direction) of hands 13b to 16b.

The fixed plate 33 is capable of supporting a single substrate W horizontally thereover vis the support pins 38. When positioned on a lower side, the pair of movable plates 34 is capable of supporting a single substrate W horizontally thereover via the support pins 38. The vertical spacing between the substrate support position of the fixed plate 33 and the substrate support position of the movable plates 34 is set to be equal to the vertical spacing between two substrates W held by the hands 13b to 16b of the center robot CR.

Because of the aforementioned configuration of the inverting unit RT, the center robot CR is capable of causing a substrate W held by each of the hands 13b to 16b to access (be carried into and out of) the inverting unit RT. The details on the transfer operation of the substrate W will be described later.

With a substrate W placed on the fixed plate 33 by the center robot CR, the upper movable plate 34 is moved downwardly, so that the substrate W is horizontally held between the fixed plate 33 and the upper movable plate 34. With a substrate W placed on the lower movable plate 34, the lower movable plate 34 is moved upwardly, so that the substrate W is horizontally held between the fixed plate 33 and the lower movable plate 34. With the substrates W held within the inverting unit RT, the rotary actuator 37 rotates the support plate 35 about the horizontal rotation axis to thereby invert or flip the held substrates W upside down.

As described above, the inverting unit RT is capable of horizontally holding a plurality of (in this first embodiment, two) substrates W to invert or flip the held substrates W upside down. The inverting unit RT is accessible from the center robot CR side. Thus, the center robot CR is capable of carrying the substrates W into the inverting unit RT and carrying the substrates W inverted by the inverting unit RT out of the inverting unit RT.

The configuration of the CR moving mechanism 17 in this embodiment is similar to that of the aforementioned IR moving mechanism 5. Specifically, the CR moving mechanism 17 includes a movable base, a ball screw and a guide rail which are elongated in the X direction, and a rotary motor for rotating the ball screw (all not shown). As the ball screw is rotated, the entire center robot CR fixed to the movable base passes between the front surface cleaning processing part 11 and the back surface cleaning processing part 12 to move horizontally in the X direction in a section lying between the relay part 50 and the inverting unit RT.

In this manner, the center robot CR, which is freely movable in the X direction, is capable of moving to positions at which access (carrying-in and carrying-out) can be made to the cleaning processing units SS1 to SS8 and SSR1 to SSR8. Similarly, the center robot CR is also capable of moving to positions at which access (carrying-in and carrying-out) can be made to the relay part 50 and the inverting unit RT.

The center robot CR may employ a configuration substantially similar to that of the indexer robot IR of FIG. 4, i.e. a robot mechanism having two groups of two hands fixed relative to each other, the two groups being vertically disposed so as to be driven back and forth independently (referred to hereinafter as a "2A4H mechanism" which means "two arms and four hands"), or other configurations. Components in a case where a robot having the 2A4H mechanism is used as the center robot CR are similar to those described relating to the indexer robot IR in FIG. 4, and repetition in description thereof is dispensed with.

Figure 7A:
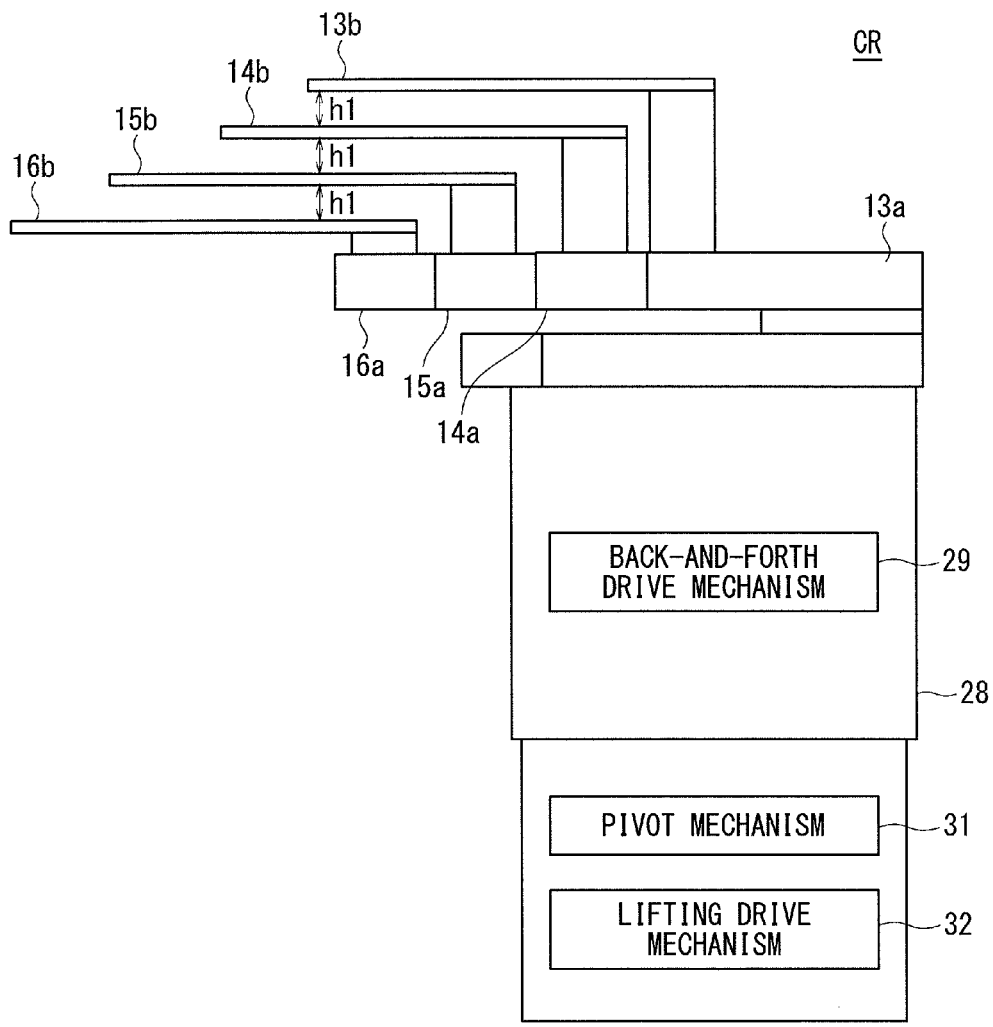
FIGS. 7A and 7B are schematic views showing the configuration of a center robot CR according to the first embodiment.
Figure 7B:
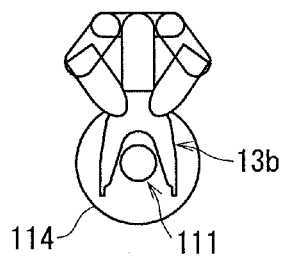

FIG. 7A is a diagrammatic side view of the center robot CR configured in such a form that the four hands 13b to 16b can be driven back and forth independently by four respective arms 13a to 16a (referred to hereinafter as a "4A4H mechanism"). FIG. 7B is a diagrammatic top view showing that the center robot CR accesses a substrate cleaning processing unit SS (SSR) in the substrate carrying-in and carrying-out operations to be described later.

As shown in FIG. 7A, this center robot CR in the case where the 4A4H mechanism is employed has a base portion 28. One end of each of the arms 13a to 16a is mounted to the base portion 28, and the hands 13b to 16b are mounted to the other ends of the arms 13a to 16a, respectively. Thus, the hands 13b to 16b are held via the arms 13a to 16a, respectively, by the base portion 28.

The hands 13b to 16b are different in vertical position (spaced the same distance h1 apart from each other in a vertical direction) to prevent interference with adjacent ones of the hands 13b to 16b. Each of the hands 13b to 16b has a distal end having a pair of finger portions. That is, the distal end of each of the hands 13b to 16b is in a forked form having the two finger portions as seen in top plan view. Each of the hands 13b to 16b is capable of supporting the lower surface of a substrate W from below to thereby horizontally hold the single substrate W. In the present embodiment, the hands 15b and 16b (two substrate holding means at a lower position) are used for the transport of unprocessed substrates prior to the cleaning process, and the hands 13b and 14b (two substrate holding means at an upper position) are used for the transport of processed substrates after the cleaning process.

The pair of finger portions of each of the hands 13b to 16b has an outside dimension smaller than the spacing between a pair of support pins 55 disposed in opposed relation in the relay part 50. This prevents each of the hands 13b to 16b from interfering with the support members 54 of the relay part 50 in the substrate carrying-in and carrying-out operations to be described later.

A member passage region is formed between the pair of finger portions of each of the hands 13b to 16b. This region is greater than the spin chuck 111 of the substrate cleaning processing unit SS (SSR). This prevents the hands 13b to 16b from interfering with the spin chuck 111 in the substrate carrying-in and carrying-out operations to be described later (with reference to FIG. 7B). The thickness of each hand 13b to 16b is smaller than the spacing between the upper surface of the spin chuck 111 and the upper surface of the spin rotation support part 114.

The arms 13a to 16a are articulated stretchable arms. The center robot CR is capable of extending and retracting the arms 13a to 16a individually by means of a back-and-forth drive mechanism 29. This allows the hands 13b to 16b which correspond to the respective arms to move horizontally back and forth separately.

The base portion 28 contains a pivot mechanism 31 for rotating the base portion 28 about a vertical axis, and a lifting drive mechanism 32 for moving the base portion 28 vertically upwardly and downwardly.

After the CR moving mechanism 17 moves the center robot CR to a position at which access can be made to each of the cleaning processing units SS1 to SS8 and SSR1 to SSR8, the pivot mechanism 31 rotates the base portion 28 to rotate the hands 13b to 16b about a predetermined vertical axis, and the lifting drive mechanism 32 moves the base portion 28 in a vertical direction. This brings any one of the hands 13b to 16b into opposed relation to a desired one of the cleaning processing units SS1 to SS8 and SSR1 to SSR8. With the hands 13b to 16b in opposed relation to the desired cleaning processing unit, the arms 13a to 16a may be extended to cause the hands 13b to 16b corresponding to the arms to access the cleaning processing unit. Similarly, the center robot CR is capable of causing any one of the hands 13b to 16b to access the relay part 50 and the inverting unit RT.

In either of the cases where the 2A4H mechanism is employed and where the 4A4H mechanism is employed as the center robot CR, a maximum of two unprocessed substrates can be transported in one batch (simultaneously) from the relay part 50 to the processing units SS1 to SS8 and SSR1 to SSR8, and a maximum of two processed substrates can be transported in one batch from the processing units SS1 to SS8 and SSR1 to SSR8 to the relay part 50. In either case, the same maximum number of substrates can be transported in one batch. Thus, the center robot CR configured as the 4A4H mechanism will be described below for convenience of description. However, when the 2A4H mechanism is used as the center robot CR, the individual arm operations for the center robot CR can be understood on the analogy of the arm operations of the indexer robot IR. The same holds true for the case where the 4A4H mechanism is employed as the indexer robot IR. As an example of the configuration of the transport means (center robot CR and indexer robot IR), the transport means having four substrate holding means (hands) will be described in this embodiment. However, the present invention is not limited to this. For example, the transport means may have not less than five substrate holding means (hands).

In the above description, the combined use of the CR moving mechanism 17 allows the hands 13b to 16b of the center robot CR to access the processing units SS and SSR, the relay part 50 and the inverting unit RT. However, only the pivot mechanism 31, the lifting drive mechanism 32 and the back-and-forth drive mechanism 29 of the center robot CR may allow the hands 13b to 16b of the center robot CR to access the processing units SS and SSR, the relay part 50 and the inverting unit RT without using the CR moving mechanism 17.

<1.3 Relay Part 50>

The relay part 50 for the transfer of substrates W between the indexer robot IR and the center robot CR is located in the boundary portion between the indexer compartment 2 and the processing compartment 3. The relay part 50 is an enclosure including substrate rest parts PASS1 to PASS4. When a substrate W is transferred between the indexer robot IR and the center robot CR, the substrate W is temporarily placed in the substrate rest parts PASS1 to PASS4.

Figure 8:
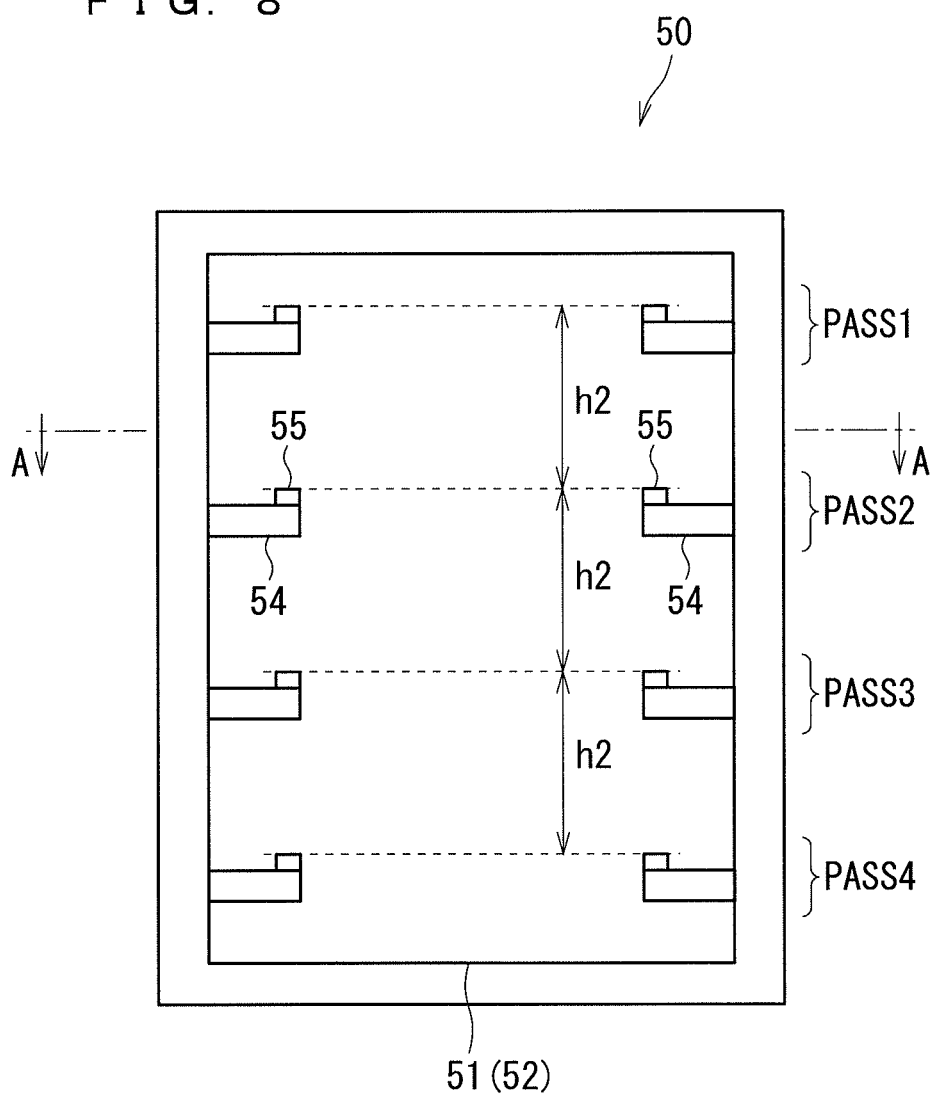
FIG. 8 is a side view of a relay part 50 according to the first embodiment.

FIG. 8 is a side view of the relay part 50 according to the first embodiment. FIG. 9 is a top view of a section taken along the line A-A of FIG. 8 as seen in the direction of an arrow.

An opening 51 for carrying-in and carrying-out of substrates W therethrough is provided in one of the side walls of the enclosure of the relay part 50 which is opposed to the indexer robot IR. A similar opening 52 is provided in another side wall opposed to the aforementioned one side wall and positioned on the center robot CR side.

The four substrate rest parts PASS1 to PASS4 for substantially horizontally holding the aforementioned substrates W are provided in an area inside the enclosure which is opposed to the openings 51 and 52. Thus, the indexer robot IR and the center robot CR are accessible to the substrate rest parts PASS1 to PASS4 through the openings 51 and 52.

In the present embodiment, the upper substrate rest parts PASS1 and PASS2 are used for the transport of processed substrates W from the processing compartment 3 to the indexer compartment 2, and the lower substrate rest parts PASS3 and PASS4 are used for the transport of unprocessed substrates W from the indexer compartment 2 to the processing compartment 3. For example, when the indexer robot IR places two unprocessed substrates W in the relay part 50, the two unprocessed substrates W are placed on the substrate rest parts PASS3 and PASS4 at a lower position among the four substrate rest parts PASS1 to PASS4 by the hands 7b and 7c (two substrate holding means at a lower position). As another example, when the center robot CR places two processed substrates W in the relay part 50, the two processed substrates W are placed on the substrate rest parts PASS1 and PASS2 at an upper position among the substrate rest parts PASS1 to PASS4 by the hands 13b and 14b (two substrate holding means at an upper position) (the details will be described later with reference to FIGS. 14A to 14C).

As shown in FIGS. 8 and 9, each of the substrate rest parts PASS1 to PASS4 includes the pair of support members 54 fixedly provided on the side walls inside the enclosure, and the four support pins 55 in total provided in pairs on opposite end portions of the upper surface of the support members 54. The support members 54 are fixedly provided on a pair of side walls different from those in which the openings 51 and 52 are formed. Each of the support pins 55 has a conical upper end (not shown). Thus, two pairs of support pins 55 detachably hold a substrate W by engagement at four peripheral locations of the substrate W.

The support pins 55 between the substrate rest parts PASS1 and PASS2, between the substrate rest parts PASS2 and PASS3 and between the substrate rest parts PASS3 and PASS4 are spaced the same distance h2 apart in a vertical direction (with reference to FIG. 8). This distance h2 is equal to the vertical distance h1 of the hands 13b to 16b of the center robot CR described above. Thus, with the center robot CR in opposed relation to the relay part 50, the hands 15b and 16b of the center robot CR may be extended simultaneously by the back-and-forth drive mechanism 29 to receive two unprocessed substrates W simultaneously from the substrate rest parts PASS3 and PASS4 of the relay part 50. Similarly, the hands 13b and 14b of the center robot CR may be extended simultaneously by the back-and-forth drive mechanism 29 to transfer two processed substrates W held by the hands 13b and 14b simultaneously to the substrate rest parts PASS1 and PASS2 of the relay part 50.

In this manner, the center robot CR (transport means) is capable of individually horizontally driving the hands 13b to 16b (four substrate holding means) vertically spaced a predetermined distance apart from each other in corresponding relation to the substrate rest parts PASS1 to PASS4 (four substrate rest parts), thereby achieving the individual transfer of substrates between the hands 13b to 16b and the four substrate rest parts PASS1 to PASS4 corresponding thereto.

<1.4 Controller 60>

Figure 10:
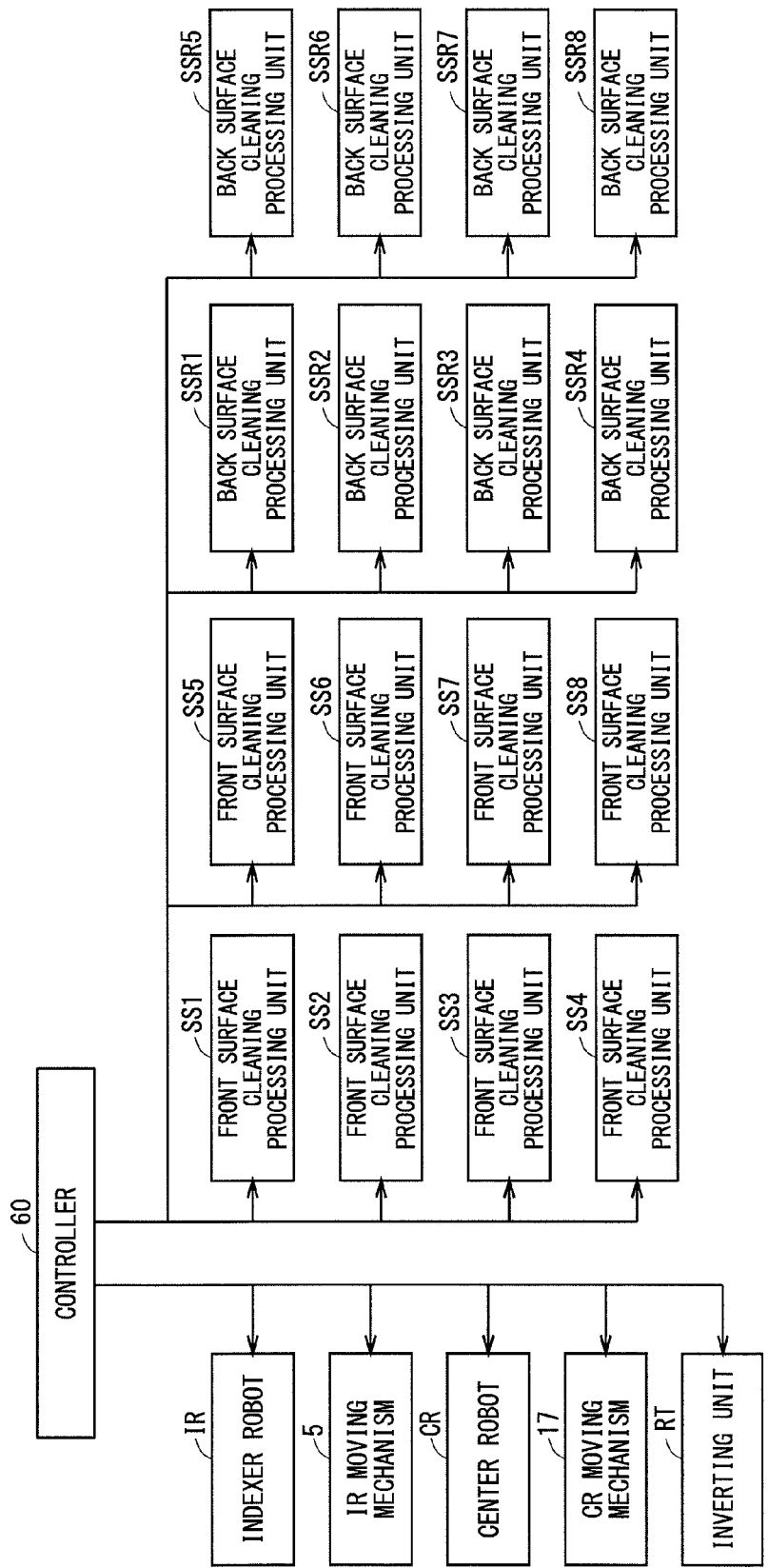
FIG. 10 is a system block diagram of the substrate processing apparatus 1 according to the first embodiment.

FIG. 10 is a block diagram for illustrating an electrical configuration of the substrate processing apparatus 1. FIG. 11 is a block diagram for illustrating an internal configuration of the controller 60.

As shown in FIG. 11, the controller 60 is formed by a typical computer in which, for example, a CPU 61, a ROM 62, a RAM 63, a storage device 64 and the like are interconnected through a bus line 65. The ROM 62 stores basic programs and the like therein, and the RAM 63 serves as a work area used when the CPU 61 performs a predetermined process. The storage device 64 is formed by a flash memory or a nonvolatile storage device such as a hard disk device. A processing program P0 and a schedule making program P1 are stored in the storage device 64.

The CPU 61 performs a computation process to be described later in accordance with a procedure descried in the schedule making program P1, whereby schedule data (designated by "SD" hereinafter) about substrates W to be processed is produced in the form of a table of chronologically arranged data and the like. The produced schedule data SD is stored in the storage device 64.

Also, the CPU 61 performs a computation process to be described later in accordance with a procedure descried in the processing program P0, whereby various functions of the substrate processing apparatus 1 are implemented. Thus, a predetermined cleaning process is performed on a target substrate W in accordance with the aforementioned schedule data SD.

An input part 66, a display part 67 and a communication part 68 are connected to the bus line 65 in the controller 60. The input part 66 includes various switches, a touch panel and the like, and receives various input setting instructions such as a processing recipe and the like from an operator. The display part 67 includes a liquid crystal display device, a lamp and the like, and displays various pieces of information under the control of the CPU 61. The communication part 68 has a data communication function through a LAN and the like.

The controller 60 is connected to the indexer robot IR, the center robot CR, the IR moving mechanism 5, the CR moving mechanism 17, the front surface cleaning processing part 11, the back surface cleaning processing part 12 and the inverting unit RT as components to be controlled.

The detailed description on the schedule making program P1 will be given after the description on the operation of the substrate processing apparatus 1.

<2. Operation of Substrate Processing Apparatus 1>

The configuration of the devices in the substrate processing apparatus 1 and the operation (cleaning process, inverting process and the like) in the devices are described hereinabove.

The operation of transferring substrates W between the devices (substrate rest parts PASS, inverting unit RT, cleaning processing units SS and the like) and the indexer and center robots IR and CR in the substrate processing apparatus 1, and the substrate processing operation throughout the substrate processing apparatus 1 will be described. These operations are performed based on the schedule data SD made by the schedule making program P1. However, the individual operations will be described first, and the principle of the creation of the schedule data SD and the comprehensive timing control will be described in detail later.

<2.1 Operation of Transferring Substrates W>

As mentioned above, each of the indexer robot IR and the center robot CR includes the moving mechanism, the pivot mechanism, the lifting mechanism, and the back-and-forth mechanism, so that the hands of each robot are allowed to access the components inside the substrate processing apparatus 1.

The operation of transferring the substrates at this time will be described by taking an instance in which the center robot CR accesses a front surface cleaning processing unit SS and an instance in which the center robot CR accesses the relay part 50 as examples.

FIGS. 12A to 12D and FIGS. 13A to 13D are schematic views showing an example of the substrate transfer operation between the center robot CR and the front surface cleaning processing unit SS.

FIGS. 14A to 14C are schematic views showing the substrate transfer operation between the center robot CR and the substrate rest parts PASS (relay part 50). For ease of understanding, the substrate transfer operation is simply represented using only the substrates W, the support members 54 of the substrate rest parts PASS1 to PASS4 and the hands 13b to 16b.

[Access of Center Robot CR and Processing Unit]

As shown in FIG. 12A, a processed substrate W1 is placed on the spin chuck 111 of the processing unit SS. Also, the slit 116 of the processing unit SS slides, so that the gate 117 is open.

When the center robot CR carries the processed substrate W1 out of such a front surface cleaning processing unit SS, the controller 60 initially controls the pivot mechanism 31 to bring the hand 13b into opposed relation to the front surface cleaning processing unit SS. At the same time, the controller 60 controls the lifting drive mechanism 32 to bring the hand 13b to a vertical position at which the upper surface of the hand 13b is below the upper surface of the spin chuck 111 and the lower surface of the hand 13b is above the upper surface of the rotation support part 114 (with reference to FIG. 12A).

Next, the controller 60 controls the back-and-forth drive mechanism 29 to extend the arm 13a. This moves the hand 13b horizontally into the front surface cleaning processing unit SS, so that the member passage region at the distal end of the hand 13b passes through the spin chuck 111. As a result, the hand 13b is located under the substrate W1 held by the spin chuck 111, as shown in FIG. 12B. Only a hand (in this case, the hand 13b) required for the substrate carrying-in and carrying-out operations can be moved forward into the unit case 115 of the processing unit SS (SSR) because the hands 13b to 16b according to the present embodiment are individually extendable and retractable. This minimizes the amounts of particles which might be brought into the unit case 115 by the hands 13b to 16b. The space between the spin chuck 111 and the rotation support part 114 may also be narrowed down to a vertical dimension which allows the entry of only one of the hands 13b to 16b.

Thereafter, the controller 60 controls the lifting drive mechanism 32 to move the hand 13b upwardly. This causes the substrate W1 placed on the spin chuck 111 to be transferred to over the hand 13b, as shown in FIG. 12C. Subsequently, the controller 60 controls the back-and-forth drive mechanism 29 to contract the arm 13a. This causes the hand 13b to retract from the front surface cleaning processing unit SS (one-substrate carrying-out operation), as shown in FIG. 12D.

The instance in which the single substrate W is carried out from any front surface cleaning processing unit SS by means of the hand 13b is described in the aforementioned series of operations. However, even when other substrate holding hands 14b to 16b are used, a similar carrying-out operation may be performed by changing the height of the hand by the lifting drive mechanism 32 so that the same conditions as the aforementioned one-substrate carrying-out are set.

Next, the substrate carrying-in operation will be described. The controller 60 controls the lifting drive mechanism 32 to move the arm 15a upwardly to such a level that an unprocessed substrate W2 held on the upper surface of the hand 15b is above the spin chuck 111 (FIG. 13A).

Next, the controller 60 controls the back-and-forth drive mechanism 29 to extend the arm 15*a*. This moves the hand 15*b* horizontally into the front surface cleaning processing unit SS, so that the substrate W2 held on the hand 15*b* is located over the spin chuck 111, as shown in FIG. 13B.

Thereafter, the controller 60 controls the lifting drive mechanism 32 to move the hand 15*b* downwardly. This causes the substrate W2 held by the hand 15*b* to be transferred to the spin chuck 111, as shown in FIG. 13C. Then, the controller 60 controls the back-and-forth drive mechanism 29 to contract the arm 15*a*. This causes the hand 15*b* to retract from the front surface cleaning processing unit SS (one-substrate carrying-in operation), as shown in FIG. 13D.

The instance in which the single substrate W is carried into the front surface cleaning processing unit SS by means of the hand 15*b* is described in the aforementioned series of operations. This one-substrate carrying-in operation is similarly performed when a single substrate W is carried into a back surface cleaning processing unit SSR.

During the downward movement of the hand 15*b*, there are times when the hand 15*b* overlaps the spin chuck 111 as seen in side view (as seen in a horizontal direction), as shown in FIGS. 13B and 13C. However, the spin chuck 111, which enters the interior of the substrate holding hand 15*b* at this time, does not interfere with the hand 15*b* because the hand 15*b* is in the forked form having the two finger portions as mentioned above.

Similarly, during the substrate transfer operation between the support pins and the hands in the substrate rest parts PASS and the inverting unit RT, there are times when the support pins and the hands overlap each other as seen in side view (as seen in a horizontal direction). However, the support pins and the hands are designed not to interfere with each other.

[Access of Center Robot CR to Relay Part 50]

FIGS. 14A to 14C are schematic views for illustrating an example of the operation performed when the center robot CR carries two substrates W simultaneously into the substrate rest parts PASS1 and PASS2.

When the center robot CR carries two substrates W simultaneously into the substrate rest parts PASS1 and PASS2, one substrate W is held by each of the hands 13*b* and 14*b*, for example. In this state, the two substrates W are simultaneously carried into the substrate rest parts PASS1 and PASS2 (two-substrate carrying-in operation).

Specifically, the controller 60 controls the pivot mechanism 9 and the lifting drive mechanism 10 to bring hands 13*b* and 14*b* into opposed relation to the substrate rest parts PASS1 and PASS2. At this time, the two substrates W held by the hands 13*b* and 14*b* have already been moved up or down to a level lying above the substrate rest parts PASS1 and PASS2, respectively, as shown in FIG. 14A.

As mentioned above, the vertical spacing between the upper and lower substrate support positions in the substrate rest parts PASS1 to PASS4 is set to be equal to the vertical spacing between the two substrates W held by the hands 13*b* and 14*b* of the center robot CR. Thus, when the lifting drive mechanism 10 locates the substrate W held by the hand 13*b* above the substrate rest part PASS1, the other hand 14*b* is located above the substrate rest part PASS2.

Next, the controller 60 controls the back-and-forth drive mechanism 8 to extend the arm 13*a* and the arm 14*a* simultaneously. This causes the hands 13*b* and 14*b* to enter the interiors of the substrate rest parts PASS1 and PASS2, so that the two substrates W held by the hands 13*b* and 14*b* are located over the substrate rest parts PASS1 and PASS2, respectively, as shown in FIG. 14B.

Thereafter, the controller 60 controls the lifting drive mechanism 10 to move the hands 13*b* and 14*b* downwardly until the two substrates W are supported by the substrate rest parts PASS1 and PASS2. This causes the substrates W to be simultaneously placed on the support pins 55 not shown of the substrate rest parts PASS1 and PASS2 as shown in FIG. 14C, so that the two substrates W are simultaneously transferred from the indexer robot IR to the substrate rest parts PASS1 and PASS2. Then, the controller 60 controls the back-and-forth drive mechanism 29 to contract the arm 13*a* and the arm 14*a* simultaneously. This causes the hands 13*b* and 14*b* to retract from the relay part 50 (two-substrate carrying-in operation).

Although description with reference to figures is omitted, the aforementioned series of operations are reversed when the center robot CR carries two unprocessed substrates W simultaneously out of the substrate rest parts PASS3 and PASS4. Specifically, the hands 15*b* and 16*b* are extended to under the substrate rest parts PASS3 and PASS4. Next, the hands 15*b* and 16*b* are moved upwardly. Subsequently, the arm 15*a* and the arm 16*a* are simultaneously contracted, so that the two substrates W are simultaneously carried out of the relay part 50 by means of the hands 15*b* and 16*b* (two-substrate carrying-out operation).

The limitations imposed on the use of the four substrate rest parts PASS1 to PASS4 such that the upper substrate rest parts PASS1 and PASS2 are used for the placement of the processed substrates W after the cleaning thereon and such that the lower substrate rest parts PASS3 and PASS4 are used for the placement of the unprocessed substrates W prior to the cleaning thereon in this manner prevent the transfer of contamination (particles and the like) from the unprocessed substrates W to the processed substrates W.

Also in the present embodiment, the limitations imposed on the use of the four substrate rest parts PASS1 to PASS4 are in common with the limitations imposed on the use of the hands (substrate holding means of the transport means) of the aforementioned indexer robot IR and the center robot CR in that two at an upper position are used for the processed substrates and two at a lower position are used for the unprocessed substrates. This prevents the transfer of contamination (particles and the like) more effectively, and also achieves the transfer of two substrates W for each access of the transport means to the substrate rest parts PASS1 to PASS4 (FIGS. 14A to 14C).

Although the two-substrate carrying-in operation and the two-substrate carrying-out operation of substrates W are described by taking the center robot CR and the substrate rest parts PASS as examples, the series of operations are similarly performed for the transfer of substrates between the center robot CR (or indexer robot IR) and other units. Specifically, the aforementioned two-substrate carrying-in operation and two-substrate carrying-out operation may be performed for the transfer of substrates between the center robot CR and the inverting unit RT, for the transfer of substrates between the indexer robot IR and the substrate rest parts PASS and for the transfer of substrates between the indexer robot IR and the carriers C.

The different hands of each of the robots (CR or IR) in the present embodiment are used depending on whether the substrates W held by the hands are the unprocessed substrates prior to the cleaning process or the processed substrates after the cleaning process. Thus, the carrying-in and carrying-out of the processed substrate W by means of the hands 7*b* and 7*c* and the hands 15*b* and 16*b* which are the hands for unprocessed substrates are possible on the principle of the aforementioned carrying-in and carrying-out operations, but are not performed in the present embodiment. The same applies to the hands 6b and 6c and the hands 13b and 14b which are the hands for processed substrates.

<2.2 Instance in Which Only Front Surface of Substrate W is Cleaned>

As mentioned above, the substrate processing apparatus 1 includes the front surface cleaning processing part 11 for performing the scrub cleaning process on the front surfaces of the substrates W, and the back surface cleaning processing part 12 for performing the scrub cleaning process on the back surfaces of the substrates W. This achieves various types of cleaning processes (e.g., a cleaning process for cleaning only the front surfaces of the substrates W, a cleaning process for cleaning only the back surfaces of the substrates W, a cleaning process for cleaning both the front and back surfaces of the substrates W, and the like) depending on the purpose. Which type of cleaning process is to be performed is set by a recipe including descriptions about transport procedures for substrates W and about processing conditions. The recipe is set for each group of substrates W (e.g., each substrate group on a lot-by-lot basis or each group of substrates held by a single carrier C).

The operation of the substrate processing apparatus 1 will be described below by taking an instance in which the cleaning process for cleaning the front surface only is performed on two substrates W1 and W2 as an example.

In this instance, after a carrier C with a plurality of unprocessed substrates W stored therein is carried from the outside of the substrate processing apparatus 1 into one of the carrier holding parts 4 of the indexer compartment 2 by an OHT (Overhead Hoist Transfer), an AGV (Automated Guided Vehicle) and the like, the indexer robot IR of the indexer compartment 2 takes two unprocessed substrates W (W1 and W2) out of the carrier C by means of the hands 7b and 7c.

While holding the two unprocessed substrates W (W1 and W2) taken out, the indexer robot IR is moved by the IR moving mechanism 5 to a position accessible to the relay part 50.

After the movement, the indexer robot IR carries the two substrates (W1 and W2) held by the hands 7b and 7c into the substrate rest parts PASS3 and PASS4 in the relay part 50.

After the two substrates W (W1 and W2) are supported by the substrate rest parts PASS3 and PASS4, the center robot CR is moved by the CR moving mechanism 17 to a position accessible to the relay part 50.

Thereafter, the center robot CR carries the two substrates W (W1 and W2) placed on the substrate rest parts PASS3 and PASS4 in the relay part 50 outwardly by means of the hands 15b and 16b.

After receiving the two substrates W (W1 and W2), the center robot CR is moved (transported) by the CR moving mechanism 17 to a position accessible to the front surface cleaning processing part 11 while holding the two substrates W.

After the movement, the center robot CR carries the two substrates W (W1 and W2) held by the hands 15b and 16b into the front surface cleaning processing units SS. The transfer of two substrates between the center robot CR and the cleaning processing units SS and SSR cannot be performed at the same time. Thus, the first substrate W1 is initially carried into the front surface cleaning processing unit SS1. After the completion of the carrying-in process of the substrate W1, the substrate W2 is carried into the front surface cleaning processing unit SS2. Although the front surface cleaning processing units SS1 and SS2 are selected for the purpose of facilitating the description, any two units into which the substrates are to be carried may be selected from among the front surface cleaning processing units SS1 to SS8.

The front surface cleaning process is performed on the substrates W1 and W2 in the front surface cleaning processing unit SS1 and SS2, respectively. In each front surface cleaning processing unit SS, a processing liquid is applied from the nozzle 113 onto the upper surface of the substrate while the spin chuck 111 rotates the substrate and the cleaning brush 112 scans the upper surface of the substrate, so that the scrub cleaning is performed on the entire front surface of the substrate.

As a result, the front surface cleaning process of the substrate W1 carried earlier into the front surface cleaning processing unit is completed first. After a lapse of a fixed time period, the front surface cleaning process of the substrate W2 is completed.

In the same recipe, the same cleaning process is performed in all of the front surface cleaning processing units SS1 to SS8, so that there is no difference in the time required for the cleaning process. Thus, the difference in processing completion time between the processing units SS1 and SS2 is equal to the difference between the time at which the substrate W1 is carried into the front surface cleaning processing unit SS1 and the time at which the substrate W2 is carried into the front surface cleaning processing unit SS2.

Because of such a difference in cleaning process completion time, two types of transport procedures to be described below are conceivable as the procedure (transport procedure) of the transport process of the substrates W1 and W2 by means of the center robot CR.

One of the two types of transport procedures is a sequential transport procedure in which the substrate W1 (referred to hereinafter as a "preceding substrate W1") the cleaning process of which is completed earlier is transported to the relay part 50 by the center robot CR, and the substrate W2 (referred to hereinafter as a "succeeding substrate W2") the cleaning process of which is completed after the preceding substrate W1 is transported to the relay part 50 after the completion of the transport process of the preceding substrate W1.

The other transport procedure is a batch transport procedure in which the transport process of the substrate W1 is not performed after the completion of the cleaning process of the preceding substrate W1, but the preceding substrate W1 and the succeeding substrate W2 are transported together to the relay part 50 by the center robot CR after waiting until the completion of the cleaning process of the succeeding substrate W2.

Which one of the two types of transport procedures is to be employed is determined by the plan logic of the schedule making program P1 to be described later.

The description on the operation of the substrate processing apparatus 1 in a case where the batch transport procedure is employed will be continued. After the substrates W1 and W2 are placed on the substrate rest parts PASS1 and PASS2 of the relay part 50 by the center robot CR, the indexer robot IR of the indexer compartment 2 is moved by the IR moving mechanism 5 to a position accessible to the relay part 50.

After the movement, the indexer robot IR carries the substrates W1 and W2 placed on the substrate rest parts PASS1 and PASS2 in the relay part 50 outwardly by means of the hands 6b and 6c. After taking the processed substrates W1 and W2 out of the relay part 50 (the substrate rest parts PASS1 and PASS2), the indexer robot IR is moved by the IR moving mechanism 5 to a position accessible to a carrier C, and stores the substrates W1 and W2 held by the hands 6b and 6c into the carrier C.

Although the operation of the substrate processing apparatus 1 in the front surface process is described hereinabove, the aforementioned operation is merely an example of the operations of the substrate processing apparatus 1 in a large number of front surface processes, and the present invention is not limited to this. In the actual substrate processing, substrates to be processed are not limited to the two substrates W1 and W2. When a large number of substrates are to be processed in the substrate transfer operations in the indexer robot IR and the center robot CR, there are cases where the one-substrate replacement operation and the two-substrate replacement operation are performed between the center robot CR and the processing units. Also, there are cases where the sequential transport procedure is employed as the transport procedure for substrates W.

<2.3 Instance in Which Both Surfaces of Substrate W are Cleaned>

Next, an instance in which both surfaces of a substrate W are processed will be described briefly.

First, the indexer robot IR carries unprocessed substrates W1 and W2 out of a carrier C, and transports the unprocessed substrates W1 and W2 to the relay part 50.

After the two substrates W1 and W2 are carried into the substrate rest parts PASS3 and PASS4 of the relay part 50 by the indexer robot IR and are supported by the substrate rest parts PASS3 and PASS4 of the relay part 50, the center robot CR carries the two substrates W1 and W2 out of the relay part 50.

The center robot CR transports the substrates W1 and W2 to the inverting unit RT while holding the substrates W1 and W2, and carries the two substrates W1 and W2 into the inverting unit RT. After the substrates W1 and W2 are carried into the inverting unit RT, the rotary actuator 37 rotates the support plate 35 about the horizontal rotation axis to invert or flip the held substrates W1 and W2 upside down.

After the inverting process of the substrates W1 and W2, the center robot CR carries the substrates W1 and W2 the upper surfaces of which are the back surfaces thereof out of the inverting unit RT, and transports the two substrates W1 and W2 to the back surface cleaning processing part 12 while holding the two substrates W1 and W2.

After the center robot CR carries the substrates W1 and W2 respectively into the back surface cleaning processing units SSR1 and SSR2, the back surface cleaning process is performed. Two substrates W cannot be simultaneously transferred between the center robot CR and the back surface cleaning processing units SSR as mentioned above. Thus, the substrates W are carried one by one into the back surface cleaning processing units SSR. Although the back surface cleaning processing units SSR1 and SSR2 are selected for the purpose of facilitating the description, any two units into which the substrates are to be carried may be selected from among the back surface cleaning processing units SSR1 to SSR8.

In each back surface cleaning processing unit SSR, a processing liquid is applied from the nozzle onto the upper surface of the substrate while the spin chuck rotates the substrate and the cleaning brush scans the upper surface of the substrate, so that the scrub cleaning is performed on the entire upper surface of the substrate. At this time, the back surface is cleaned because the upper surfaces of the substrates W1 and W2 are the back surfaces thereof as a result of the aforementioned inverting process.

In the back surface cleaning process, the back surface cleaning process of the substrate W1 (preceding substrate) carried earlier into the back surface cleaning processing unit is completed first in a manner similar to that of the front surface cleaning process. After a lapse of a fixed time period, the back surface cleaning process of the substrate W2 (succeeding substrate) is completed.

When there is a difference in process completion time in the present embodiment as mentioned above, a schedule making device 100 determines which one of the sequential transport procedure and the batch transport procedure is to be employed. The description on the operation of the substrate processing apparatus 1 in a case where the batch transport procedure is employed by the schedule making device 100 will be continued.

After the completion of the back surface cleaning process of the succeeding substrate W2, the center robot CR carries the substrate W1 out of the back surface cleaning processing units SSR and carries the substrate W2 out of the back surface cleaning processing unit SSR2. Then, the center robot CR transports the substrates W1 and W2 together to the inverting unit RT again.

After the two substrates W1 and W2 are carried into the inverting unit RT by the center robot CR, the inverting process is performed again, so that the upper surfaces of the substrates W1 and W2 are the front surfaces thereof The procedure of processes after the inverting process of both the substrates W1 and W2 is identical with that after the front surface cleaning process in <2.2 Instance in Which Only Front Surface of Substrate W Is Cleaned> described above. Specifically, after subjected to the front surface cleaning process in the front surface cleaning processing part 11, the substrates W1 and W2 are transported by the center robot CR and the indexer robot IR, and are stored in a carrier C in the indexer compartment 2.

<3. Schedule Making Program P1>

The schedule making program P1 will be described hereinafter. As shown in FIG. 11, the schedule making program P1 is a program stored in the storage device 64 in the controller 60. The schedule making program P1 is a program executed by the CPU 61 which performs various computation processes to thereby make the schedule data SD about substrates to be processed. The schedule data SD thus made is stored in the storage device 64.

Also, the CPU 61 executes the computation processes in accordance with a procedure descried in the processing program P0, whereby various functions of the substrate processing apparatus 1 are implemented. As a result, a predetermined cleaning process is performed on a target substrate W in accordance with the aforementioned schedule data SD.

<3.1 Plan Logic in Schedule Making>

FIG. 15 is a flow diagram showing plan logic of the schedule making program P1 according to the first embodiment of the present invention. The term "time segment" or simply "segment" as used in the present embodiment refers to the duration of a unit step in the recipe, the duration being such that a stop is not made generally after a start and such that no waiting time occurs. This time segment is the smallest unit in the making of a schedule according to the present embodiment.

The specific description on the procedure of FIG. 15 will be given later in detail. Before this, the terms will be organized.

For example, attention is given on the transfer of a substrate W from a processing unit (any one of the front surface cleaning processing units SS1 to SS8 and back surface cleaning processing units SSR1 to SSR8; the same shall apply hereinafter) to the relay part 50. Then, this process is comprised of the following two stages:

First stage (take-out operation): an operation in which the center robot CR extends a hand to take out a substrate from a substrate set position in the processing unit.

Second stage (transport operation): an operation in which the center robot CR which holds the substrate taken out of the processing unit moves to the relay part 50 to transfer the substrate to a substrate set position in the relay part 50.

That is, the "transfer" is a combination of the "take-out" and the "transport".

After moved to the relay part 50, the center robot CR normally receives either a new unprocessed substrate or no new substrate from the relay part 50, and then returns to the processing compartment 3. As viewed from the processing compartment 3, it is customary that the center robot CR performs an "outward travel" for moving to the relay part 50 while holding one or more substrates, a "transfer" of the one or more substrates to the relay part 50, and a "return travel" for returning to the processing compartment 3. Thus, the "transport" in the second stage shall be a combination of the "outward travel", the "transfer" and the "return travel" for the purpose of convenience hereinafter.

<3.2 Example 1 of Schedule Making>

FIGS. 16A to 16D, 17A to 17D, 18A to 18D are diagrams showing examples of the schedules of the process and transfer of two substrates W1 and W2 whose predetermined process (in this embodiment, cleaning process) is completed at different times. In FIGS. 16A to 16D, 17A to 17D, 18A to 18D, time t progresses from left to right.

FIG. 16A shows a basic schedule for the two substrates W1 and W2. This "basic schedule" or "basic procedure" refers to a sequence made by contiguously arranging time segments corresponding to a series of steps performed on individual substrates independently of other substrate schedules. In the example shown, the "basic schedule" or "basic procedure" is a schedule which uses process start times t11 and t21 of the respective substrates W1 and W2 as starting points and which is obtained by contiguously arranging the following segments:

1) "Cleaning processing segments" B1 and B4 corresponding to the process of cleaning the substrates W1 and W2, respectively, over a predetermined duration Ta;

2) "Take-out segments" B2 and B5 having a duration Tb required for the transport mechanism (center robot CR) to take out one substrate from a processing unit; and 3) "(To-and-fro) transport segments" B3 and B6 representing to-and-fro transport time Tc required for the transport mechanism (center robot CR) to transport a substrate taken out of the processing unit to the relay part 50 to transfer the substrate to the relay part 50 and to return to a reference position of the processing compartment 3 again.

The start time and the finish time of each segment in the basic schedule are intended and undetermined, and are referred to hereinafter as an "intended start time" and an "intended finish time" as distinguished from a "(determined) start time" and a "(determined) finish time" used after the determination thereof.

While mutually adjusted on the basis of this "basic schedule" so as to prevent interference of the transport procedures of substrates with each other, the schedules for all substrates are rearranged along the time axis for a series of substrates, so that a comprehensive schedule is made up. The arrangement time periods of the time segments for preceding and succeeding substrates are determined in consideration for predetermined arrangement conditions thereof FIG. 16B shows a schedule as a result completed using the plan logic of the first embodiment of the present invention shown in FIG. 15 on the basis of the basic schedule of FIG. 16A.

FIG. 16C shows a schedule using the sequential transport procedure as one of the schedules assumed in the course of the determination of the completed schedule of FIG. 16B.

FIG. 16D shows a schedule using the batch transport procedure as another one of the schedules assumed in the course of the determination of the completed schedule of FIG. 16B.

The mutual relationships between the subsequent four portions of FIGS. 17A to 17D and the four portions of FIGS. 18A to 18D are similar to those in FIG. 16 as described above.

[Schedule Making in First Embodiment of the Present Invention]

FIG. 16A shows an instance in which there is a time difference between the intended start times t11 and t21 of the cleaning processing segments of the substrates W1 and W2 and in which the time segments B4, B5 and B6 corresponding to the steps for the substrate W2 lag this time difference $\Delta T=(t21-t11)$ behind the time segments B1, B2 and B3 for the substrate W1. Such a time difference $\Delta T$ occurs because of various constraints in the substrate processing apparatus 1. For example, the time difference $\Delta T$ results from the fact that complete parallel processing (complete concurrent processing) cannot be performed because of limitations on the number of substrates that one center robot CR can transport simultaneously and on the number of cleaning processing units that can be installed. The time difference $\Delta T$ results also from a difference in details of executed substrate processing between the processing units.

In FIGS. 16A to 16D and the subsequent figures, it is assumed that the substrate W1 is cleaned by the cleaning processing unit SS1 and the substrate W2 is cleaned by the different cleaning processing unit SS2 (another cleaning processing unit vertically below and adjacent to the cleaning processing unit SS1). Of the two substrates W1 and W2, the earlier in completion of the cleaning process is the substrate W1. The substrate W1 is the preceding substrate, and the different substrate W2 is the succeeding substrate W2.

The details of the segments B1 to B6 in FIG. 16A will be considered as a preparation for description about the process for obtaining the finished schedules based on the basic schedule.

The segments B1 and B4 are segments (cleaning processing segments) including the cleaning process in the cleaning processing units SS1 and SS2, respectively. Thus, the segments B1 and B4 can be coexistent in time with each other. For this reason, the execution of the segments B4 to B6 of the succeeding substrate W2 can be planned during a time period over which the execution of the cleaning processing segment B1 of the preceding substrate W1 is planned. Similarly, the execution of the segments B1 to B3 of the preceding substrate W1 can be planned during a time period over which the execution of the cleaning processing segment B4 of the succeeding substrate W2 is planned.

The segments B2 and B5 are segments (take-out segments) including the step of taking out the substrates W1 and W2 from the cleaning processing units SS1 and SS2, respectively, by the center robot CR. The center robot CR having the structure of FIG. 4 is not capable of simultaneously taking out a plurality of substrates from a plurality of processing units. Also, the center robot CR is not capable of traveling during the time interval of the take-out operation of a substrate. For these reasons, the execution of the segments B5 and B6 of the succeeding substrate W2 including the operation of the center robot CR is not planned during a time period over which the execution of the take-out segment B2 of the preceding substrate W1 is planned. Similarly, the execution of the segments B2 and B3 of the preceding substrate W1 requiring the operation of the center robot CR is not planned during a time period over which the execution of the take-out segment B5 of the succeeding substrate W2 is planned.

The segments B3 and B6 are segments (transport segments) including the step of transporting the substrates W1 and W2 to the relay part 50 (PASS1 and PASS2) by means of the center robot CR and the step of transferring the substrates W1 and W2 to the relay part 50 by means of the center robot CR. Thus, the segment B5 of the succeeding substrate W2 including the take-out process from the cleaning processing unit SS is not planned during a time period over which the transport segment B3 of the preceding substrate W1 is planned. Like the transport segment B3 of the preceding substrate W1, the segment B6 of the succeeding substrate W2 including the transport step to the relay part 50, on the other hand, can be planed during the same time period as the transport segment B3 of the preceding substrate W1. (The center robot CR is capable of simultaneously transporting the two processed substrates W1 and W2 toward the relay part 50. The center robot CR is also capable of simultaneously transferring these substrates W1 and W2 to the substrate rest parts PASS1 and PASS2 of the relay part 50, and is capable of simultaneously receiving unprocessed substrates W when the unprocessed substrates W are placed on the substrate rest parts PASS3 and PASS4.) The same holds true for the transport segment B6 of the succeeding substrate W2. The take-out segment B2 including the step of taking out a substrate from the cleaning processing unit SS is not planned during a time period over which the transport segment B6 is planned. Like the transport segment B6, the transport segment B3 including the transport step to the relay part 50, on the other hand, can be planed during the same time period as the transport segment B6 of the succeeding substrate W2. (The substrates W1 and W2 can be simultaneously transported. Also, the transfer of two substrates and the receipt of two substrates can be simultaneously performed between the center robot CR and the relay part 50.)

As stated above, the transport segments B3 and B6 as used herein shall be handled as referring to a time period over which not only the substrates are transported from the processing compartment 3 (corresponding to a "processing part" according to the present invention) to the relay part 50 but also the center robot CR transfers the substrates to the relay part 50 and receives unprocessed substrates, as required, to return to the processing compartment 3 again.

FIG. 17A and FIG. 18A are different in time relation between the steps for the respective substrates W1 and W2 from FIG. 16A, but are similar in the meaning of the segments B1 to B6 to FIG. 16A.

Description will be given on a process in which the controller 60 completes schedules by using the plan logic shown in FIG. 15 on the assumption that the three types of basic schedules as shown in FIG. 16A, FIG. 17A and FIG. 18A are provided for the two substrates W1 and W2.

For making of schedules for the preceding substrate W1 and the succeeding substrate W2 in accordance with the characteristics of the present invention, a comparison is made between the following two points of time:

1) a time At at which the substrate transport of both of the two substrates W1 and W2 is completed in a "sequential carrying-out procedure" (FIG. 16C, FIG. 17C and FIG. 18C) in which the carrying-out processes of the preceding substrate W1 and the succeeding substrate W2 are performed in sequential time order; and 2) a time Bt (FIG. 16D, FIG. 17D and FIG. 18D) at which a "batch carrying-out procedure" is completed in which the preceding substrate W1 is placed in a waiting state in the processing compartment 3 until the cleaning process of the succeeding substrate W2 is completed, and in which the carrying-out processes of the preceding substrate W1 and the succeeding substrate W2 are performed in one batch after the completion of the cleaning process of the succeeding substrate W2.

When it is judged that $$Bt<At \tag{Exp. 1}$$

or that the batch transport procedure is completed earlier than the sequential transport procedure, a schedule which preferentially employs the batch carrying-out procedure is made, so that the carrying-out efficiency of the two substrates W1 and W2 is improved.

There are conceivable instances in which the to-and-fro transport time Tc of the transport means between the processing compartment 3 and the relay part 50 is substantially the same independently of the number of substrates transported simultaneously by the transport means (center robot CR) and in which the to-and-fro transport time Tc of the transport means between the processing compartment 3 and the relay part 50 is substantially the same when the transport means (center robot CR) accesses any processing unit. When the condition ("constant to-and-fro transport time condition") that the to-and-fro transport time Tc of the transport means between the processing compartment 3 and the relay part 50 is substantially the same is satisfied, a judgment may be made as to which one of the batch carrying-out procedure and the sequential carrying-out procedure is more efficient by making a comparison in the basic schedules between the following times:

1) a finish time Ct of the transport segment B3 for the preceding substrate W1; and 2) a finish time Dt of the cleaning processing segment B4 for the succeeding substrate W2.

The reason is as follows. When $$Dt<Ct \tag{Exp. 2}$$

it is found from FIG. 16D that the relation between the time Bt and the time At is expressed by $$Bt=t12+2\times Tb+Tc \tag{Exp. 3}$$

by moving the take-out segment B5 in the batch transport procedure immediately after the take-out segment B2. However, the relation between the time At and the time Bt is expressed by $$At=t12+2\times(Tb+Tc) \tag{Exp. 4}$$

Subtracting Expression 3 from Expression 4 provides $$At-Bt=Tc \tag{Exp. 5}$$

Therefore, $$At=Bt+Tc>Bt \tag{Exp. 6}$$

In other words, Expression 1 is satisfied.

Therefore, 1) the finish time Ct of the carrying-out segment of the preceding substrate W1 functions as a substitute index for the time At at which the transfer of all of the two substrates W1 and W2 is completed in the sequential carrying-out procedure, and 2) the finish time Dt of the cleaning processing segment of the succeeding substrate W2 functions as a substitute index for the time Bt at which the transfer of all of the two substrates W1 and W2 is completed in the batch carrying-out procedure.

The instance in which the condition in Expression 2 is satisfied, i.e. in which the time Dt is earlier than the time Ct, means that the time Bt (finish time of the schedule using the batch carrying-out procedure) comes earlier than the time At (finish time of the schedule using the sequential carrying-out procedure), in other words, that the schedule using the batch carrying-out procedure is finished earlier than the schedule using the sequential carrying-out procedure.

According to the present invention, it is a basic principle that the time At at which the schedule using the sequential carrying-out procedure is completed and the time Bt at which the schedule using the batch carrying-out procedure is completed are specified (first and second specifying steps), and a comparison is made between the time At and the time Bt for earlier one (comparing step) to employ the earlier procedure. However, the basic principle does not essentially necessitate the process of directly calculating the finish times At and Bt of the entire schedule using the sequential carrying-out procedure and the batch carrying-out procedure to make a comparison therebetween. In general, "first and second judging time values" corresponding to a pair of these time values (At and Bt) may be specified (first specifying step and second specifying step), and a comparison and judgment may be made between these two types of transport procedures (comparing step). A preferable example of the "first and second judging time values" is a pair of the aforementioned time values (Ct and Dt).

Specifically, a time value representing the time Ct which is later than the time at which the process of the preceding substrate W1 in the processing compartment 3 is completed by an amount of time including the time required for the outward and return movement of the center robot CR to and from the relay part 50 may be employed as the "first judging time value", and the time value Dt representing the time at which the process of the succeeding substrate W2 in the processing compartment 3 is completed may be employed as the "second judging time value". Expression 2 is referred to as a "batch transport discriminant" hereinafter.

In the substrate processing apparatus 1 according to the present embodiment, the substrate take-out step serving as an "intermediate process" which requires the predetermined time Tb is present between the completion of the cleaning process of a substrate and the holding of the substrate by the center robot CR. It is impossible to perform such an intermediate process upon two or more substrates simultaneously. The intermediate process is an exclusive process which can be performed on two or more substrates only sequentially one by one.

With respect to an intended time t12 (intended first process completion time) at which the cleaning process of the preceding substrate W1 is completed, and an intended time t22 (intended second process completion time) at which the cleaning process of the succeeding substrate W2 is completed, the first judging time value Ct may be specified based on a time later than the intended first process completion time t12 by an amount of time including the intermediate process time Tb and the time Tc required for the outward and return movement of the center robot CR, and the aforementioned second judging time value Dt may be specified based on the intended second process completion time t22.

In the case where the transport means (robot) has the plurality of substrate holding means (hands) and the plurality of substrate holding means can take out only one substrate at a time from the processing compartment 3 as in the present embodiment, it is necessary that the substrate take-out segments are located so as not to overlap in time. This is automatically achieved in the procedure of FIG. 15, which will be described later.

FIG. 15 is a schedule making routine in a case where the time value Ct is employed as the first judging time value and the time value Dt is employed as the second judging time value in corresponding relation to Expression 2 described above. This will be described in detail below.

In Step ST1 of FIG. 15, a time segment having the earliest intended start time is specified among the time segments the start times of which are undetermined at that time, and is defined as a "determined candidate segment" (also referred to simply as a "determined candidate").

In Step ST1, the number of determined candidate segments is not limited. Thus, there are cases in which a plurality of segments having the earliest intended start time are present in the basic schedule (that is, cases in which there are a plurality of substrates the cleaning processes of which are started simultaneously). In such cases, one of the plurality of segments having the earliest intended start time is employed as the determined candidate segment by a predetermined rule. The predetermined rule may be a rule determined based on the recipe for the substrates or an arbitrarily established rule that a segment for the substrate having the lowest substrate identification number previously assigned thereto is defined as the determined candidate, for example.

In the example of FIG. 16A, all of the start times of the segments B1 to B6 constituting the basic schedule are undetermined, and only tentative intended start times (t11 to t24) are assigned to the segments B1 to B6 by the basic schedule. Thus, the cleaning processing segment B1 having the earliest intended start time t11 of all intended start times is selected as the first determined candidate segment.

As stated above, the start time and the finish time which are undetermined are referred to as the "intended start time" and the "intended finish time", respectively.

On the other hand, an "attribute flag F" (not shown) is previously assigned to each time segment. This attribute flag F has a meaning and an assignment rule which are to be described below.

1) F=0 for an "independent segment":

The "independent segment" is defined as a time segment which can be located in time independently of the same type of steps (independent segments) for other substrates. In this embodiment, the cleaning processing segment of the preceding substrate W1 and the cleaning processing segment of the succeeding substrate W2 are the "independent segments" because they do not interfere with each other if they are located in time in any manner. The attribute flag F=0 is assigned to such independent segments.

2) F=1 for an "exclusive segment":

The "exclusive segment" is defined as a time segment which cannot be executed in time overlapping relation with the same type of steps (exclusive segments) for other substrates. In this embodiment, the take-out segments of a plurality of substrates are not permitted to overlap with each other in time (even partially) because the center robot CR is capable of taking only one substrate at a time from a processing unit. Thus, the "take-out segments" in this embodiment are the exclusive segments.

The take-out segments in this embodiment cannot also be executed in time overlapping relation with "selective segments" (transport segments) to be described below which use the same center robot CR. In relation to this, collisions are automatically avoided by addition of a rule such that "when an exclusive segment is shifted to a later time period, the selective segment succeeding the exclusive segment is accordingly shifted to a later time period" (actual example thereof will be described later).

The attribute flag F=1 is assigned to the exclusive segments.

3) F=2 for a "selective segment":

The "selective segment" is defined as a time segment of a step having the following properties:

it can be executed in "fully" time overlapping relation with the same type of steps (selective segments) for other substrates;

it can be executed "in non-overlapping relation" with the same type of steps for other substrates;

it cannot be executed in "partially" overlapping relation with the same type of steps for other substrates; and it cannot be executed in partially or fully overlapping relation with steps of "exclusive segments" for other substrates.

For example, the transport segments for a plurality of substrates can be executed by batch transport when they are in "fully" time overlapping relation. The transport segments for a plurality of substrates can be executed by sequential transport when they are "in non-overlapping relation" in time. However, because of the presence of only one center robot CR, the plurality of transport segments cannot be located on the time axis so as to "partially" overlap each other on the time axis.

Also, the transport step and the take-out step use the same center robot CR. Thus, the take-out segment and the transport segment cannot be simultaneously located in partially or fully overlapping relation.

The attribute flag F=2 is assigned to such time segments. The selective segments to which the attribute flag F=2 is assigned are not permitted to overlap the exclusive segments having the attribute flag F=1, and are required to be either in "fully overlapping" relation or in "non-overlapping" relation with the same type of selective segments for other substrates to which the attribute flag F=2 is assigned. The term "selective" is used because there are two choices.

The attribute flag F for each of the time segments is stored in the storage device 64 of FIG. 11 while accompanying the data representing each time segment, and is read and referenced in a judgment routine to be described below. The time location disallowed by the combination of the attribute flags F, e.g. a schedule state such that a plurality of exclusive segments are in time overlapping relation, is referred to as a "disallowed state" hereinafter.

Attention will be returned to the description on the routine of FIG. 15. Although the terms "cleaning processing segments", the "take-out segments" and the "transport segments" are used for representation in Step ST2 and the subsequent steps of FIG. 15 in accordance with the description on this embodiment, the description in FIG. 15 is established as a more general routine by reading these terms as the "independent segments", the "exclusive segments" and the "selective segments", respectively.

In Step ST2, the attribute flag F of the determined candidate segment is referenced. In the case of FIG. 16A, the cleaning processing segment B1 is initially selected as the determined candidate segment. However, because the cleaning processing segment B1 has the attribute flag F=0, the process proceeds to Step ST3. In Step ST3, using the intended start time t11 of the cleaning processing segment B1, the start time ta11=t11 of the cleaning processing segment B1 is determined.

By returning through Step ST8 to Step ST1, the cleaning processing segment B4 as the segment having the earliest intended start time t21 of the remaining time segments B2 to B6 is selected as the determined candidate. The cleaning processing segment B4 also has the attribute flag F=0. Thus, using the intended start time t21 of the cleaning processing segment B4, the start time ta21=t21 of the cleaning processing segment B4 is determined in a manner similar to that of the cleaning processing segment B1.

The take-out segment B2 for the preceding substrate W1 is selected as the third determined candidate. Because the take-out segment B2 is an exclusive segment having the attribute flag F=1, the process proceeds to Step ST4. In Step ST4, a judgment is made as to whether there is a take-out segment for a different substrate which overlaps the take-out segment B2 in time and which has an already determined start time or not. The take-out segment B5 for the different substrate W2 which overlaps the take-out segment B2 in time is present in a basic schedule, but the start time of this take-out segment B5 has not yet been determined. Thus, using the intended start time t12 of the take-out segment B2, the start time ta12=t12 of the take-out segment B2 is determined.

The take-out segment B5 for the succeeding substrate W2 is selected as the fourth determined candidate. Because the take-out segment B5 is an exclusive segment having the attribute flag F=1, the process proceeds to Step ST4. In Step ST4, a judgment is made as to whether there is a different take-out segment which overlaps the take-out segment B5 in time and which has an already determined start time or not. The take-out segment B2 of the preceding substrate W1 is present as such a take-out segment.

Thus, the process proceeds to Step ST5. In Step ST5, the start time of the take-out segment B5 of the succeeding substrate W2 as the determined candidate is delayed until the time at which the disallowed state between the take-out segment B5 of the succeeding substrate W2 and the take-out segment B2 of the preceding substrate W1 is eliminated. Specifically, the intended start time t22 of the take-out segment B5 is shifted to a later time, so that a start time ta22 of the take-out segment B5 is determined at the finish time t13 of the take-out segment B2 (with reference to FIG. 16B).

In this manner, when one time segment (e.g., the take-out segment B5) is shifted to a later time, the intended start time t23 and the intended finish time t24 of a different time segment succeeding the one time segment, i.e. transport segment B6, in the basic schedule are also automatically shifted by the same amount of shift time (times ta23 and ta24 of FIG. 16B). However, because the transport segment B6 has not yet become the determined candidate in this stage, only the "intended" start time and the "intended" finish time of the transport segment B6 are changed, but the start time and the finish time thereof have not yet been determined.

The transport segment B3 for the preceding substrate W1 is selected next as the determined candidate. However, because this transport segment B3 is a selective segment having the attribute flag F=2, the process proceeds to Step ST6. Then, a judgment is made as to whether the intended finish time t22 (Dt) of the independent segment, i.e. the cleaning processing segment B2, of the succeeding substrate W2 is earlier than the intended finish time t14 (Ct) of the transport segment B3 of the preceding substrate W1 or not.

Since the intended finish time t22 (Dt) of the cleaning processing segment B4 is earlier than the intended finish time t14 (Ct) of the transport segment B3, the transport segment B3 is shifted in time and delayed in Step ST5 so as to coincide with the time period of the succeeding selective segment (transport segment B6) the start time of which is undetermined. Then, a start time ta13 and a finish time ta14 of the transport segment B3 are determined.

The transport segment B6 for the succeeding substrate W2 is selected finally as the determined candidate. However, because this transport segment B6 is also a selective segment having the attribute flag F=2, the process proceeds from Step ST2 to Step ST6. In the examples of FIGS. 16A to 16D, there is no substrate succeeding the substrate W2 because only the two substrates W1 and W2 are assumed. Thus, the intended start time ta13 of the transport segment B6 which has already been shifted in time in Step ST5 for the take-out segment B5 is directly determined as the start time of the transport segment B6.

In the examples of FIGS. 16A to 16D, the schedule data SD including the batch transport procedure of the two substrates W1 and W2 is created in this manner (selective schedule creating step), as shown in FIG. 16B. A comparison with the sequential transport procedure of FIG. 16C shows that the batch transport procedure achieves the earlier completion of the whole carrying-out of the two substrates W1 and W2. FIG. 16D is a diagram for illustrating the schedule employing a batch procedure, and is similar in details to FIG. 16B in this example.

The selection of the batch transport procedure by the execution of such a routine of FIG. 15 is a result of the judgment as to whether the intended finish time Dt of the cleaning processing segment B2 of the succeeding substrate W2 is earlier than the intended finish time Ct of the transport segment B3 of the preceding substrate W1 or not. It is found that this judgment condition achieves the condition of the batch transport discriminant (Expression 2) described above.

<3.3 Example 2 of Schedule Making>

The segments B4 to B6 of the succeeding substrate W2 in the case of FIG. 17A are present during a time period later than those in the case of FIG. 16A. The start times ta11 and ta21 of the cleaning processing segments B1 and B4 of the preceding substrate W1 and the succeeding substrate W2 are determined by the intended start times t11 and t21 respectively, and the start time ta12 of the take-out segment B2 of the preceding substrate W1 is determined by the intended start time t12 thereof (FIG. 17B).

Next, when the transport segment B3 becomes the determined candidate, the condition expressed by Dt<Ct (batch transport discriminant) is satisfied. Thus, the transport segment B3 is shifted to a later time period coinciding with the transport segment B6 of the succeeding substrate W2, and the start time and the finish time thereof are determined by ta13 and ta14, respectively.

Next, when the take-out segment B5 of the succeeding substrate W2 becomes the determined candidate, there are no take-out segments overlapping the take-out segment B5 in time. Thus, the intended start time t22 of the take-out segment B5 is determined as the start time ta22.

Finally, when the transport segment B6 of the succeeding substrate W2 becomes the determined candidate, the judgment in Step ST6 of FIG. 15 is made. Because Ct>Dt, there is no intended finish time Ct which meets the condition of Expression 2. Thus, the start time ta23 and the finish time ta24 of the transport segment B6 are determined by the same times as the start time ta13 and the finish time ta14, respectively, of the transport segment B3 of the preceding substrate W1, so that the schedule data SD having the form of the batch transport procedure is created (selective schedule creating step).

<3.4 Example 3 of Schedule Making>

In the cases of FIGS. 18A to 18D, the segments B1 and B2 are sequentially selected as the determined candidate. However, there are no changes in the intended start times t11 and t12 resulting from the selection. The start times ta11 and ta12 are determined by the intended start times t11 and t12, respectively.

Next, the transport segment B3 is selected as the determined candidate. The different transport segment B6 cannot partially overlap this transport segment B3, and no collision occurs with the cleaning processing segment B4. Thus, the intended start time t13 is determined as the start time ta13 also in this case.

Further, the cleaning processing segment B4 of the succeeding substrate W2 is selected as the determined candidate. Because the cleaning processing segment B4 is an independent segment, there are no changes in the intended start time t21, and the intended start time t21 is determined as the start time ta21.

Thereafter, when the take-out segment B5 and the transport segment B6 are selected sequentially as the determined candidate, the time location does not cause the disallowed state. Thus, there are no changes in the intended start time t23 and in the intended finish time t24. The intended start time t23 and the intended finish time t24 are determined as the start time ta23 and the finish time ta24, respectively.

In the cases of FIGS. 18A to 18D, the schedule data SD including the sequential transport procedure is thus created (selective schedule creating step), as shown in FIG. 18B.

<3.5 Avoidance of Time Competition in Schedule Making Routine>

In Steps ST4 and ST5 of FIG. 15, as stated above, only the take-out segment of a different substrate is included as the time segment the collision of which with the exclusive segment (take-out segment) is avoided, but a collision in time with the transport segment of the different substrate is not included. However, a collision in time between the take-out segment and the transport segment is avoided throughout the procedure of FIG. 15.

Figure 19:
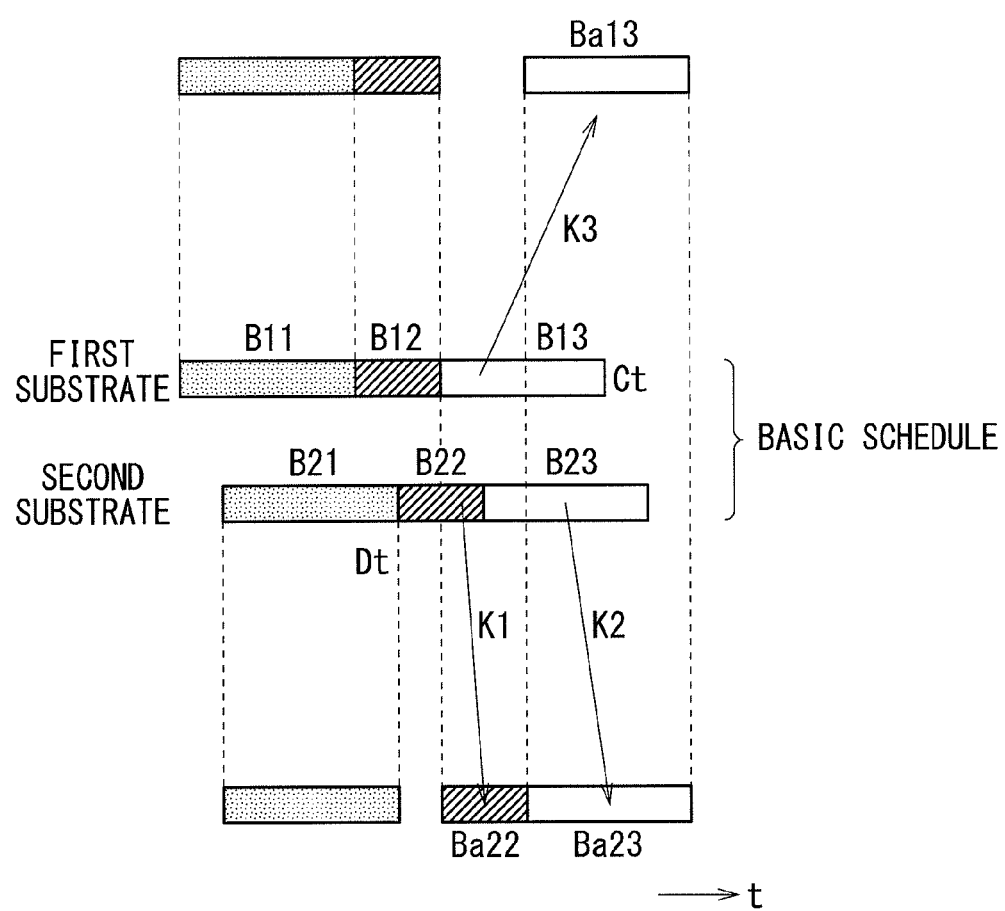
FIG. 19 is a diagram illustrating changes from a basic schedule.

Specifically, as shown in FIG. 19, a transport segment B13 of a first substrate is always present after a take-out segment B12 of the first substrate. Thus, when there is an overlap between the time period of the take-out segment B12 of the first substrate and the time period of a take-out segment B22 of a second substrate, the intended finish time Dt of a cleaning processing segment B21 of the second substrate is positioned prior to the intended finish time Ct of the transport segment B13 of the first substrate. When the take-out segment B22 of the second substrate becomes the determined candidate, the take-out segment B22 is shifted in time as indicated by an arrow K1 to become a take-out segment Ba22 so as to avoid an overlap with the take-out segment B12 of the first substrate, and a transport segment B23 of the second substrate is accordingly shifted in time as indicated by an arrow K2 to become a transport segment Ba23.

Thereafter, when the transport segment B13 of the first substrate becomes the determined candidate, this transport segment B13 is shifted so as to coincide with the time period of the transport segment Ba23 of the second substrate which is obtained after the shift as indicated by the arrow K2, thereby becoming a transport segment Ba13. An overlap between the take-out segment Ba22 of the second substrate and the transport segment Ba13 of the first substrate is eliminated at this stage. It is hence sufficient to avoid the collision between the exclusive segments in Steps ST4 and ST5 of FIG. 15.

In the case of FIG. 16A described above, the take-out segment B5 of the second substrate overlaps not only the take-out segment B2 of the first substrate but also the transport segment B3 of the first substrate in the basic schedule. However, the execution of data processing in the procedure of FIG. 15 finally eliminates the disallowed state completely as shown in FIG. 16B.

<3.6 Selection of Sequential Transport Procedure in Instance in Which Batch Transport Discriminant Does Not Hold>

Referring again to FIGS. 18A to 18D, an instance in which the batch transport discriminant (Expression 2) does not hold will be further considered by making a comparison between the sequential transport procedure and the batch transport procedure.

In the cases of FIGS. 18A to 18D, the transfer completion time At for the two substrates in an instance in which the two substrates are transported in one batch after waiting for the completion of the cleaning process of the succeeding substrate W2 is the same as the transfer completion time Bt in an instance in which the substrates W are transported sequentially one by one. This coincides with the time t24 at which the cleaning process of the succeeding substrate W2 is completed in the basic schedule.

Thus, in such a case, the completion time of all steps of the two substrates W1 and W2 is the same, whether the procedure is the sequential transport procedure or the batch transport procedure. From only this view point, the batch transport procedure may be employed without any exception independently of whether the condition of the batch transport discriminant of Expression 2 is satisfied or not.

However, the employment of the batch transport procedure without any exception independently of whether the batch transport discriminant holds or not increases the waiting time of the center robot CR which keeps holding the preceding substrate W1 to decrease the activity time of the center robot CR. This also prevents the process of the preceding substrate W1 from proceeding to the next step to accordingly result in a delay.

In other words, when attention is given to only the difference in transfer completion time between the two substrates W1 and W2 as a whole, the batch transport procedure may be employed in all cases. However, as a result of the contemplation of the general throughput in consideration for not only the cleaning processing parts to which attention is given but also other processes and transport and the process of other substrates, the sequential transport procedure is more desirable when the batch transport discriminant is not satisfied.

Therefore, when the batch transport discriminant is not satisfied, the schedule using the sequential transport procedure, rather than the batch transport procedure, is employed.

<3.7 Schedule Making in Entire Substrate Processing Apparatus 1>

With reference to FIGS. 20, 21A, 21B, 22, 23, the process until the front surface of a substrate received in the substrate processing apparatus 1 by a carrier C is subjected to the cleaning process in the substrate processing apparatus 1 and the substrate is returned to the carrier C again will be described with attention given to an interrelationship between the schedules of the two substrates W1 and W2. Of these figures, FIG. 20 shows the meanings of the reference characters of segments used in the time schedule diagrams of FIGS. 21A, 21B, 22, 23 in list form.

Figure 21A:
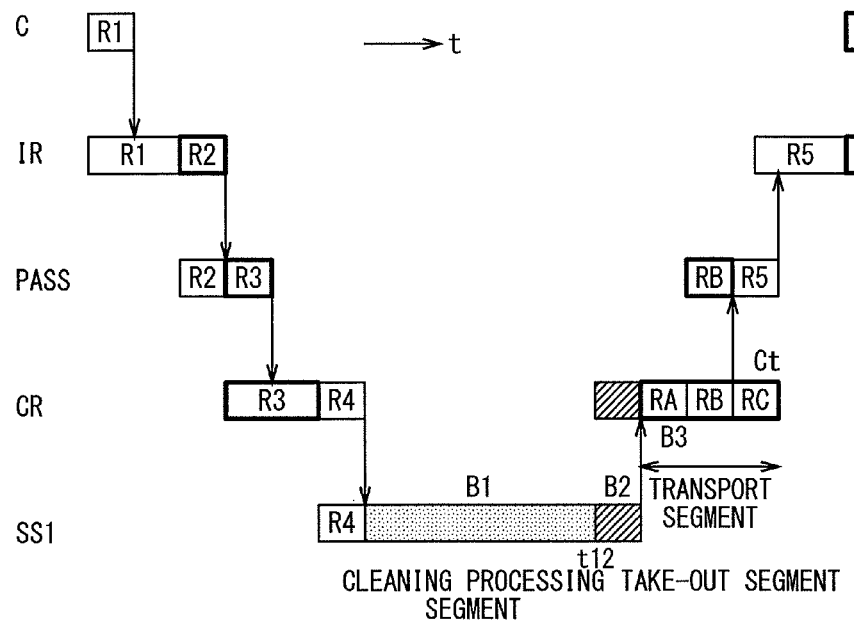
FIGS. 21A and 21B are diagrams showing examples of the basic schedule.
Figure 21B:
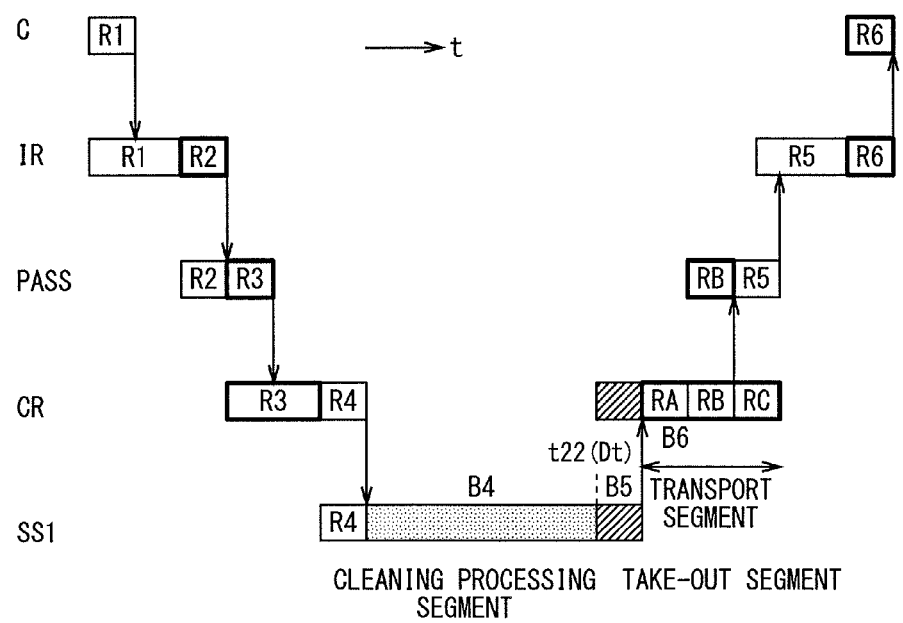

FIG. 21A shows the basic schedule for the substrate W1, and FIG. 21B shows the basic schedule for the substrate W2. Thus, these are the individually designed basic schedules. A distinction as to which one of the substrates W1 and W2 is the preceding substrate or the succeeding substrate is not specified at this stage.

Attention will be given on the time period after the point of time at which time segments R1 to R4 corresponding to the movement from the carrier C to the cleaning processing unit SS1 are completed. First, the cleaning process of the front surface of the substrate W1 is performed in the cleaning processing unit SS1 during the cleaning processing segment B1. The substrate W1 the cleaning of which is completed is immediately taken out (take-out segment B2) by the center robot CR during the take-out segment B2, and is transported to the relay part 50 (PASS).

The center robot CR performs the transport (subsegment RA) and the transfer (subsegment RB) of the substrate W1 to the relay part 50 (PASS). Thereafter, the center robot CR performs the process (subsegment RC) of moving back to the processing compartment 3. The transport (subsegment RA), the transfer (subsegment RB) and the moving process (subsegment RC) constitute the transport segment B3 of the substrate W1. Other segments R5 and R6 in FIG. 21A are segments corresponding to the movement of the substrate W1 to the carrier C.

The same applies to the other substrate W2 of FIG. 21B. The segments R1 to R4 are located, and the time periods corresponding to the cleaning processing segment B4, the take-out segment B5 and the transport segment B6 are present during these segments R1 to R4. The subsequent segments R5 and R6 are located in time in a manner similar to those for the substrate W1.

FIG. 22 is a timing diagram showing a schedule made by executing the plan logic of the schedule making program P1 of this embodiment shown in FIG. 15 based on a front surface cleaning processing recipe of the two substrates W1 and W2 shown in FIGS. 21A, 21B and by employing the batch transport procedure. This is a schedule determined when unit basic schedules of FIG. 21A and FIG. 21B are combined together in a timing relationship such that the the intended finish time Dt of the cleaning processing segment B4 for the substrate W2 of FIG. 21B is earlier than the intended finish time Ct of the transport segment B3 for the substrate W1 of FIG. 21A.

As shown in FIG. 22, the corresponding segments R1 to R3 for the substrates W1 and W2 are planed during the same time period. However, the segment R4 is a segment including the carrying-in process of the substrate W from the center robot CR to the cleaning processing unit SS. Because of the constraints that the carrying-in process from the center robot CR to each cleaning processing unit is performed on substrates one by one, the substrate W1 (preceding substrate) is first carried into the cleaning processing unit SS1, and the substrate W2 (succeeding substrate) is thereafter carried into the different cleaning processing unit SS2.

Thus, there arises a waiting time period T1 (waiting segment) in corresponding relation to a time difference between the carrying-in of the substrate W2 and the carrying-in of the substrate W1. Accordingly, the cleaning processing segment B4 of the succeeding substrate W2 is present at a later time than the cleaning processing segment B1 of the preceding substrate W1.

At the time t12 at which the cleaning process (cleaning processing segment B1) of the preceding substrate W1 is finished, the cleaning process (cleaning processing segment B4) of the succeeding substrate W2 is going on. Thus, while holding the preceding substrate W1, the center robot CR waits (waiting time T2) until the cleaning processing segment B4 of the succeeding substrate W2 is finished and the succeeding substrate W2 is taken out of the cleaning processing unit SS2 by the center robot CR in accordance with the procedure of FIG. 15.

When both the substrates W1 and W2 are held by the center robot CR, the center robot CR moves to the relay part 50 (PASS) (outward travel) while holding the substrates W1 and W2, and transfers the substrates W1 and W2 simultaneously to the relay part 50. Then, the center robot CR returns to the processing compartment 3 (return travel) for the processing of the next substrate.

In this manner, the batch transport discriminant (Expression 2) is satisfied in this example, whereby the batch transport schedule, rather than the sequential transport schedule, is employed.

Figure 23:
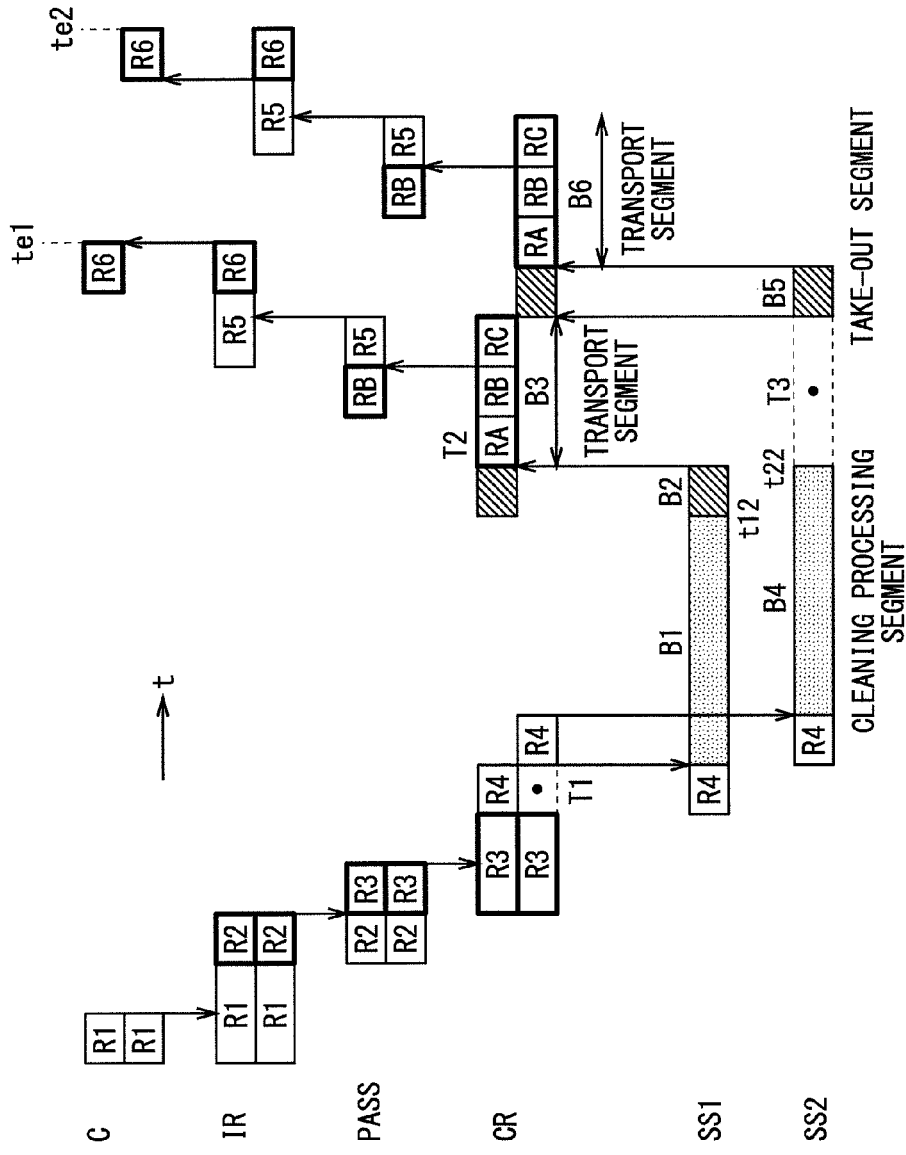
FIG. 23 is a diagram showing an example of the schedule using a sequential transport procedure.

FIG. 23 shows the whole schedule in such a case that the sequential transport procedure is employed when the finish times t11 and t21 of the cleaning processing segments B1 and B3 of the substrates W1 and W2 are the same as those of FIG. 22.

In this case, the substrates W1 and W2 are individually transported sequentially. The center robot CR does not wait for the finish of the cleaning processing segment B4 of the succeeding substrate W2 but holds the preceding substrate W1 to transport the preceding substrate W1 to the relay part 50 (PASS). The center robot CR returns to the processing compartment 3 once, and thereafter takes out the succeeding substrate W2 to transport the succeeding substrate W2 to the relay part 50.

A time te1 at which the preceding substrate W1 subjected to the cleaning process is returned to the carrier C in the case of the sequential transport procedure is earlier than a time te0 at which the substrates W1 and W2 subjected to the cleaning process are returned to the carrier C on schedule in the case where the batch transport procedure of FIG. 22 is used. However, a time te2 at which the succeeding substrate W2 is returned to the carrier C in the case of the sequential transport procedure is later than the time te0 at which the substrate W2 is returned to the carrier C in the case where the batch transport procedure is used.

Thus, when the batch transport discriminant (Expression 2) is satisfied, the employment of the batch transport procedure as shown in FIG. 22 for the entire transport of the two substrates W1 and W2 improves the throughput, as compared with the employment of the sequential transport procedure of FIG. 23.

<3.8 Effects of Schedule Making in Present Embodiment>

As described above, when the plan logic (FIG. 15) according to the first embodiment of the present invention is executed, the time Ct is specified as the first judging time value, and the time Dt is specified as the second judging time (first and second specifying steps). Thereafter, the time Ct and the time Dt are compared with each other (comparing step). When the time Dt serving as the second judging time is earlier than the time Ct serving as the first judging time, i.e., when the batch transport discriminant (Expression 2) is satisfied, the schedule data SD on the substrate processing in which the batch carrying-out procedure is employed is created (selective schedule creating step). Then, the cleaning process and the transport process of the substrates W are performed based on this schedule data SD (substrate processing step).

Unlike the plan logic employing the sequential carrying-out procedure without any exception and the plan logic employing the batch carrying-out procedure without any exception, the plan logic in the schedule making program P1 according to the first embodiment of the present invention is the plan logic which employs the batch carrying-out procedure from among the sequential carrying-out procedure and the batch carrying-out procedure when it is judged that the intended transport completion time of the plurality of substrates of interest as a whole is earlier in the batch transport procedure. This achieves the making of the schedule which is high in time efficiency. As a result, the throughput in the substrate processing apparatus 1 is improved (Result 1).

Also, when the intended transport completion times of the plurality of substrates of interest as a whole in the sequential transport schedule and the batch transport schedule coincide with each other, the schedule made based on the plan logic of the first embodiment of the present invention employs the sequential transport procedure (the transport finish time of the preceding substrate is earlier). The transport segment of the preceding substrate is planned earlier in this case than in the case where the batch carrying-out procedure is employed. This allows the earlier start of the processing at a transport destination of the preceding substrate. As a result, the throughput in the substrate processing apparatus 1 is improved (Result 2).

Second Embodiment

A second embodiment according to the present invention will be described. Like reference numerals and characters are used in the second embodiment to designate components identical with those of the first embodiment. A repetition in description on the configuration or operation similar to that of the first embodiment is dispensed with.

The substrate processing apparatus 1 of the second embodiment is similar in basic configuration to the substrate processing apparatus 1 of the first embodiment.

On the other hand, the difference between the second embodiment and the first embodiment lies in that the use of the different hands depending on whether the substrates held by the hands are unprocessed substrates or processed substrates, which in turn is the limitation imposed on the holding of the substrates in the first embodiment, is not applied to the hands of the indexer robot IR and the center robot CR of the second embodiment.

As mentioned above, the use of the different hands depending on whether the substrates W to be held are unprocessed substrates or processed substrates is applied to the hands of the indexer robot IR and the center robot CR of the first embodiment. Because of such a limitation imposed on the use of the hands, the processed substrates W are not held by the hands for unprocessed substrates (hands 7b and 7c, and hands 15b and 16b). The same applies to the hands for processed substrates (hands 6b and 6c, and hands 13b and 14b).

Such a limitation related to the holding of substrates is not imposed on the hands of the transport robots (indexer robot IR and center robot CR) in the second embodiment. This allows both of the transport robots to transport a maximum of four substrates equal in number to the hands. The second embodiment is similar to the first embodiment in that the take-out segment of the subsequent substrate cannot be located in a time period during which the take-out segment for taking out a substrate from the cleaning processing units SS and SSR by the center robot CR is planned.

<4. Schedule Making Procedure>

Figure 24:
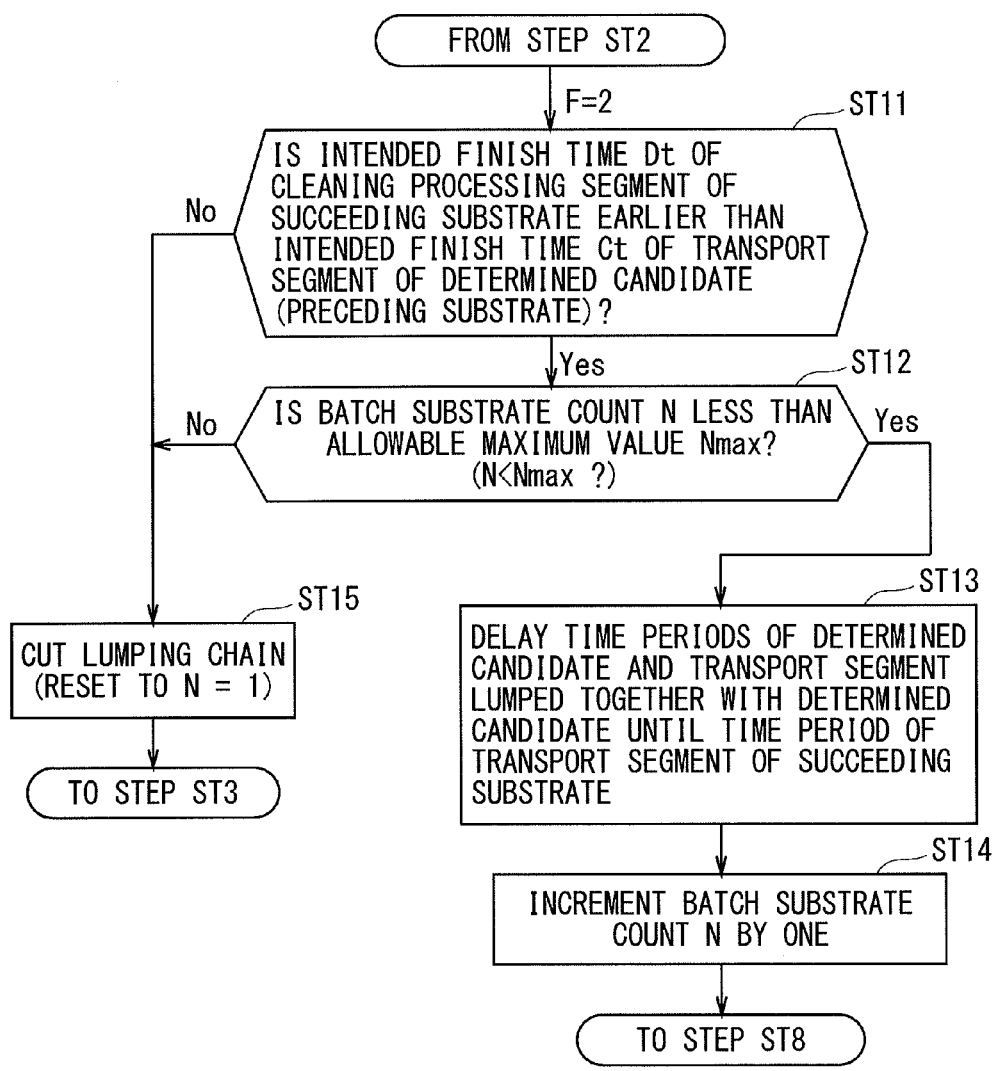
FIG. 24 is a flow diagram showing a schedule making routine according to a second embodiment.

FIG. 24 is a flow diagram showing differences of a schedule making program from FIG. 15 in an instance in which the number of hands capable of simultaneously holding substrates is Nmax (where Nmax>2) correspondingly to this second embodiment and the center robot CR capable of simultaneously holding and transporting a maximum of Nmax substrates is used. A group of steps shown in FIG. 24 may be used as substitutes for Steps ST6 to ST7 of FIG. 15. Since the first embodiment corresponds to an instance in which Nmax=2, the procedure of FIG. 24 may be used in the apparatus of the first embodiment by setting Nmax=2 in the procedure of FIG. 24.

Figure 25:
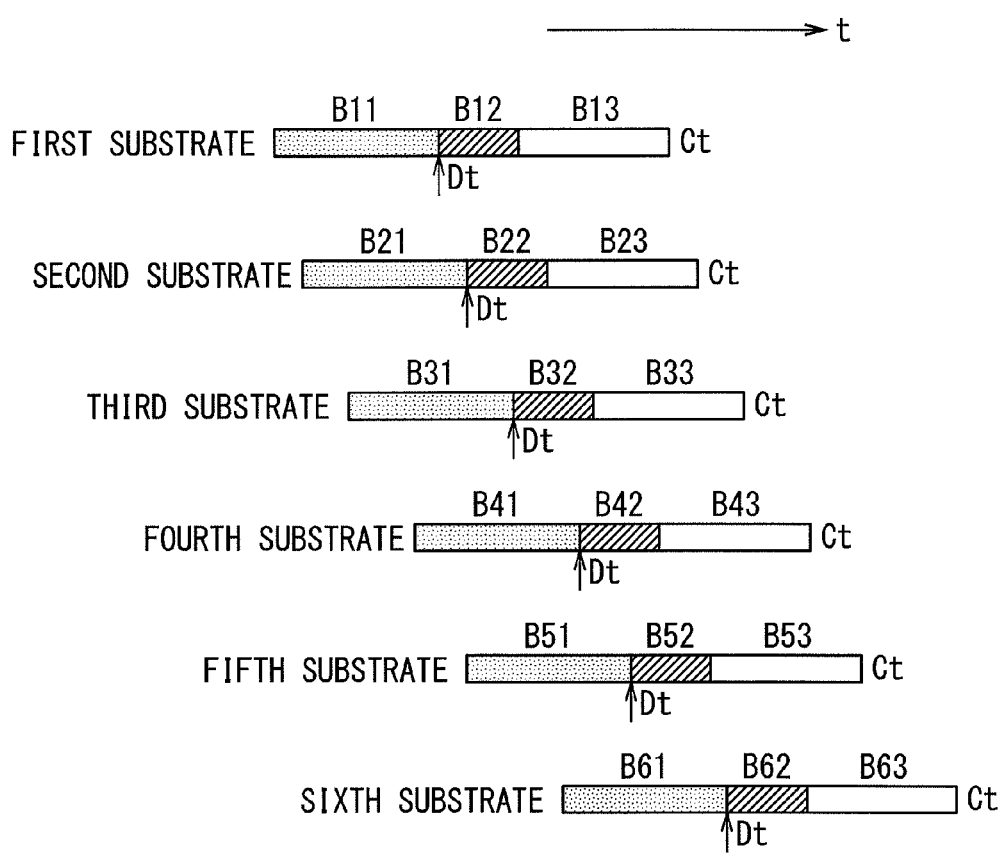
FIG. 25 is a diagram illustrating the basic schedule for not less than three substrates.

FIG. 25 shows a basic schedule including six substrates as an example of illustration of a general handling method in a case where the batch substrate transport of three or more substrates is planned. While the cleaning processes of the six substrates (first to sixth substrates) are completed in this order in this example, the intended finish times Dt of the cleaning processing segments of the second to sixth substrates are earlier than the intended finish times Ct of the transport segments of the first to fifth substrates, respectively. That is, the batch transport discriminant (Dt<Ct) is satisfied in a chain-reaction manner.

Further, it is assumed in the second embodiment that the center robot CR is capable of holding a maximum of four substrates (Nmax=4). In such a case, a batch transport schedule (FIG. 26) such that the center robot CR does not make a transition to the transport to the relay part 50 after the completion of the cleaning process and the take-out of the first substrate but waits in the processing compartment 3 for the completion of the cleaning processes of the second to fourth substrates, and takes out the second to fourth substrates from the cleaning processing units to transport the the second to fourth substrates together with the first substrate in one batch is obtained by data processing to be described later in detail.

Figure 26:
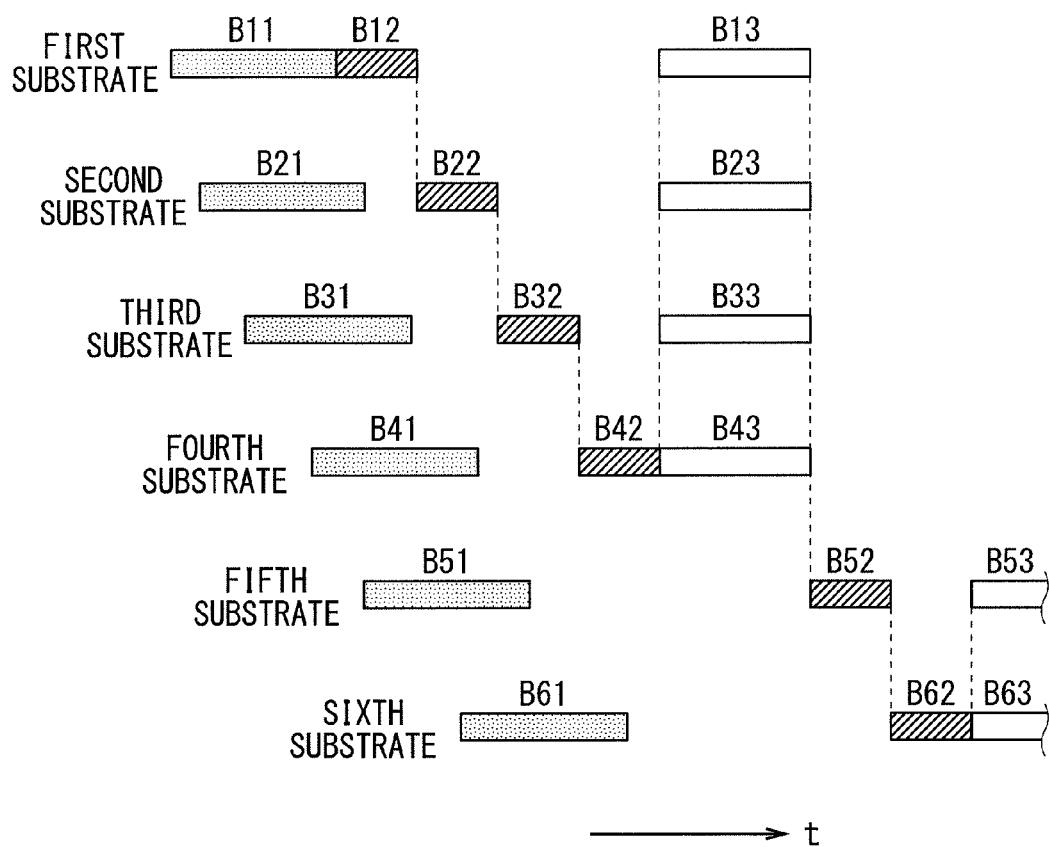
FIG. 26 is a diagram illustrating a schedule created in the second embodiment when a take-out segment is exclusive.

Although the batch transport discriminant is satisfied between the fifth substrate and the fourth substrate as shown in FIG. 25, the fifth substrate is not transported in one batch with the first to fourth substrates as shown in FIG. 26. This is because the maximum number of substrates which the center robot CR is capable of holding is four.

The steps of FIG. 24 will be described based on preparations to be described below.

In Step ST11 with reference to FIG. 24, the determined candidate is defined as the preceding substrate, and a judgment is made as to whether the intended finish time Dt of the transport segment of its succeeding substrate is earlier than the intended finish time Ct of the cleaning processing segment of the preceding substrate or not. This is the judgment substantially similar in details to that in Step ST6.

When the answer is "Yes" in Step ST11, a batch substrate count N is referenced in the next Step ST12. This batch substrate count N is an integer value representing the number of substrates subjected to the batch transport planned at that time, and has an initial value of "1". When the first substrate is defined as an object to be determined, the batch substrate count N is still "1".

In the next Step ST13, the time periods of the determined candidate and a "transport segment already lumped together with the determined candidate" (referred to hereinafter as a "lumped segment") are delayed until the time period of the transport segment of the succeeding substrate. There is no "lumped segment" when the first substrate is defined as the determined candidate.

Figure 28A:
FIGS. 28A to 28C are diagrams illustrating the process of creating the batch transport procedure for not less than three substrates.
Figure 28B:
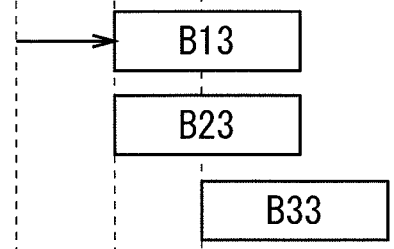
Figure 28C:
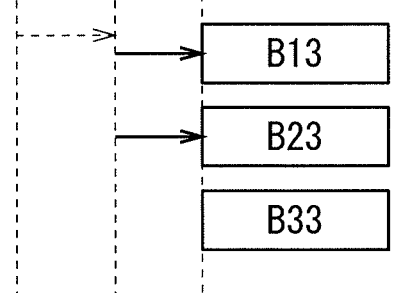

Such a situation is conceptually shown in FIGS. 28A to 28C. FIG. 28A shows the situation before the execution of Step ST13 on the first substrate, and FIG. 28B shows the situation after the execution of Step ST13. The transport segment B13 of the first substrate is shifted by Step ST13 to a later time so as to coincide with the time period of the transport segment B23 of the second substrate. In FIGS. 28A to 28C, only the time relation between the transport segments is represented, and the influence of the time shift of the take-out segments is not illustrated for ease of understanding.

In the next Step ST14 of FIG. 24, the batch substrate count N is incremented by one. Thus, N=2 when the routine of FIG. 24 for the first substrate is completed.

When the transport segment B23 of the second substrate becomes the determined candidate, the transport segment B13 of the first substrate is present as the "lumped segment" in Step ST13 of the routine of FIG. 24. Thus, as shown in FIG. 28C, not only the determined candidate at that time (transport segment B23) but also the transport segment B13 as the "lumped segment" is shifted to a later time until the time period of a transport segment B33 of the third substrate.

The time segments of the basic schedule sequentially become the determined candidate, whereby the routine of FIG. 24 is repeated. Then, when it is judged that the batch substrate count N is equal to the maximum holding count Nmax, the process proceeds from Step ST11 to Step ST15. In Step ST15, the chain for lumping to that point is cut once. Specifically, the time periods of the transport segments of the plurality of substrates lumped together by time shift to a later time until that point of time are determined.

Also, when the condition that Dt<Ct is not satisfied in Step ST11, the lumping chain is cut in Step ST15.

In other words, the time of the determined candidate on which Step ST13 and Step ST14 are executed is a tentatively determined time, and is not determined until the lumping chain is cut in Step ST15.

The batch transport procedure is not created in a portion in which the route from Step ST11 or Step ST12 to Step ST15 is executed a plurality of times in succession, but this portion becomes the sequential transport procedure.

While the description is focused on the routine of FIG. 24 in this case, the routines in cases where F=0 and where F=1 of FIG. 15 are executed when they are defined as the determined candidate in the second embodiment.

In the second embodiment, the "take-out segments" for taking out substrates from the cleaning processing units SS and SSR by means of the center robot CR are the exclusive segments as in the first embodiment. It is hence necessary to perform the time shift to avoid the overlap in time as in the first embodiment (ST4 and ST5 in FIG. 15). A schedule made based on the routines shown in FIG. 15 and FIG. 24 in consideration for these conditions is shown in FIG. 26.

However, when the plurality of hands of the center robot CR can independently access a plurality of cleaning processing units at the same time to take out the substrates during the take-out segments of the different substrates, the overlap in time between the take-out segments need not be avoided. A schedule made based on the routines of FIG. 15 and FIG. 24 in the case of such a mechanical configuration is shown in FIG. 27 as a comparative example. Thus, the take-out segments are not the exclusive segments in such a case.

On the other hand, when the center robot CR capable of taking out a plurality of substrates simultaneously as in this comparative example is used, the operation of time-shifting a "take-out segment" to a later time so as not to overlap the "transport segment" determined for a different substrate is added to Steps ST4 and ST5 of FIG. 15. Although the reason for the automatic achievement of the avoidance of the overlap due to circumstances such that a maximum of two substrates are transported in one batch is described with reference to FIG. 19 in the first embodiment, a general case in which the number of substrates transported in one batch includes three or more is assumed in the second embodiment. Thus, such automatic avoidance of interference is not always achieved, but is is preferable that overlaps between the take-out segments and the transport segments are positively avoided.

In either case, the schedule is made such that the transport segments B13 to B43 of the first to fourth substrates are lumped in the same time period, so that the substrates are transported in one batch by the center robot CR. The lumping chain is cut once at this time. Transport segments B53 and B63 of the fifth and sixth substrates are lumped in a new batch transport procedure to constitute a new lumping chain. The time location of the cleaning processing segments B11 to B61 of the substrates is the same in either case.

Also in the second embodiment, the sequential transport procedure is employed in a portion where the condition that Dt<Ct is not satisfied.

<Examples of Variations of Schedule in Second Embodiment>

Description will be given on variations of the combination of the batch transport and the sequential transport and the fact that the procedure of FIG. 24 has the function of creating the variations in the process of making a schedule when the center robot CR of the second embodiment performs the transport process of three substrates.

FIGS. 29A to 29F, 30A to 30F, 31A to 31F are timing diagrams which use the segments on a substrate-by-substrate basis to represent a manner in which the center robot CR performs the carrying-out process and the transport process after three substrates W1 to W3 are subjected to the cleaning process at individual times. The distinction between the shown details of portions of FIGS. 29A to 29F is to be described below. The distinction between portions A to F in FIGS. 30A to 30F and 31A to 31F is similar to that in FIGS. 29A to 29F. Segments B1 to B9 shown in FIGS. 29A to 29F, 30A to 30F, 31A to 31F are similar to the segments B1 to B6 shown in FIGS. 16A to 16D, 17A to 17D, 18A to 18D. Specifically, in FIGS. 29A to 29F, 30A to 30F, 31A to 31F, the segments B1, B4 and B7 denote the cleaning processing segments; the segments B2, B5 and B8 denote the take-out segments; and the segments B3, B6 and B9 denote the transport segments.

FIG. 29A shows a basic schedule for the three substrates W1 to W3.

FIG. 29B shows a schedule completed by using the plan logic of FIG. 15 and FIG. 24 for the basic schedule of FIG. 29A. FIGS. 29C to 29F to be described below show types of schedules which can become a candidate for the schedule of FIG. 29B.

FIG. 29C shows a schedule completed by using the plan logic employing the sequential carrying-out procedure ("whole sequential procedure") in which all of the substrates W1 to W3 are transported sequentially for the basic schedule of FIG. 29A.

FIG. 29D shows a schedule completed by using the plan logic employing a carrying-out procedure ("preceding-two-substrate batch procedure") in which only the two substrates W1 and W2 are transported in one batch and the substrate W3 is transported singly for the basic schedule of FIG. 29A.

FIG. 29E shows a schedule completed by using the plan logic employing a carrying-out procedure ("succeeding-two-substrate batch procedure") in which the one substrate W1 is transported singly and only the two substrates W2 and W3 are transported in one batch for the basic schedule of FIG. 29A.

FIG. 29F shows a schedule completed by using the plan logic employing a carrying-out procedure ("whole batch procedure") in which the three substrates W1 to W3 are transported in one batch for the basic schedule of FIG. 29A.

[Details of Schedules]

Schedules of FIGS. 29A to 29F:

In the cases of FIGS. 29A to 29F, all combinations of the three substrates W1 to W3 satisfy the batch transport discriminant (Expression 2). This provides the schedule in which the batch transport of the three substrates W1 to W3 is planned.

Schedules of FIGS. 30A to 30F:

In the cases of FIGS. 30A to 30F, the batch transport discriminant is satisfied between the preceding substrate W1 and a first succeeding substrate. However, the batch transport discriminant is not satisfied between the first succeeding substrate W2 and a second succeeding substrate W3 because Ct<Dt.

Thus, the schedule according to the "preceding-two-substrate batch procedure" is made.

Schedules of FIGS. 31A to 31F:

In the cases of FIGS. 31A to 31F, the batch transport discriminant is satisfied for no combination of two out of the three substrates W1 to W3. Thus, the schedule according to the "whole sequential procedure" is made.

<Effects of Schedule Making Program P1 in Second Embodiment>

As described hereinabove, when the transport robot is capable of transporting three or more substrates, the procedure of FIG. 24 is executed by combining with the procedure of FIG. 15. Thus, while pairs of preceding and succeeding substrates are selected sequentially from among a plurality of substrates, a comparison is made between the first judging time value and the second judging time value for the selected preceding and succeeding substrates (Step ST11).

Then, a judgment is thereby made as to whether to lump the transport segment of the preceding substrate of the determined candidate with the transport segment of the succeeding substrate (Step ST13) or not (Steps ST15 and ST3).

By repeating in this manner, a) the sequential transport procedure as a sequence for sequentially transporting the substrates is created when "non-lumping" continues until the maximum holding count Nmax is reached;

b) a partial batch transport procedure for transporting part of the substrates the number of which equals the maximum holding count Nmax in one batch is created when "lumping" of the substrates the number of which is less than the maximum holding count Nmax occurs; and c) a whole batch transport procedure as a sequence for transporting the substrates the number of which equals the maximum holding count Nmax in one batch is created when "lumping" of the substrates the number of which corresponds to the maximum holding count Nmax occurs continuously.

Therefore, even when three or more substrates can be transported simultaneously, the throughput of the substrate processing is improved by properly using these transport procedures.

{Modifications}

While the embodiments according to the present invention have been described hereinabove, various modifications in addition to the above may be made therein without departing from the spirit and scope of the present invention.

In the first and second embodiments, the comparison is made between the time At (the time at which the transfer of all of the two substrates W1 and W2 is completed in the sequential carrying-out procedure) and the time Bt (the time at which the transfer of all of the two substrates W1 and W2 is completed in the batch carrying-out procedure). Alternatively, the comparison is made between the time Ct serving as the substitute index for the aforementioned time At (the finish time of the carrying-out segment of the preceding substrate W1) and the time Dt serving as the substitute index for the aforementioned time Bt (the finish time of the carrying-out segment of the succeeding substrate W2). Then, when the time At and the time Bt (or the time Ct and the time Dt) are the same, the sequential transport process is selected. This is the selection for decreasing a delay in starting the post-processes subsequent to the cleaning process.

However, when the time At and the time Bt (or the time Ct and the time Dt) are the same, the batch transport procedure may be selected. The selection of the batch transport procedure provides a disadvantage in that the start of the post-processes for the preceding substrate W1 is delayed, but provides an advantages in that energy consumption and the amount of generated particles in accordance with the movement of the center robot CR are reduced because the amount of movement of the center robot CR in the processing compartment 3 is small. Therefore, when the aforementioned time At and the time Bt (or the time Ct and the time Dt) are the same, i.e., when there is no substantial difference in transport time between the sequential transport procedure and the batch transport procedure, the selection of the batch transport procedure, rather than the sequential transport procedure, may be made.

As described in the first and second embodiments, there are cases in which the waiting time of the substrates in the processing units occurs because of the mechanical constraints of the transport robot and the like. In a case where a processing unit of the substrate processing apparatus to which the schedule making of the present invention is applied is in a dry state and in a non-high temperature state (e.g., a cleaning processing unit which dries a substrate after the cleaning and sends out the substrate or a cooling processing unit) when a substrate the process of which is completed is transferred from the processing unit to the transport means (center robot CR), there is no danger that the occurrence of the waiting time of the substrate in the processing unit exerts adverse effects on the substrate. This is therefore particularly preferable as an object to which the present invention is applied.

Although the substrate processing apparatus 1 according to the first and second embodiments has the one indexer robot IR and the one center robot CR each having the four hands (substrate holding parts), the configuration of the transport robot is not limited to this. The schedule making according to the present invention is applicable when at least one transport robot having a plurality of substrate holding parts is provided.

Although the substrate processing apparatus 1 according to the first and second embodiments is a single-wafer type substrate cleaning apparatus which transports and processes substrates one by one, the present invention is not limited to this. For example, a batch type apparatus which transports and processes substrates on a lot-by-lot basis such as in units of 20 substrates, and an apparatus which transports and processes a small number of substrates (e.g., several substrates) as a unit may perform processes and judgments for each substrate set when a group of at least two substrates are referred to as a substrate set.

In these cases, a portion referred to as the "preceding substrate" and a portion referred to as the "succeeding substrate" may be read as a "preceding substrate set" and a "succeeding substrate set", respectively, to thereby be included in the scope of the present invention.

While the transport procedure between the center robot CR and the cleaning processing units SS has been described as the schedule making procedure of the plan logic of the present invention, the plan logic of the present invention may be applied to a variety of transport procedures of the process of taking a substrate from a predetermined transport source to transport the substrate to a position other than the predetermined transport source. For example, the present invention may be applied to a transport procedure in a case where the indexer robot IR performs the take-out process and transport process of substrates from the relay part 50. In this case, the plan logic of the present invention is applied to a preceding substrate (or a preceding substrate set) carried into the relay part 50 earlier by the center robot CR and to a succeeding substrate (a succeeding substrate set) carried into the relay part 50 by the center robot CR after the preceding substrate (the preceding substrate set). In this case, the plurality of substrate rest parts PASS of the relay part 50 correspond to a "plurality of processing units" in the present invention; the process of placing a processed substrate W onto each of the substrate rest parts PASS corresponds to a "predetermined process" in the present invention; and the carriers C held by the carrier holding parts 4 correspond to a "predetermined transport destination" in the present invention.

Although the schedule making program P1 according to the first and second embodiments is configured to be stored in the controller 60, the device in which the schedule making program P1 is stored is not limited to the controller 60. For example, a schedule making device including the schedule making program P1, a CPU serving as a computation device for executing the schedule making program P1, and a storage part for storing the schedule data SD obtained as a result of a computation process may be provided outside the controller 60. That is, even when the aforementioned schedule making is performed by a predetermined information processing means (typically, a computer or a whole system when comprised of a plurality of computers), the schedule making is included in the technical scope of the present invention. Also, while the schedule making program P1 is illustrated as being stored in the storage device 64 (a flash memory, a hard disk device and the like), the schedule making program P1 may be provided on-line to the schedule making device.

Although the schedule data SD according to the first and second embodiments is previously made and stored in the storage device 64 before the start of the substrate processing by the substrate processing apparatus 1, the present invention is not limited to this. For example, the time at which the schedule data SD is made may be brought into correspondence with the time at which each device in the substrate processing apparatus 1 operates, so that the schedule data SD for controlling the operation is made immediately before the operation of each device. If an unforeseeable eventuality such as a failure occurs in part of a device, such a configuration enables the schedule data SD to be made based on the status of each device at that time.

That is, the schedule making routine in the schedule making device according to the present invention may be made in real time or in advance. For the real-time making, partial schedule data for the substrate processing apparatus for upcoming (i.e., future) time periods are created sequentially in parallel with the progress of a series of substrate processes in the substrate processing apparatus 1, and are provided sequentially to a schedule controller of the substrate processing apparatus. This real-time making has advantages in that a response to a change in recipe and the like is easily made when the change in recipe and the like are transmitted from a host system.

For the in-advance making, on the other hand, the whole schedule data made by the schedule making device according to the present invention before the substrate processing apparatus 1 is brought into operation is transferred on-line or off-line to the schedule controller of the substrate processing apparatus and is used. This in-advance making has advantages in that errors are not likely to occur because the obtained schedule is sufficiently checked before the use thereof In the aforementioned first and second embodiments is described the schedule making in which the judgment is made as to which one of the batch carrying-out procedure and the sequential carrying-out procedure is efficient when the condition ("constant to-and-fro transport time condition") that the to-and-fro transport time Tc of the transport means between the processing compartment 3 and the relay part 50 is substantially the same independently of the number of substrates transported simultaneously by the transport means is satisfied, as mentioned above. Thus, a state in which "the first judging time is earlier than the second judging time" is not present. It is, however, needless to say that the aforementioned sequential carrying-out procedure is employed to create a schedule when the first judging time becomes earlier than the second judging time in such a case that the transport speed of the transport means decreases depending on the number of transported substrates, for example.

While the configuration for making a schedule is described by taking the scrub cleaning processing apparatus as an example of the substrate processing apparatus 1 in the first and second embodiments, the substrate processing apparatus 1 according to the present invention is not limited to the scrub cleaning processing apparatus, but may be used for a variety of substrate processing apparatuses such as a single-wafer type substrate cleaning apparatus with no brush cleaning, a cooling processing apparatus and a drying processing apparatus.

REFERENCE SIGNS LIST

1 Substrate processing apparatus
2 Indexer compartment
3 Processing compartment (processing part)
4 Carrier holding parts
6b, 6c, 7b, 7c, 13b, 14b, 15b, 16b Hands
11 Front surface cleaning processing part
12 Back surface cleaning processing part
50 Relay part
60 Controller (schedule making device)
B1, B4, B7 Cleaning processing segments
B2, B5, B8 Take-out segments
B3, B6, B9 Transport segments
CR Center robot (transport means)
F Attribute flag
IR Indexer robot (transport means)
P0 Processing program
P1 Schedule making program
PASS substrate rest parts
RT Inverting unit
SD Schedule data
SS (SS1 to SS8) Front surface cleaning processing units
SSR (SSR1 to SSR8) Back surface cleaning processing units
W (W1 to W3) Substrates

The invention claimed is:

1. A schedule making device for creating a control schedule for a substrate processing apparatus including a schedule of a transport process for transporting a plurality of substrates processed in parallel at individual times in a plurality of processing units to a predetermined transport destination by means of a predetermined transport portion, said schedule making device comprising:
   (a) a comparing portion that makes a comparison between a first judging time value and a second judging time value,
   said first judging time value corresponding to a time at which a sequential carrying-out procedure is completed as a carrying-out sequence for performing said transport process sequentially on a preceding substrate and a succeeding substrate,
   said second judging time value corresponding to a time at which a batch carrying-out procedure is completed as a carrying-out sequence for causing said preceding substrate to wait until the completion of the process of said succeeding substrate in a second processing unit and for performing said transport process on said preceding substrate and said succeeding substrate in one batch after the completion of the process of said succeeding substrate,
   said preceding substrate being a substrate the process of which is completed earlier in any one of said plurality of processing units,
   said succeeding substrate being a substrate the process of which is completed later than said preceding substrate in a different one of said plurality of processing units than said any one processing unit,
   the processing unit which performs the process of said preceding substrate being referred to as a "first processing unit",
   the processing unit which performs the process of said succeeding substrate being referred to as the "second processing unit"; and
   (b) a selective schedule creating portion that creates schedule data for said substrate processing apparatus, said selective schedule creating portion employing said sequential carrying-out procedure when said first judging time value is earlier than said second judging time value, said selective schedule creating portion employing said batch carrying-out procedure when said second judging time value is earlier than said first judging time value.

2. The schedule making device according to claim 1, wherein:
   said comparing portion employs a time value representing a time later than the time at which the process of said preceding substrate in processing part is completed by an amount of time including to-and-fro required time in place of said first judging time value as said first judging time value; and said comparing portion employs a time value representing the time at which the process of said succeeding substrate in said processing part is completed in place of said second judging time value as said second judging time value.

3. The schedule making device according to claim 2, wherein:
an intermediate process which requires predetermined intermediate process time is present between the completion of the process of a substrate in said plurality of processing units and the holding of the substrate by said transport portion;
said intermediate process is an exclusive process which cannot simultaneously be performed on two or more substrates but which can be performed on two or more substrates only sequentially one by one;
said comparing portion specifies said first judging time value, based on a time later than an intended first process completion time by an amount of time including said intermediate process time and said to-and-fro required time,
said intended first process completion time being an intended time at which the process of said preceding substrate in said first processing unit is intended to be completed; and
said comparing portion specifies said second judging time value, based on an intended second process completion time,
said intended second process completion time being an intended time at which the process of said succeeding substrate in said second processing unit is intended to be completed.

4. The schedule making device according to claim 3, wherein:
said transport portion includes a plurality of substrate holding portions;
said plurality of substrate holding portions are capable of taking out substrates one at a time from said plurality of processing units; and
said intermediate process is a process in which each of said substrate holding portion takes out a substrate from a corresponding one of said processing units.

5. The schedule making device according to claim 1, wherein:
the duration of each unit step for each substrate in said schedule is previously defined as a time segment;
said selective schedule creating portion includes
a determined candidate specifying portion that selects each segment in chronological order of intended start times from a basic schedule serving as a sequence made by contiguously arranging time segments corresponding to a series of steps performed on said preceding substrate and said succeeding substrate to specify the selected segment as a determined candidate segment, and
a determining portion that determines an arrangement time period of said determined candidate segment, based on predetermined arrangement conditions between the time segments of said preceding substrate and said succeeding substrate; and
said determining portion determines the arrangement time period of said determined candidate segment, based on a result of the comparison between said first judging time value and said second judging time value.

6. The schedule making device according to claim 1, wherein:
said transport portion is capable of simultaneously holding and transporting substrates the maximum number of which equals a maximum holding count Nmax having a value of not less than three; and
while sequentially selecting pairs of said preceding and succeeding substrates from a plurality of substrates to be transported, said selective schedule creating portion makes a comparison between said first judging time value and said second judging time value for said selected preceding and succeeding substrates to select any of the following:
a) a sequential transport procedure as a sequence for sequentially transporting substrates,
b) a partial batch transport procedure that transports part of the substrates the number of which equals the maximum holding count Nmax in one batch, and
c) a whole batch transport procedure as a sequence for transporting the substrates the number of which equals the maximum holding count Nmax in one batch, thereby creating the schedule data for said substrate processing apparatus.

7. The schedule making device according to claim 1, wherein
the process performed by each of said plurality of processing units is a process in which a substrate is in a dry state and in a non-high temperature state when the substrate the process of which is completed is transferred from each processing unit to said transport portion.

8. The schedule making device according to claim 1, wherein
said selective schedule creating portion employs said sequential carrying-out procedure to create the schedule data for said substrate processing apparatus when said first judging time value and said second judging time value are the same.

9. The schedule making device according to claim 1, wherein
said selective schedule creating portion employs said batch carrying-out procedure to create the schedule data for said substrate processing apparatus when said first judging time value and said second judging time value are the same.

10. The schedule making device according to claim 1, wherein:
said predetermined transport destination includes four substrate rest parts spaced a predetermined distance apart from each other in a vertical direction;
said transport portion includes four substrate holding portions spaced a predetermined distance apart from each other in a vertical direction in corresponding relation to said four substrate rest parts; and
said four substrate holding portions are individually drivable in a horizontal direction to thereby allow substrates to be individually transferred between the four substrate holding portions and said four substrate rest parts corresponding thereto.

11. The schedule making device according to claim 10, wherein
two of said four substrate holding portions of said transport portion which are at an upper position are used for the transport of processed substrates subjected to said process, and two of said four substrate holding portions which are at a lower position are used for the transport of unprocessed substrates prior to said process.

12. The schedule making device according to claim 11, wherein
when said transport portion places two of said processed substrates on any two of said four substrate rest parts, said two processed substrates are placed on two of said four substrate rest parts which are at an upper position by means of said two substrate holding portions which are at the upper position.

13. The schedule making device according to claim 11, wherein
when said transport portion places two of said unprocessed substrates on any two of said four substrate rest parts, said two unprocessed substrates are placed on two of said four substrate rest parts which are at a lower position by means of said two substrate holding portions which are at the lower position.

14. A schedule making device for creating a control schedule for a substrate processing apparatus including a schedule of a carrying-out process for carrying out a plurality of substrate sets processed in parallel at individual times in a plurality of processing units included in a predetermined processing part to a predetermined carrying-out destination by means of a predetermined transport portion, each of said substrate sets being a group of at least two substrates, said schedule making device comprising:
(a) a comparing portion that makes a comparison between a first judging time value and a second judging time value,
said first judging time value corresponding to a time at which a sequential carrying-out procedure is completed as a carrying-out sequence for performing said carrying-out process sequentially on a preceding substrate set and a succeeding substrate set,
said second judging time value corresponding to at time at which a batch carrying-out procedure is completed as a carrying-out sequence for causing said preceding substrate set to wait until the completion of the process of said succeeding substrate set in said processing part and for performing said carrying-out process on said preceding substrate set and said succeeding substrate set in one batch after the completion of the process of said succeeding substrate set,
said preceding substrate set being a substrate set the process of which is completed earlier in said processing part,
said succeeding substrate set being a substrate set the process of which is completed later than said preceding substrate set in said processing part; and
(b) a selective schedule creating portion that creates schedule data for said substrate processing apparatus, while employing said sequential carrying-out procedure when said first judging time value is earlier than said second judging time value and employing said batch carrying-out procedure when said second judging time value is earlier than said first judging time value.

15. A substrate processing apparatus comprising
a schedule making device as recited in claim 1,
wherein schedule control is performed based on said schedule data made by said schedule making device.

16. The substrate processing apparatus according to claim 15, wherein
said schedule making device creates partial schedule data for the substrate processing apparatus for upcoming time periods sequentially in parallel with the progress of a series of substrate processes in the substrate processing apparatus, to provide the partial schedule data sequentially to a schedule controller of said substrate processing apparatus.

17. A schedule making program installed on a non-transitory computer readable medium of a computer and executed by said computer to thereby cause said computer to function as a schedule making device as recited in claim 1.

18. A schedule making method for creating a control schedule of a substrate process including a schedule of a transport process for transporting a plurality of substrates processed in parallel at individual times in a plurality of processing units to a predetermined transport destination by means of a predetermined transport portion, said schedule making method comprising:
a first specifying step that specifies a first judging time value corresponding to a time at which a sequential carrying-out procedure is completed as a carrying-out sequence for performing said transport process sequentially on a preceding substrate and a succeeding substrate;
a second specifying step that specifies a second judging time value corresponding to a time at which a batch carrying-out procedure is completed as a carrying-out sequence for causing said preceding substrate to wait until the completion of the process of said succeeding substrate in a second processing unit and for performing said transport process on said preceding substrate and said succeeding substrate in one batch after the completion of the process of said succeeding substrate,
said preceding substrate being a substrate the process of which is completed earlier in any one of said plurality of processing units,
said succeeding substrate being a substrate the process of which is completed later than said preceding substrate in a different one of said plurality of processing units than said any one processing unit,
the processing unit which performs the process of said preceding substrate being referred to as a "first processing unit",
the processing unit which performs the process of said succeeding substrate being referred to as the "second processing unit";
a comparing step that compares a comparison between said first judging time value and said second judging time value; and
a selective schedule creating step that creates schedule data for said substrate process, said selective schedule creating step employing said sequential carrying-out procedure when said first judging time value is earlier than said second judging time value, said selective schedule creating step employing said batch carrying-out procedure when said second judging time value is earlier than said first judging time value.

19. A schedule making method for creating a control schedule of a substrate process including a schedule of a carrying-out process for carrying out a plurality of substrate sets processed in parallel at individual times in a plurality of processing units included in a predetermined processing part to a predetermined carrying-out destination by means of a predetermined transport portion, each of said substrate sets being a group of at least two substrates, said schedule making method comprising:
a first specifying step that specifies a first judging time value corresponding to a time at which a sequential carrying-out procedure is completed as a carrying-out sequence for performing said carrying-out process sequentially on a preceding substrate set and a succeeding substrate set;

a second specifying step that specifies a second judging time value corresponding to a time at which a batch carrying-out procedure is completed as a carrying-out sequence for causing said preceding substrate set to wait until the completion of the process of said succeeding substrate set in said processing part and for performing said carrying-out process on said preceding substrate set and said succeeding substrate set in one batch after the completion of the process of said succeeding substrate set, said preceding substrate set being a substrate set the process of which is completed earlier in said processing part, said succeeding substrate set being a substrate set the process of which is completed later than said preceding substrate set in said processing part;

a comparing step that makes a comparison between said first judging time value and said second judging time value; and a selective schedule creating step that creates schedule data for said substrate process, said selective schedule creating step employing said sequential carrying-out procedure when said first judging time value is earlier than said second judging time value, said selective schedule creating step employing said batch carrying-out procedure when said second judging time value is earlier than said first judging time value.

20. A substrate processing method further comprising a substrate processing step that executes said substrate process, based on said schedule data made by said schedule making method as recited in claim 18.

\* \* \* \* \*